US009608004B2

(12) United States Patent
Takayama et al.

(10) Patent No.: US 9,608,004 B2
(45) Date of Patent: *Mar. 28, 2017

(54) SEMICONDUCTOR DEVICE AND PEELING OFF METHOD AND METHOD OF MANUFACTURING SEMICONDUCTOR DEVICE

(71) Applicant: Semiconductor Energy Laboratory Co., Ltd., Atsugi-shi, Kanagawa-ken (JP)

(72) Inventors: Toru Takayama, Kanagawa (JP); Junya Maruyama, Kanagawa (JP); Mayumi Mizukami, Tokyo (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/953,077

(22) Filed: Nov. 27, 2015

(65) Prior Publication Data
US 2016/0079283 A1    Mar. 17, 2016

Related U.S. Application Data

(60) Continuation of application No. 13/848,168, filed on Mar. 21, 2013, now Pat. No. 9,202,987, which is a
(Continued)

(30) Foreign Application Priority Data

Jul. 16, 2001  (JP) .................................. 2001-216018
Sep. 28, 2001 (JP) .................................. 2001-299620

(51) Int. Cl.
*H01L 21/00*  (2006.01)
*H01L 27/12*  (2006.01)
(Continued)

(52) U.S. Cl.
CPC ........ *H01L 27/1218* (2013.01); *G02F 1/1362* (2013.01); *H01L 21/2007* (2013.01);
(Continued)

(58) Field of Classification Search
None
See application file for complete search history.

(56) References Cited

U.S. PATENT DOCUMENTS 4,299,873 A    11/1981 Ogihara et al.
4,722,765 A     2/1988 Ambros et al.
(Continued)

FOREIGN PATENT DOCUMENTS

EP    0849788 A    6/1998
EP    0858110 A    8/1998
(Continued)

OTHER PUBLICATIONS

Takayama.T et al., "A CPU on a Plastic Film Substrate", 2004 Symposium on VLSI Technology : Digest of Technical Papers, Jun. 15, 2004, pp. 230-231, The IEEE Electron Devices Society / The Japan Society of Applied Physics.
(Continued)

*Primary Examiner* — Alexander Ghyka
(74) *Attorney, Agent, or Firm* — Robinson Intellectual Property Law Office; Eric J. Robinson

(57) ABSTRACT

The present invention provides a peeling off method without giving damage to the peeled off layer, and aims at being capable of peeling off not only a peeled off layer having a small area but also a peeled off layer having a large area over the entire surface at excellent yield ratio. The metal layer or nitride layer 11 is provided on the substrate, and further, the oxide layer 12 being contact with the foregoing metal layer or nitride layer 11 is provided, and furthermore, if the lamination film formation or the heat processing of 500° C.
(Continued)

or more in temperature is carried out, it can be easily and clearly separated in the layer or on the interface with the oxide layer 12 by the physical means.

21 Claims, 25 Drawing Sheets

Related U.S. Application Data division of application No. 10/193,912, filed on Jul. 15, 2002, now Pat. No. 8,415,208.

(51) Int. Cl.
| | |
|---|---|
| *H01L 21/20* | (2006.01) |
| *H01L 21/762* | (2006.01) |
| *H01L 33/44* | (2010.01) |
| *G02F 1/1362* | (2006.01) |
| *H01L 29/24* | (2006.01) |
| *H01L 29/786* | (2006.01) |
| *G02F 1/136* | (2006.01) |

(52) U.S. Cl.
CPC .... *H01L 21/76251* (2013.01); *H01L 27/1214* (2013.01); *H01L 27/1248* (2013.01); *H01L 27/1266* (2013.01); *H01L 29/24* (2013.01); *H01L 29/7869* (2013.01); *H01L 33/44* (2013.01); *G02F 2001/13613* (2013.01); *H01L 2227/326* (2013.01); *H01L 2924/0002* (2013.01)

(56) References Cited

U.S. PATENT DOCUMENTS

| | | | |
|---|---|---|---|
| 5,091,792 A | 2/1992 | Kaida | |
| 5,107,175 A | 4/1992 | Hirano et al. | |
| 5,124,204 A | 6/1992 | Yamashita et al. | |
| 5,156,720 A | 10/1992 | Rosenfeld et al. | |
| 5,189,405 A | 2/1993 | Yamashita et al. | |
| 5,206,749 A | 4/1993 | Zavracky et al. | |
| 5,258,325 A | 11/1993 | Spitzer et al. | |
| 5,291,098 A | 3/1994 | Okita et al. | |
| 5,317,236 A | 5/1994 | Zavracky et al. | |
| 5,341,015 A | 8/1994 | Kohno | |
| 5,362,667 A | 11/1994 | Linn et al. | |
| 5,376,561 A | 12/1994 | Vu et al. | |
| 5,391,257 A | 2/1995 | Sullivan et al. | |
| 5,397,713 A | 3/1995 | Hamamoto et al. | |
| 5,459,335 A | 10/1995 | Matsushita et al. | |
| 5,654,811 A | 8/1997 | Spitzer et al. | |
| 5,674,304 A | 10/1997 | Fukada et al. | |
| 5,686,360 A | 11/1997 | Harvey et al. | |
| 5,693,956 A | 12/1997 | Shi et al. | |
| 5,757,126 A | 5/1998 | Harvey et al. | |
| 5,757,456 A | 5/1998 | Yamazaki et al. | |
| 5,771,562 A | 6/1998 | Harvey et al. | |
| 5,781,164 A | 7/1998 | Jacobsen et al. | |
| 5,793,047 A | 8/1998 | Kobayashi et al. | |
| 5,807,440 A | 9/1998 | Kubota et al. | |
| 5,811,177 A | 9/1998 | Shi et al. | |
| 5,815,223 A | 9/1998 | Watanabe et al. | |
| 5,821,138 A | 10/1998 | Yamazaki et al. | |
| 5,834,327 A | 11/1998 | Yamazaki et al. | |
| 5,851,862 A | 12/1998 | Ohtani et al. | |
| 5,879,741 A | 3/1999 | Itoh | |
| 5,888,712 A | 3/1999 | Lelental et al. | |
| 5,895,228 A | 4/1999 | Biebuyck et al. | |
| 5,929,961 A | 7/1999 | Nishi et al. | |
| 5,952,778 A | 9/1999 | Haskal et al. | |
| 5,980,349 A | 11/1999 | Hofmann et al. | |
| 5,990,542 A | 11/1999 | Yamazaki | |
| 6,031,269 A | 2/2000 | Liu | |
| 6,033,974 A | 3/2000 | Henley et al. | |
| 6,043,800 A | 3/2000 | Spitzer et al. | |
| 6,051,877 A | 4/2000 | Usami et al. | |
| 6,059,913 A | 5/2000 | Asmussen et al. | |
| 6,080,663 A | 6/2000 | Chen et al. | |
| 6,100,166 A | 8/2000 | Sakaguchi et al. | |
| 6,118,502 A | 9/2000 | Yamazaki et al. | |
| 6,127,199 A | 10/2000 | Inoue et al. | |
| 6,146,225 A | 11/2000 | Sheats et al. | |
| 6,150,187 A | 11/2000 | Zyung et al. | |
| 6,166,438 A | 12/2000 | Davidson | |
| 6,177,974 B1 * | 1/2001 | Hirakata | G02F 1/13392 349/138 |
| 6,198,217 B1 | 3/2001 | Suzuki et al. | |
| 6,198,220 B1 | 3/2001 | Jones et al. | |
| 6,204,610 B1 * | 3/2001 | Komiya | G09G 3/3233 315/169.1 |
| 6,221,738 B1 | 4/2001 | Sakaguchi et al. | |
| 6,239,470 B1 | 5/2001 | Yamazaki | |
| 6,258,666 B1 | 7/2001 | Mizutani et al. | |
| 6,261,634 B1 | 7/2001 | Itoh | |
| 6,268,695 B1 | 7/2001 | Affinito | |
| 6,310,362 B1 | 10/2001 | Takemura | |
| 6,320,640 B2 | 11/2001 | Nishi et al. | |
| 6,339,010 B2 | 1/2002 | Sameshima | |
| 6,340,641 B1 | 1/2002 | Muraguchi et al. | |
| 6,362,866 B1 | 3/2002 | Yamazaki et al. | |
| 6,372,608 B1 | 4/2002 | Shimoda et al. | |
| 6,376,333 B1 | 4/2002 | Yamazaki et al. | |
| 6,391,220 B1 | 5/2002 | Zhang et al. | |
| 6,413,645 B1 | 7/2002 | Graff et al. | |
| 6,420,283 B1 | 7/2002 | Ogawa et al. | |
| 6,423,614 B1 | 7/2002 | Doyle | |
| 6,429,095 B1 | 8/2002 | Sakaguchi et al. | |
| 6,432,516 B1 | 8/2002 | Terasaki et al. | |
| 6,441,468 B1 | 8/2002 | Yamazaki | |
| 6,448,152 B1 | 9/2002 | Henley et al. | |
| 6,486,041 B2 | 11/2002 | Henley et al. | |
| 6,492,026 B1 | 12/2002 | Graff et al. | |
| 6,521,511 B1 | 2/2003 | Inoue et al. | |
| 6,522,067 B1 | 2/2003 | Graff et al. | |
| 6,534,382 B1 | 3/2003 | Sakaguchi et al. | |
| 6,544,430 B2 | 4/2003 | Mccormack et al. | |
| 6,566,179 B2 | 5/2003 | Murley et al. | |
| 6,572,780 B2 | 6/2003 | Mccormack et al. | |
| 6,627,518 B1 | 9/2003 | Inoue et al. | |
| 6,632,708 B2 | 10/2003 | Sakama et al. | |
| 6,642,542 B1 | 11/2003 | Shimoda et al. | |
| 6,645,830 B2 | 11/2003 | Shimoda et al. | |
| 6,664,169 B1 | 12/2003 | Iwasaki et al. | |
| 6,682,963 B2 | 1/2004 | Ishikawa | |
| 6,682,990 B1 | 1/2004 | Iwane et al. | |
| RE38,466 E | 3/2004 | Inoue et al. | |
| 6,700,631 B1 * | 3/2004 | Inoue | H01L 21/6835 257/E21.568 |
| 6,737,285 B2 | 5/2004 | Iketani et al. | |
| 6,753,212 B2 | 6/2004 | Yamazaki et al. | |
| 6,774,010 B2 | 8/2004 | Chu et al. | |
| 6,781,152 B2 | 8/2004 | Yamazaki | |
| 6,784,113 B2 | 8/2004 | Hembree | |
| 6,790,747 B2 | 9/2004 | Henley et al. | |
| 6,802,926 B2 | 10/2004 | Mizutani et al. | |
| 6,814,832 B2 | 11/2004 | Utsunomiya | |
| 6,815,240 B2 | 11/2004 | Hayashi | |
| 6,818,530 B2 | 11/2004 | Shimoda et al. | |
| 6,867,539 B1 | 3/2005 | McCormick et al. | |
| 6,875,671 B2 | 4/2005 | Faris | |
| 6,878,607 B2 | 4/2005 | Inoue et al. | |
| 6,882,102 B2 | 4/2005 | Yamazaki | |
| 6,885,389 B2 | 4/2005 | Inoue et al. | |
| 6,943,369 B2 | 9/2005 | Hayashi | |
| 6,946,361 B2 | 9/2005 | Takayama et al. | |
| 6,953,735 B2 | 10/2005 | Yamazaki et al. | |
| 6,965,195 B2 | 11/2005 | Yamazaki et al. | |
| 6,967,114 B2 | 11/2005 | Shimoda et al. | |
| 6,974,731 B2 | 12/2005 | Yamazaki et al. | |
| 7,045,438 B2 | 5/2006 | Yamazaki et al. | |
| 7,045,442 B2 | 5/2006 | Maruyama et al. | |
| 7,050,138 B1 | 5/2006 | Yamazaki et al. | |
| 7,052,978 B2 | 5/2006 | Shaheen et al. | |

(56) References Cited

U.S. PATENT DOCUMENTS

| | | |
|---|---|---|
| 7,094,665 B2 | 8/2006 | Shimoda et al. |
| 7,119,364 B2 | 10/2006 | Yamazaki |
| 7,122,445 B2 | 10/2006 | Takayama et al. |
| 7,147,740 B2 | 12/2006 | Takayama et al. |
| 7,180,091 B2 | 2/2007 | Yamazaki et al. |
| 7,189,631 B2 | 3/2007 | Yamazaki et al. |
| 7,214,555 B2 | 5/2007 | Yamazaki et al. |
| 7,271,858 B2 | 9/2007 | Yamazaki et al. |
| 7,332,381 B2 | 2/2008 | Maruyama et al. |
| 7,335,573 B2 | 2/2008 | Takayama et al. |
| 7,351,300 B2 | 4/2008 | Takayama et al. |
| 7,446,843 B2 | 11/2008 | Yamazaki et al. |
| 7,479,442 B2 | 1/2009 | Noguchi et al. |
| 7,483,091 B1 | 1/2009 | Yamazaki et al. |
| 8,367,440 B2 | 2/2013 | Takayama et al. |
| 8,415,208 B2 | 4/2013 | Takayama et al. |
| 8,879,599 B2 | 11/2014 | Koeth |
| 9,202,987 B2 | 12/2015 | Takayama et al. |
| 2001/0004121 A1 | 6/2001 | Sakama et al. |
| 2001/0012677 A1 | 8/2001 | Sameshima |
| 2003/0041894 A1* | 3/2003 | Sverdrup, Jr. ...... C23C 14/3435 136/251 |
| 2003/0064569 A1 | 4/2003 | Takayama et al. |
| 2003/0071953 A1 | 4/2003 | Yamazaki et al. |
| 2003/0203547 A1 | 10/2003 | Sakaguchi et al. |
| 2003/0224582 A1 | 12/2003 | Shimoda et al. |
| 2004/0014252 A1 | 1/2004 | Shimoda et al. |
| 2004/0129960 A1 | 7/2004 | Maruyama et al. |
| 2005/0006647 A1 | 1/2005 | Utsunomiya |
| 2005/0017255 A1 | 1/2005 | Yamazaki |
| 2005/0070038 A1 | 3/2005 | Yamazaki et al. |
| 2005/0090075 A1 | 4/2005 | Takayama et al. |
| 2006/0068533 A1 | 3/2006 | Utsunomiya |
| 2006/0181205 A1 | 8/2006 | Pi et al. |
| 2007/0212853 A1 | 9/2007 | Maruyama et al. |
| 2008/0188022 A1 | 8/2008 | Yamazaki et al. |
| 2009/0020751 A1 | 1/2009 | Seki et al. |
| 2009/0185130 A1 | 7/2009 | Yamazaki et al. |
| 2009/0315457 A1 | 12/2009 | Furukawa et al. |

FOREIGN PATENT DOCUMENTS

| | | |
|---|---|---|
| EP | 0924769 A | 6/1999 |
| EP | 0951057 A | 10/1999 |
| EP | 1014452 A | 6/2000 |
| EP | 1122794 A | 8/2001 |
| EP | 1143772 A | 10/2001 |
| EP | 1351308 A | 10/2003 |
| EP | 1686626 A | 8/2006 |
| JP | 01-184957 A | 7/1989 |
| JP | 02-154232 A | 6/1990 |
| JP | 05-243519 A | 9/1993 |
| JP | 05-347186 A | 12/1993 |
| JP | 07-142570 A | 6/1995 |
| JP | 08-250745 A | 9/1996 |
| JP | 08-262474 A | 10/1996 |
| JP | 09-105896 A | 4/1997 |
| JP | 10-125929 A | 5/1998 |
| JP | 10-125930 A | 5/1998 |
| JP | 10-125931 A | 5/1998 |
| JP | 11-020360 A | 1/1999 |
| JP | 11-026733 A | 1/1999 |
| JP | 11-087799 A | 3/1999 |
| JP | 11-135882 A | 5/1999 |
| JP | 11-243209 A | 9/1999 |
| JP | 11-312811 A | 11/1999 |
| JP | 2000-040812 A | 2/2000 |
| JP | 2001-036090 A | 2/2001 |
| JP | 2001-051296 A | 2/2001 |
| JP | 2001-085154 A | 3/2001 |
| JP | 2001-093661 A | 4/2001 |
| JP | 2001-100662 A | 4/2001 |
| JP | 2001-119003 A | 4/2001 |
| JP | 2001-125138 A | 5/2001 |
| JP | 2001-155134 A | 6/2001 |
| JP | 2001-166301 A | 6/2001 |
| JP | 2001-189460 A | 7/2001 |
| JP | 2001-267578 A | 9/2001 |
| JP | 3238223 | 12/2001 |
| JP | 2002-184959 A | 6/2002 |
| JP | 2002-217391 A | 8/2002 |
| JP | 2002-328624 A | 11/2002 |
| JP | 2003-142666 A | 5/2003 |
| JP | 2003-195787 A | 7/2003 |
| KR | 2001-0006448 A | 1/2001 |
| WO | WO-92/12453 | 7/1992 |
| WO | WO-98/21750 | 5/1998 |
| WO | WO-98/46424 | 10/1998 |
| WO | WO-99/44242 | 9/1999 |

OTHER PUBLICATIONS

Office Action (Application No. 2002-0041570) Dated May 27, 2009.

Office Action (Application No. 2009-0079573) Dated Nov. 27, 2009.

* cited by examiner

FIG. 1A  BEFORE PEELING OFF SUBSTRATE 10
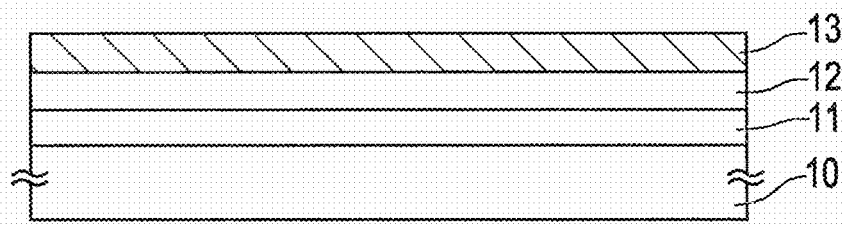
FIG. 1B  STEP OF PEELING OFF SUBSTRATE 10
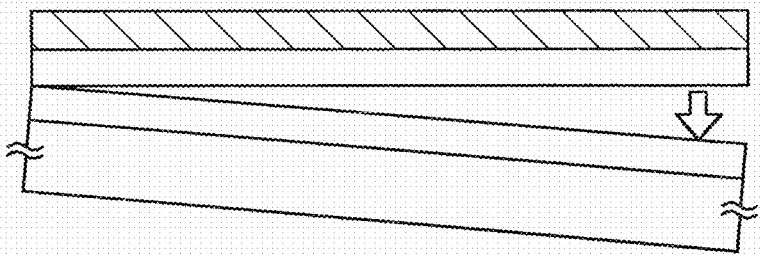
FIG. 1C  AFTER PEELING OFF
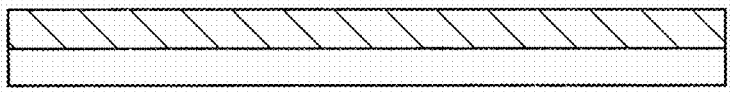

BEFORE PEELING OFF SUBSTRATE 20

PEELING OFF OF SUBSTRATE 20

AFTER PEELING OFF

FIG. 3A  FORMATION OF LAMINATION
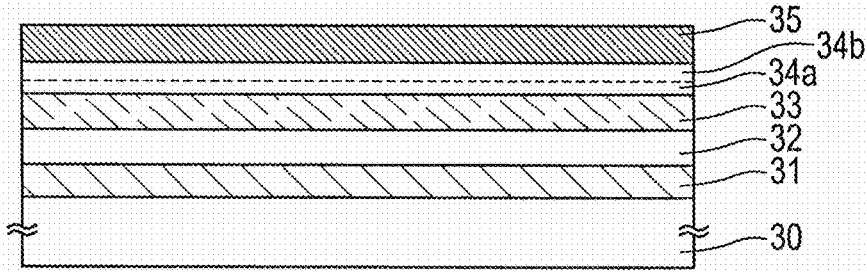
FIG. 3B  CRYSTALLIZATION (HEAT PROCESSING)
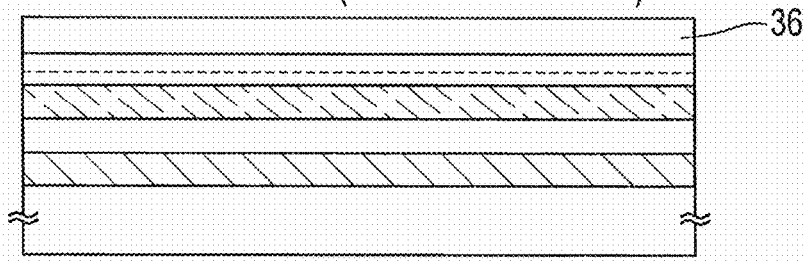
FIG. 3C  PASTING OF FILM SUBSTRATE 38
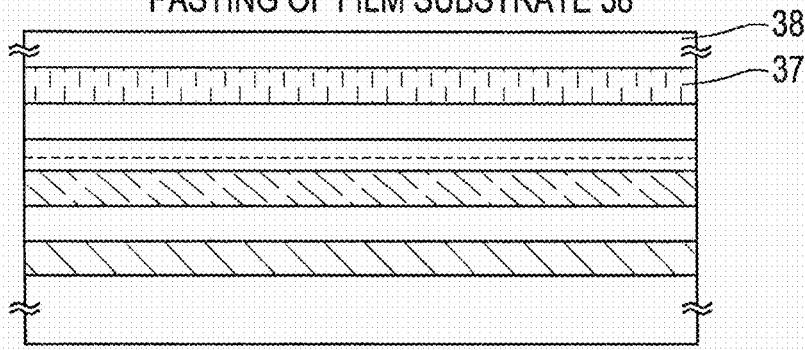
FIG. 3D  PEELING OFF OF SUBSTRATE 30
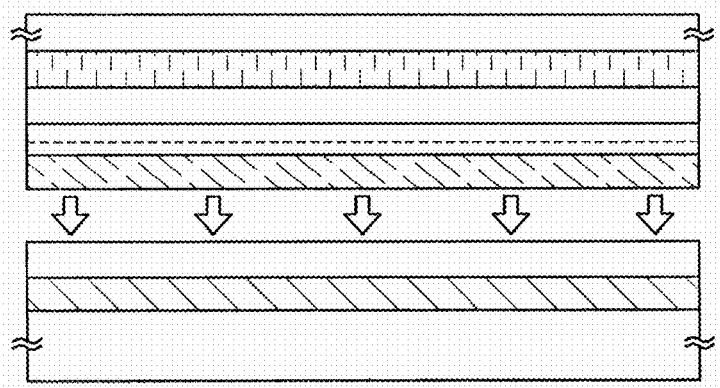

BEFORE PEELING OFF SUBSTRATE 40

LASER LIGHT

STEP OF PEELING OFF SUBSTRATE 40

AFTER PEELING OFF

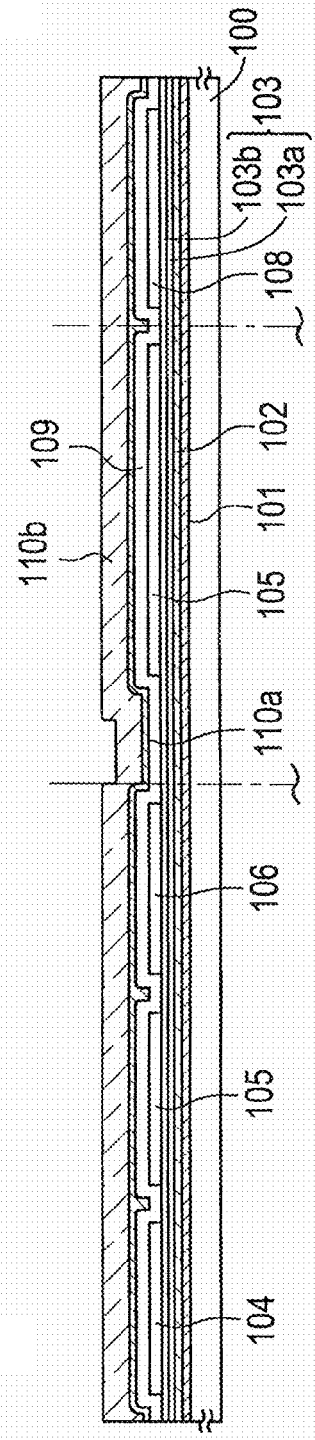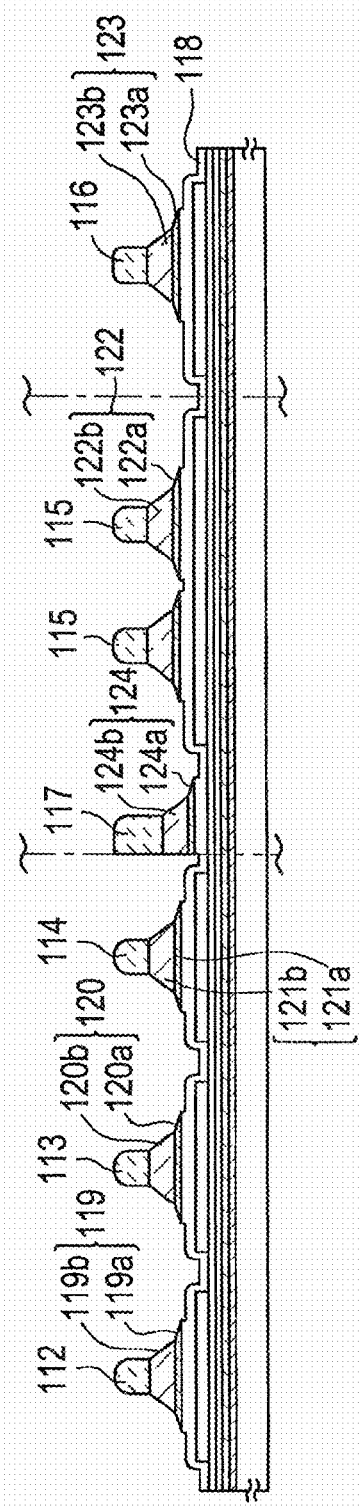

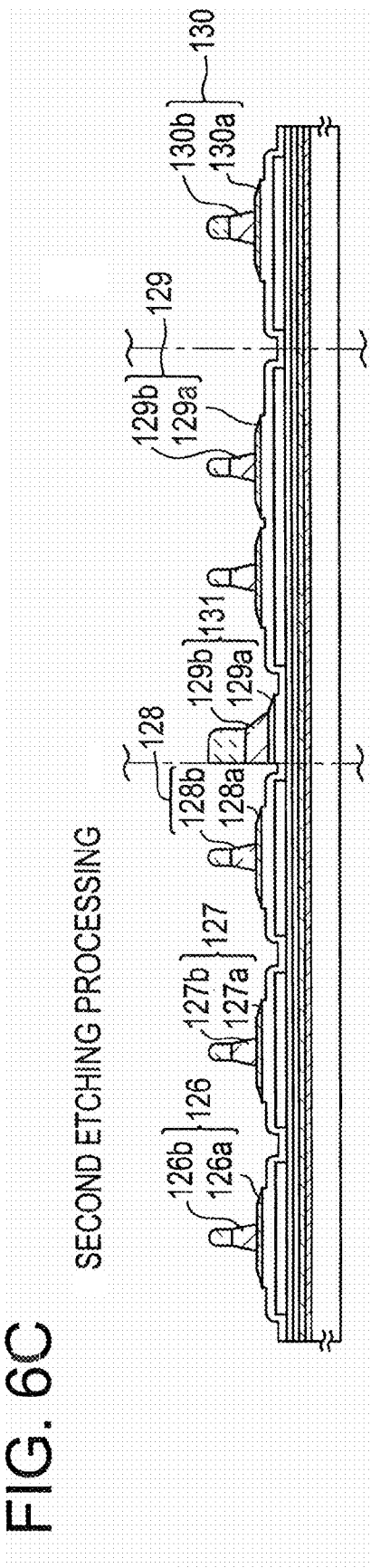
FIG. 6C SECOND ETCHING PROCESSING
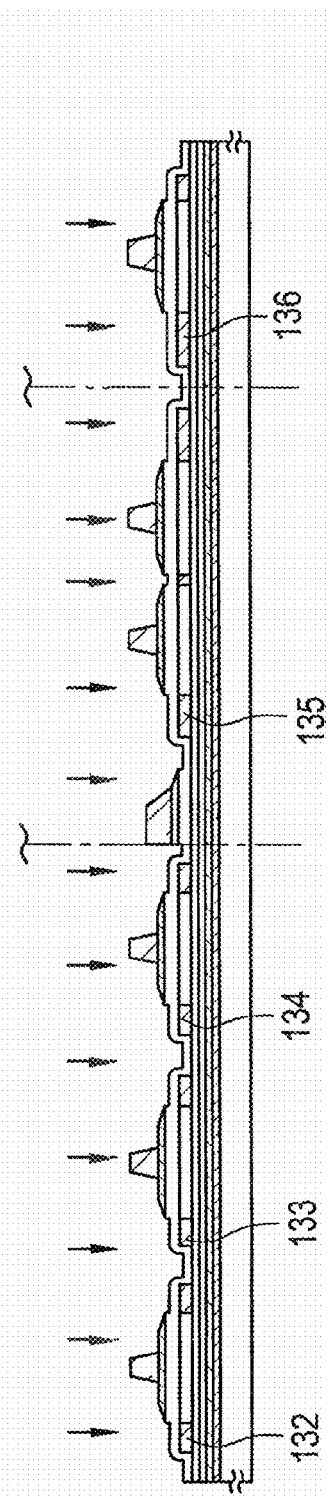
FIG. 6D FIRST DOPING PROCESSING

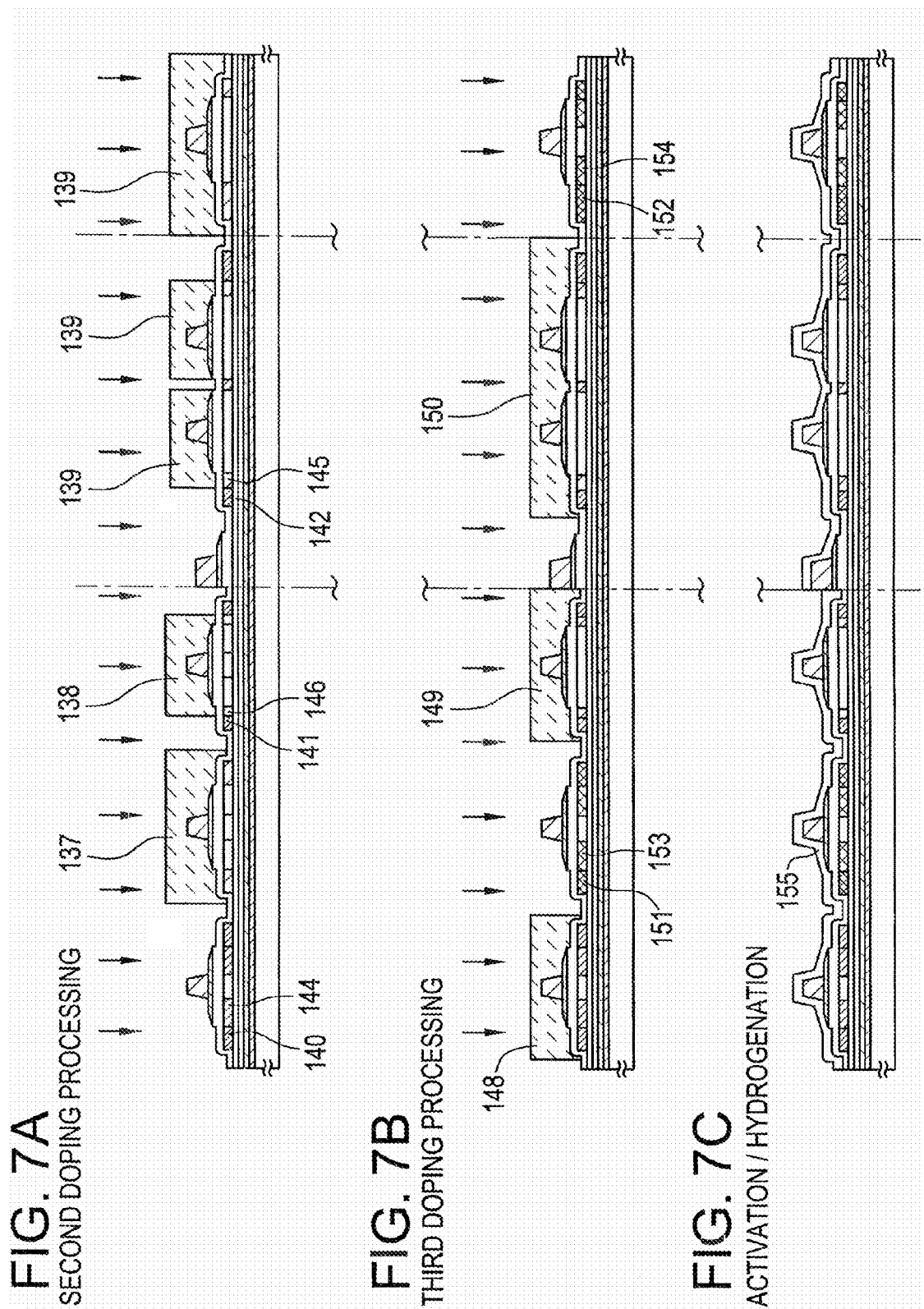

FORMATION OF INTERLAYER INSULATING FILM / FORMATION OF PIXEL ELECTRODE AND WIRING

AFTER FORMING ACTIVE MATRIX SUBSTRATE

AFTER PASTING SUPPORTING BODY AND INJECTING LIQUID CRYSTAL

AFTER PEELING OFF SUBSTRATE

AFTER PASTING TRANSFERRING BODY

AFTER FORMING ACTIVE MATRIX SUBSTRATE

AFTER PEELING OFF SUBSTRATE

AFTER PASTING TRANSFERRING BODY

AFTER PASTING SUBSTRATE

AFTER INJECTING LIQUID CRYSTAL

AFTER FORMING ELEMENT

AFTER PASTING SUPPORTING BODY

AFTER PEELING OFF SUBSTRATE

AFTER PASTING TRANSFERRING BODY

AFTER FORMING ELEMENT

AFTER PEELING OFF SUBSTRATE

AFTER PASTING TRANSFERRING BODY AND BASE MEMBER

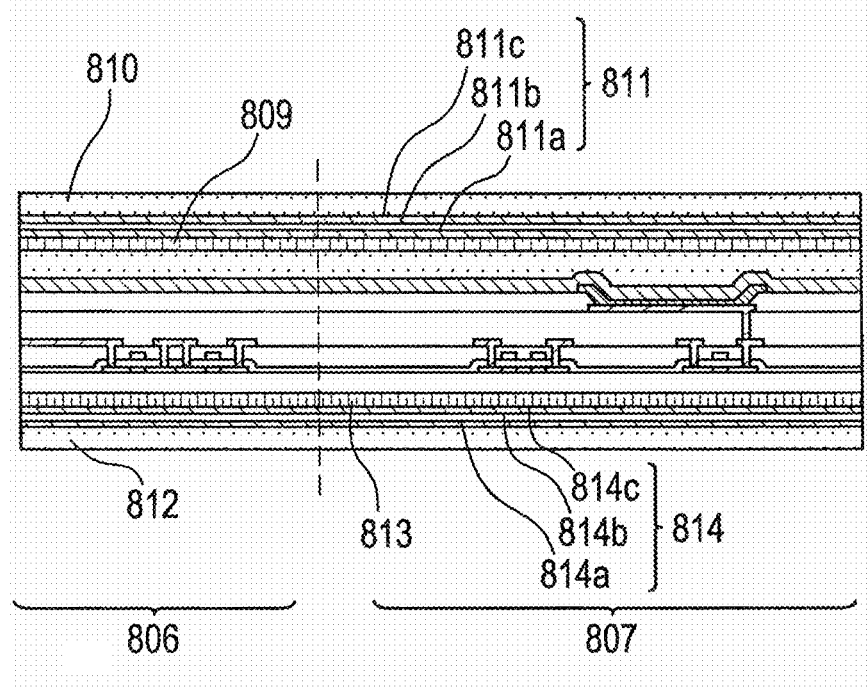

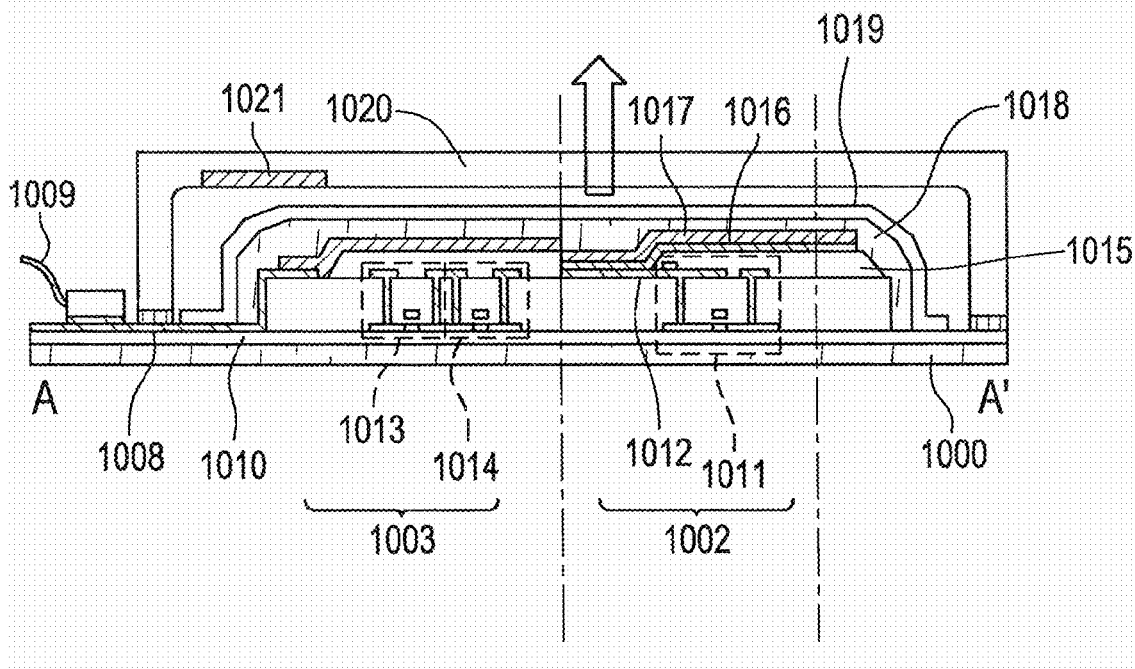

TEM OBSERVATION PHOTOGRAPH
(CROSS-SECTION)

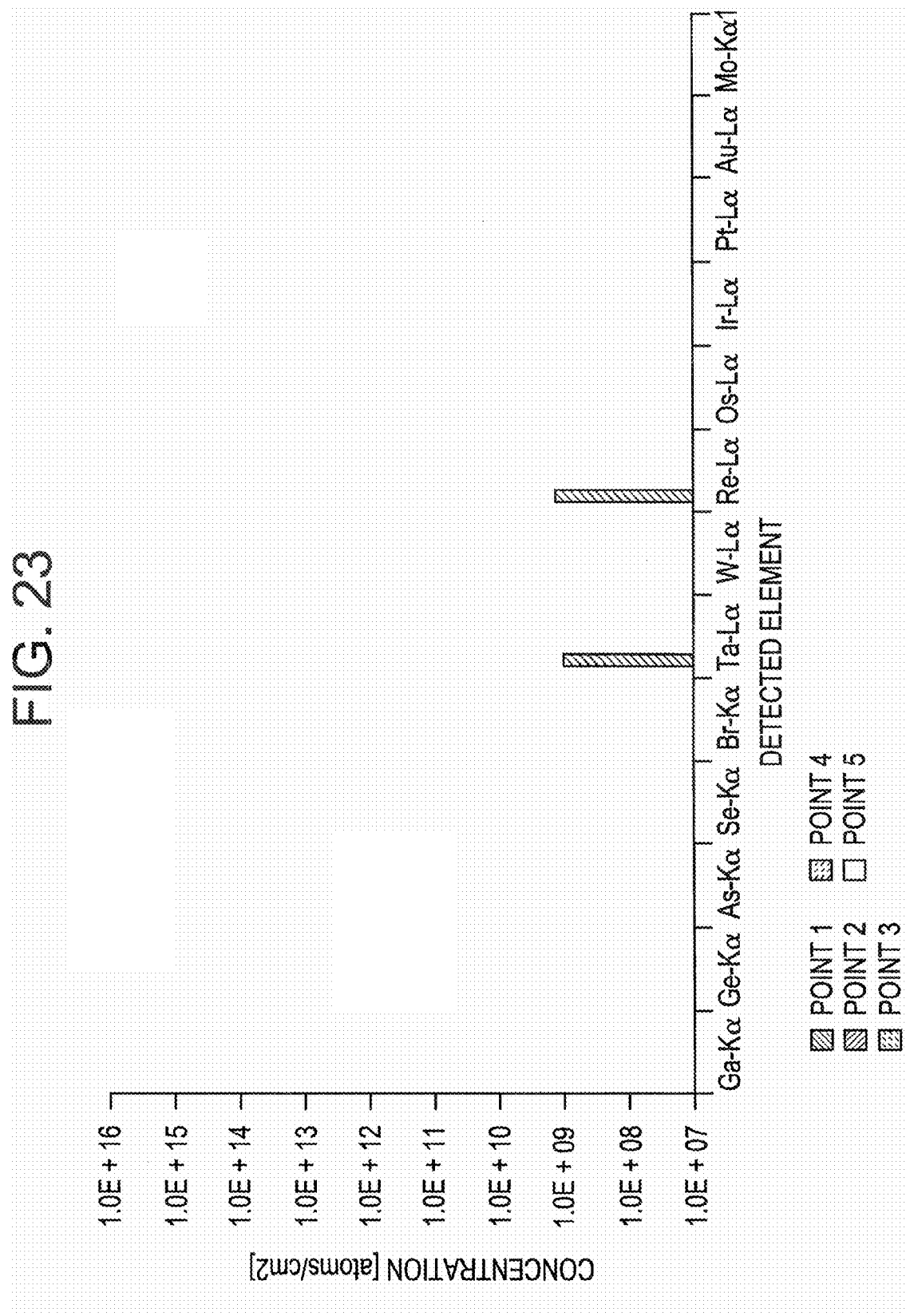

SEMICONDUCTOR DEVICE AND PEELING OFF METHOD AND METHOD OF MANUFACTURING SEMICONDUCTOR DEVICE

BACKGROUND OF THE INVENTION

Field of the Invention

The present invention relates to a method of peeling off a peeled off layer, particularly, relates to a method of peeling off a peeled off layer containing a variety of elements. In addition, the present invention relates to a semiconductor device having a circuit consisted of a thin film transistor (hereinafter, referred to as TFT) in which the peeled off layer peeled off has been pasted and transferred on a base member and a method of manufacturing the semiconductor device. For example, the present invention relates to an electro-optic device which is represented by a liquid crystal module, a light emitting device which is represented by an EL module and an electronic equipment on which such a device is mounted as a part.

It should be noted that in the present specification, the term "semiconductor device" indicates a device in general capable of functioning by utilizing the semiconductor characteristics, and an electro-optic device, a light emitting device, a semiconductor circuit and an electronic equipment are all semiconductor device.

Related Art

In recent years, a technology constituting a thin film transistor (TFT) using a semiconductor thin film (in the range from about a few to a few hundreds nm in thickness) formed on the substrate having an insulating surface has drawn the attention. A thin film transistor is widely applied to electronic devices such as an IC, an electro-optic device or the like, and particularly, there is an urgent need to be developed as a switching element for an image display device.

Although as for applications utilizing such an image display device, a variety of applications are expected, particularly, its utilization for portable apparatuses has drawn the attention. At present, although many glass substrates and quartz substrates are utilized, there are defaults of being easily cracked and heavy. Moreover, the glass substrates and quartz substrates are difficult to be made larger on the basis of mass-production, and these are not suitable for that. Therefore, the attempt that a TFT element is formed on a substrate having flexibility, representatively, on a flexible plastic film has been performed.

However, since the heat resistance of a plastic film is low, it cannot help lowering the highest temperature of the process. As a result, at present, a TFT is formed which has not so excellent electric characteristics compared with those formed on the glass substrates. Therefore, a liquid crystal display device and light emitting element having a high performance by utilizing a plastic film have not been realized yet.

Moreover, a method of peeling off a peeled off layer existing on the substrate via an isolated layer from the foregoing substrate has been already proposed. For example, technologies described in Japanese Unexamined Patent Publication No. H10-125929 gazette and Japanese Unexamined Patent Publication No. H10-125931 gazette are technologies that an isolated layer consisted of an amorphous silicon (or polysilicon) is provided, a laser beam is irradiated by transmitting the substrate and makes hydrogen contained in the amorphous silicon released, thereby occurring a space-gap and separating the substrate. In addition, there also has been the description in Japanese Unexamined Patent Publication No. H10-125930 gazette that by utilizing this technology, a liquid crystal display device is completed by pasting a peeled off layer (in the gazette, referred to as transferred layer) on a plastic film.

However, in the above-described method, it is essential to use a substrate having a high translucency, and further, for the purpose of conferring a sufficient energy for releasing hydrogen contained in the amorphous silicon, the irradiation of a comparatively large laser beam is necessary, and consequently a problem that the peeled off layer is damaged occurred. Moreover, in the above-described method, in the case where an element is prepared on an isolated layer, if a heat processing at a high temperature or the like is performed in the process of element preparation, hydrogen contained in the isolated layer is dispersed and reduced. In that case, even if the laser beam is irradiated on the isolated layer, there is a possibility that the peeling off is not sufficiently performed. Therefore, in order to maintain the amount of hydrogen contained in the isolated layer, a problem occurs that the processes after the isolated layer formation are limited. Moreover, in the above-described gazette, there has been also the description that in order to prevent the damage to the peeled off layer, a radiation shield layer or a reflection layer is provided. However, in this case, it is difficult to prepare a transmitting type liquid crystal display device. In addition, by the above-described method, it is difficult to peel off a peeled off layer having a large area.

SUMMARY OF THE INVENTION

The present invention has been carried out in consideration of the above-described problems, the present invention provides a peeling off method of peeling off the peeled off layer without damaging the peeled off layer, and aims at being capable of peeling off entirely over the surface of the peeled off layer having a large area as well as peeling off a peeled off layer having a small area.

Moreover, the present invention aims at providing a peeling off method of peeling off without receiving the limitations such as the heating processing temperature, the kind of substrate or the like in the formation of the peeled off layer.

Moreover, the present invention aims at providing a semiconductor device weight-saved by pasting a peeled off layer on a variety of base members and its method of preparing it. Particularly, the present invention aims at providing a semiconductor device weight-saved by pasting a variety of elements (thin film diode, photoelectric conversion element consisted of PIN junction of silicon) and its method of preparing it. When the present inventors carried out many experiments and considered about these, the present inventors have found that during the time when the present inventors provided an nitride layer provided on the substrate, preferably a metal nitride layer, an oxide layer being in contact with the foregoing metal nitride layer, and further performed the film formation or the heat processing at the temperature of 500° C. or more on an oxide layer, the abnormality on the processes such as a film peeling or the like does not occur, whereas the present inventors have found a peeling off method in which it can be easily and clearly separated on the oxide layer or interface between them by adding a physical force, representatively, a mechanical force (for example, peeled off by human hands).

Specifically, the bonding force between nitride layer and oxide layer has a strength durable for heat energy, whereas since the film stress of the nitride layer and the oxide layer is different from each other and there exists a stress distortion between the nitride layer and the oxide layer, dynamical energy is weak, it is suitable for peeling off. The present inventors refer to the peeling off step in which the peeling off is carried out by utilizing the film stress in that manner as a stress peeling off process.

It should be noted that in the present specification, the internal stress of the film (referred to as film stress) is a force per unit sectional area where one side of the section has an influence on the other side, when a given section in the internal of the film formed on the substrate is considered. The internal stress may always exist more or less in a thin film formed by a vacuum deposition, a sputtering, a vapor deposition method or the like. The value reaches $10^9$ N/m$^2$ at the maximum. The internal stress value changes by a material of a thin film, substance of the substrate, the formation conditions of the thin film and the like. Moreover, the internal stress value changes also by performing the heat processing.

Moreover, in the case where the force having an influence on the opponent through the unit sectional area which spread out vertically in respect to the substrate surface works in the tensile direction, it is referred to as tensile state, and the internal stress at that time is referred to as the tensile stress. In the case where the force works in the pushing direction, it is referred to as in a compressive state, and the internal stress at that time is referred to as compressive stress. It should be noted that in the present specification, the tensile stress is plotted as a positive (+) number, and the compressive stress is plotted as a negative (−) number when these are graphed or indicated in a table.

The constitution 1 of the invention related to a peeling off method disclosed in the present specification, is a peeling off method of peeling off a peeled off layer from a substrate, it is characterized by the fact that on the foregoing substrate, a nitride layer is provided, after a peeled off layer consisted of a lamination containing an oxide layer being in contact with at least the foregoing nitride layer was formed on the substrate on which the foregoing nitride layer has been provided, the relevant peeled off layer is peeled off on the inside of the oxide layer or on the interface with the foregoing oxide layer from the substrate on which the foregoing nitride layer has been provided by the physical means.

Moreover, it may be peeled off after a support body was adhered using an adhesive agent, the constitution 2 of the invention related to a peeling off method disclosed in the present specification, is a peeling off method of peeling off a peeled off layer from a substrate, it is characterized by the fact that on the foregoing substrate, a nitride layer is provided, after a peeled off layer consisted of a lamination containing an oxide layer being in contact with at least the foregoing nitride layer was formed on the substrate on which the foregoing nitride layer has been provided and the relevant peeled off layer adhered to the foregoing supporting body is peeled off on the inside of the oxide layer or on the interface with the foregoing oxide layer from the substrate on which the foregoing nitride layer has been provided by the physical means.

Moreover, in the above-described constitution 2, in order to promote the peeling off, the heat processing or the irradiation of a laser beam may be performed before the foregoing supporting body is adhered. In this case, it may be made so as to be easily peeled off by selecting a material absorbing the laser beam and heating the interface between the nitride layer and the oxide layer. However, in the case where the laser beam is used, a translucent one is used as a substrate.

Moreover, in the above-described constitution, as for the nitride layer, the other layer may be provided between the substrate and the nitride layer, for example, an insulating layer, a metal layer or the like may be provided. However, in order to simplify the process, it is preferred that the nitride layer being in contact with the surface of the substrate is formed.

Moreover, instead of the nitride layer, a metal layer, preferably a nitride metal layer may be used, a metal layer, preferably a metal nitride layer is provided, and further, an oxide layer is provided in contact with the foregoing metal nitride layer, and further, if the film formation processing or the heat processing of 500° C. or more in temperature is carried out, the film peeling does not occur, it can be easily and clearly separated on the inside of the oxide layer or on the interface with the oxide layer by the physical means.

The constitution 3 of the invention related to a peeling off method disclosed in the present specification, is a method of peeling off a peeled off layer from a substrate, it is characterized by the fact that on the foregoing substrate, a metal layer is provided, after a peeled off layer consisted of a lamination containing an oxide layer being in contact with at least the foregoing metal layer was formed on the substrate on which the foregoing metal layer has been provided, the relevant peeled off layer is peeled off on the inside of the foregoing oxide layer or on the interface with the oxide layer from the substrate on which the foregoing metal layer has been provided by the physical means.

Moreover, it may be peeled off after the supporting body was adhered using an adhesive, the constitution 4 of the invention related to a peeling off method disclosed in the present specification, is a method of peeling off a peeled off layer from a substrate, and it is characterized by the fact that on the foregoing substrate, a metal layer is provided, after a peeled off layer consisted of a lamination containing an oxide layer being in contact with at least the foregoing metal layer was formed on the substrate on which the foregoing metal layer has been provided, the peeled off layer adhered to the foregoing supporting body is peeled off on the inside of the foregoing oxide layer or on the interface with the oxide layer from the substrate on which the foregoing metal layer has been provided by the physical means.

Moreover, in the above-described constitution 4, in order to promote the peeling off, the heat processing or the irradiation of a laser beam may be performed before the foregoing supporting body is adhered. In this case, it may be made so as to be easily peeled off by selecting a material absorbing the laser beam and heating the interface between the metal layer and the oxide layer. However, in the case where the laser beam is used, a translucent one is used as a substrate.

It should be noted that in the present specification, the physical means is referred to a means recognized by physics, not by chemistry, concretely, the term indicates a dynamic means or a mechanical means having a process capable of attributing to the laws of dynamics and also indicates a means for changing any dynamic energy (mechanical energy).

However, in either of the above-described constitution 2 and constitution 4, when these are peeled off by the physical means, it is required so that the bonding force between the oxide layer and the metal layer is made smaller than the bonding force with the supporting body.

Moreover, in the above-described constitution 3 or constitution 4, the foregoing metal layer is characterized by the fact that it is an element selected from Ti, Al, Ta, W, Mo, Cu, Cr, Nd, Fe, Ni, Co, Zr, Zn, Ru, Rh, Pd, Os, Ir and Pt, a monolayer consisted of alloy materials or compound materials whose principal component is the foregoing element, or a lamination of these metals or a mixture of these.

Moreover, in the above-described constitution 3 or constitution 4, as for the metal layer, the other layer, for example, an insulating layer or the like may be provided between the substrate and the metal layer, but in order to simplify the process, it is preferable that the metal layer being in contact with the surface of the substrate is formed.

Moreover, in the above-described present invention, all kinds of substrates, not limited to a substrate having a translucency, for example, a glass substrate, a quartz substrate, a semiconductor substrate, a ceramic substrate, a metal substrate can be used, and a peeled off layer provided on the substrate can be peeled off. Moreover, in the above-described respective constitutions, the foregoing oxide layer is characterized by the fact that it is a monolayer consisted of silicon oxide material, or metal oxide material or lamination of these.

Moreover, in the above-described respective constitutions, in order to promote the peeling off, the heat processing or the irradiation of a laser beam may be performed before the peeling off is performed by the foregoing physical means.

Moreover, a semiconductor device can be fabricated by pasting (transferring) a peeled off layer provided on the substrate on the transferring body using a peeling of method of the above-described present invention, the constitution of the invention related to a method of manufacturing a semiconductor device, is a method of manufacturing a semiconductor device characterized by the fact that it has the steps of, forming a nitride layer on a substrate, forming an oxide layer on the foregoing nitride layer, forming an insulating layer on the foregoing oxide layer, forming an element on the foregoing insulating layer, peeling off the relevant supporting body on the inside of the oxide layer or on the interface with the foregoing oxide layer from the substrate by the physical means after the supporting body was adhered to the foregoing element, and adhering a transferring body to the foregoing insulating layer or the foregoing oxide layer, and sandwiching the foregoing element between the foregoing supporting body and the foregoing transferring body.

Moreover, in the above-described constitution, in order to promote the peeling off, the heat processing or the irradiation of a laser beam may be performed before the foregoing supporting body is adhered. In this case, it may be made so as to be easily peeled off by selecting a material for absorbing the laser beam for the nitride layer and heating the interface between the nitride layer and the oxide layer. However, in the case where the laser beam is used, a translucent one is used as a substrate. Moreover, in order to promote the peeling off, it may be made so as to be easily peeled off by providing an oxide in a granular shape on the nitride layer, an oxide layer for covering the relevant oxide in a granular shape, the constitution of the invention related to a method of manufacturing a semiconductor device, is a method of preparing a semiconductor device, characterized by the fact that it has the steps of, forming a nitride layer on a substrate, forming an oxide in a granular shape on the foregoing nitride layer, forming an oxide layer for covering the foregoing oxide on the foregoing nitride layer, forming an insulating layer on the foregoing oxide layer, forming an element on the foregoing insulating layer, peeling off the relevant supporting body on the inside of the oxide layer or on the interface with the foregoing oxide layer from the substrate by the physical means after the supporting body was adhered to the foregoing element, and adhering a transferring body to the foregoing insulating layer or the foregoing oxide layer, and sandwiching the foregoing element between the foregoing supporting body and the foregoing transferring body.

Moreover, the constitution of the invention related to a method of preparing the other semiconductor device, is a method of manufacturing a semiconductor device, characterized by the fact that it has the steps of, forming a layer containing a metal material on a substrate, forming an oxide layer on the foregoing layer containing the metal material, forming an insulating layer on the foregoing oxide layer, forming an element on the foregoing insulating layer, peeling off the relevant supporting body on the inside of the oxide layer or on the interface with the foregoing oxide layer from the substrate by the physical means after the supporting body was adhered to the foregoing element, and adhering a transferring body to the foregoing insulating layer or the foregoing oxide layer, and sandwiching the foregoing element between the foregoing supporting body and the foregoing transferring body.

Moreover, in the above-described constitution, in order to promote the peeling off, the heat processing or the irradiation of a laser beam may be performed before the foregoing supporting body is adhered. In this case, it may be made so as to be easily peeled off by selecting a material absorbing the laser beam for the metal layer and heating the interface between the metal layer and the oxide layer. However, in the case where the laser beam is used, a translucent one is used as a substrate. Moreover, in order to promote the peeling off, it may be made so as to be easily peeled off by providing an oxide in a granular shape on a layer containing a metal material and an oxide layer for covering the relevant oxide in a granular shape, the constitution of the invention related to a method of manufacturing a semiconductor device, is a method of manufacturing a semiconductor device, characterized by the fact that it has the steps of, forming a layer containing a metal material on a substrate, forming an oxide in a granular shape on the foregoing layer containing the metal material, forming an oxide layer for covering the foregoing oxide, forming an insulating layer on the foregoing oxide layer, forming an element on the foregoing insulating layer, peeling off the relevant supporting body on the inside of the oxide layer or on the interface with the foregoing oxide layer from the substrate by the physical means after the supporting body was adhered to the foregoing element, and adhering a transferring body to the foregoing insulating layer or the foregoing oxide layer, and sandwiching the foregoing element between the foregoing supporting body and the foregoing transferring body.

In the above-described constitution, it is preferable that the foregoing layer containing the metal material is a nitride, the foregoing metal material is characterized by the fact that it is an element selected from Ti, Al, Ta, W, Mo, Cu, Cr, Nd, Fe, Ni, Co, Zr, Zn, Ru, Rh, Pd, Os, Ir and Pt, a monolayer consisted of alloy materials or compound materials whose principal component is the foregoing element, or a lamination of these metals or a mixture of these.

Moreover, a semiconductor device can be prepared by pasting a peeled off layer provided on the substrate on the first transferring body or the second transferring body using a method of peeling off of the above-described present invention, the constitution of the invention related to a method of manufacturing a semiconductor device, is a method of manufacturing a semiconductor device characterized by the fact that it has the steps of, forming a layer containing a metal material on a substrate, forming an oxide in a granular shape on the foregoing layer containing the metal material, forming an insulating layer on the foregoing oxide layer, forming an element on the foregoing insulating layer, peeling off on the inside of the oxide layer or on the interface with the foregoing oxide layer from the substrate by the physical means, adhering the first transferring body to the foregoing insulating layer or the foregoing oxide layer, and adhering the second transferring body to the foregoing element and sandwiching the foregoing element between the foregoing first transferring body and the foregoing second transferring body.

In the above-described constitution, it is preferable that the foregoing layer containing the metal material is a nitride, the foregoing metal material is characterized by the fact that it is an element selected from Ti, Al, Ta, W, Mo, Cu, Cr, Nd, Fe, Ni, Co, Zr, Zn, Ru, Rh, Pd, Os, Ir and Pt, a monolayer consisted of alloy materials or compound materials whose principal component is the foregoing element, or a lamination of these metals or a mixture of these.

Moreover, the constitution of the invention related to a method of preparing the other semiconductor device, is a method of manufacturing a semiconductor device characterized by the fact that it has the steps of, forming a nitride layer on a substrate, forming an oxide layer on the foregoing nitride layer, forming an insulating layer on the foregoing oxide layer, forming an element on the foregoing insulating layer, peeling off on the inside of the oxide layer or on the interface with the foregoing oxide layer from the substrate by the physical means, adhering the first transferring body to the foregoing insulating layer or the foregoing oxide layer, and adhering the second transferring body to the foregoing element and sandwiching the foregoing element between the foregoing first transferring body and the foregoing second transferring body.

Moreover, in the above-described respective constitutions related to a method of manufacturing the above-described semiconductor device, the foregoing oxide layer is characterized by the fact that it is a monolayer consisted of a silicon oxide material or a metal oxide material or a lamination of these.

Moreover, in the above-described respective constitutions related to a method of preparing the above-described semiconductor device, in order to further promote the peeling off, the heating processing or the irradiation of laser beam may be performed before the peeling off is performed by the foregoing physical means.

Moreover, in the above-described respective constitutions related to a method of manufacturing the above-described semiconductor device, the foregoing element is characterized by the fact that it is a thin film transistor comprising a semiconductor layer as an active layer, the step of forming the foregoing semiconductor layer is a step in which a semiconductor layer having an amorphous structure is crystallized by performing the heat processing or the irradiation of a laser beam, and making it a semiconductor layer having a crystalline structure.

It should be noted that in the present specification, the term "transferring body" is one for being adhered to the peeled layer after it was peeled off, is not particularly limited, and may be a base member of any component such as plastic, glass, metal, ceramics or the like. Moreover, in the present specification, the term "supporting body" may be one for being adhered to the peeled layer when it is peeled off by the physical means, is not particularly limited, may be a base member of any component such as plastics, glass, metal, ceramics, or the like. Moreover, the shape of the transferring body and the shape of the supporting body are neither particularly limited, and may be one having a plane, one having a curved surface, one having a surface capable of being curved, or one in a film shape. Moreover, if the weight saving is the top priority, it is preferable that it is a plastic substrate in a film shape, for example, polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT), polyimide or the like. In the above-described respective constitution related to a method of manufacturing the above-described semiconductor device, in the case where a liquid crystal display device is prepared, the supporting body is made as an opposing substrate, the supporting body may be adhered to the peeled off layer by utilizing a sealing member as an adhesive member. In this case, an element provided on the foregoing peeled off layer has a pixel electrode, and it is made so that a liquid crystal material is packed between the relevant pixel electrode and the foregoing opposing substrate.

Moreover, in the above-described respective constitution related to a method of preparing the above-described semiconductor device, in the case where a light emitting device represented by a light emitting device having an OLED is prepared, it is preferable that a light emitting element is completely interrupted from the external so as to prevent substances such as water content, oxygen or the like which promotes the deterioration of an organic compound layer from penetrating from the external. Moreover, if the weight saving is the top priority, it is preferable that a plastic substrate in a film shape is used. However, since it is weak in an effect to prevent substances such as water content, oxygen or the like promoting the deterioration of the organic compound layer from penetrating from the external, it may be configured, for example, so that it sufficiently prevents substances such as water content, oxygen or the like promoting the deterioration of the organic compound layer from penetrating from the external by providing the first insulating film, the second insulating film and the third insulating film on the supporting body. However, the foregoing second insulating film (stress relaxation) sandwiched between the foregoing first insulating film (barrier film) and the foregoing third insulating film (barrier film) is made so that its film stress is smaller than those of the foregoing first insulating film and the foregoing third insulating film.

Moreover, in the case where a light emitting device represented by a light emitting device having an OLED is prepared, it is preferable that the invasion of substances such as water content, oxygen, or the like from the external is sufficiently prevented by providing the first insulating film, the second insulating film and the third insulating film not only on the supporting body but also similarly on the transferring body.

(Experiment 1)

Here, an oxide layer being in contact with a nitride layer or a metal layer was provided, and in order to verify whether or not a peeled layer could be peeled off from the substrate, the following experiment was carried out.

First, a lamination as indicated in FIG. 3A was formed on the substrate.

As a substrate 30, a glass substrate (#1737) was used. Moreover, on the substrate 30, an aluminum-silicon alloy layer 31 was formed in thickness of 300 nm by a sputtering method. Subsequently, a titanium nitride layer 32 was formed in thickness of 100 nm by a sputtering method. Subsequently, a silicon oxide layer 33 was formed in thickness of 200 nm by a sputtering method. The film formation conditions of the silicon oxide layer 33 were made as 150° C. of the substrate temperature, 0.4 Pa of the film forming pressure, 3 kW of the film forming electric power, Argon volumetric flow rate/oxygen volumetric flow rate=35 sccm/15 sccm by utilizing a sputtering apparatus of RF method, and by utilizing silicon oxide target (diameter, 30.5 cm).

Subsequently, a primary coat insulating layer was formed on the silicon oxide layer 33 by a plasma CVD method. As a primary coat insulating layer, a silicon oxynitride film 34$a$ (composition ratio Si=32%, O=27%, N=24%, and H=17%) prepared from the raw material gases $SiH_4$, $NH_3$, and $N_2O$ was formed in thickness of 50 nm at 300° C. of the film formation temperature by a plasma CVD method. Subsequently, after the surface was washed by ozone water, the oxide film of the surface was removed by dilute hydrofluoric acid (1:100 dilution). Subsequently, a silicon oxynitride film 34$b$ (composition ratio Si=32%, O=59%, N=7%, and H=2%) prepared from the raw material gases $SiH_4$ and $N_2O$ was lamination-formed in thickness of 100 nm at 300° C. of the film formation temperature by a plasma CVD method, and further, a semiconductor layer (here, an amorphous silicon layer 35) having an amorphous structure was formed in thickness of 54 nm at 300° C. of the film formation temperature without the air release by a plasma CVD method (FIG. 3 A).

Subsequently, nickel acetate solution containing 10 ppm of nickel when it is converted to weight was coated by a spinner. A method of spreading over the entire surface with nickel element by a sputtering method instead of coating may be employed. Subsequently, a semiconductor film having a crystal structure (here, polysilicon layer 36) was formed by performing the heat processing and crystallizing it (FIG. 3B). Here, after the heat processing (500° C., one hour) for dehydrogenation was carried out, a silicon film having a crystal structure was obtained by performing the heat processing for crystallization (550° C., 4 hours). It should be noted that although here, a crystallization technology using nickel as a metal element for promoting the crystallization of silicon is used, the other known crystallization technology, for example, solid phase crystallization method or laser crystallization method may be used. Subsequently, as an adhesive layer 37, an epoxy resin was used, and a film substrate 38 (here, polyethylene terephthalate (PET)) was pasted on a polysilicon layer (FIG. 3C).

After the state of FIG. 3 C was obtained, these were pulled by human hands so that the film substrate 38 and the substrate 30 would be separated. It could be recognized that at least titanium nitride and aluminum-silicon alloy layer remained on the substrate 30 which has been pulled away. It is expected that it is peeled off on the inside of the silicon oxide 33 or on the interface with the silicon oxide 33 by this experiment.

In this way, the peeled layer can be peeled off from the entire surface of the substrate 30 by providing an oxide layer being in contact with a nitride layer or a metal layer and pulling away the peeled layer provided on the relevant oxide layer.

(Experiment 2)

In order to specify the location where the peeling off was occurred, it was partially peeled off by a method of peeling off of the present invention, and an experiment for examining the cross section nearby its boundary was carried out.

As a substrate, the glass substrate (#1737) was used. Moreover, on the substrate, a titanium nitride layer was formed in thickness of 100 nm on the substrate by a sputtering method.

Subsequently, a silicon oxide layer was formed in thickness of 200 nm by a sputtering method. The conditions for film formation of the silicon oxide layer were made as 150° C. of the substrate temperature, 0.4 Pa of the film forming pressure, 3 kW of the film formation electric power, Argon volumetric flow rate/oxygen volumetric flow rate=35 sccm/15 sccm by utilizing a sputtering apparatus of RF method, and by utilizing silicon oxide target (diameter, 30.5 cm).

Subsequently, a primary coat insulating layer was formed on the silicon oxide layer by a plasma CVD method. As a primary coat insulating layer, a silicon oxynitride film (composition ratio Si=32%, O=27%, N=24% and H=17%) prepared from the raw material gases $SiH_4$, $NH_3$, and $N_2O$ was formed in thickness of 50 nm at 300° C. of the film formation temperature by a plasma CVD method. Subsequently, after the surface was washed by ozone water, the oxide film of the surface was removed by dilute hydrofluoric acid (1:100 dilution). Subsequently, a silicon oxynitride film (composition ratio Si=32%, O=59%, N=7% and H=2%) prepared from the raw material gases $SiH_4$ and $N_2O$ was lamination-formed in thickness of 100 nm at 300° C. of the film formation temperature by a plasma CVD method, and further, a semiconductor layer (here, an amorphous silicon layer) having an amorphous structure was formed in thickness of 54 nm at 300° C. of the film formation temperature without the air release by a plasma CVD method.

Subsequently, nickel acetate solution containing 10 ppm of nickel when converting to weight value was coated by a spinner. A method of spreading over the entire surface with nickel element by a sputtering method instead of coating may be employed. Subsequently, a semiconductor film having a crystal structure (here, polysilicon layer) was formed by performing the heat processing and crystallizing it. Here, after the heat processing (500° C., one hour) for dehydrogenation was carried out, a silicon film having a crystal structure was obtained by performing the heat processing for crystallization (550° C., 4 hours).

Subsequently, an adhesive tape was pasted on the portion of the polysilicon layer, and these were pulled so that the adhesive tape and the substrate are separated by human hands. Then, only the location where the adhesive tape was pasted was peeled off, and transferred to the tape. A TEM photograph on the peeled boundary on the substrate side is shown in FIG. 20 A, and its schematic diagram is shown in FIG. 20 B.

As shown in FIG. 20, the titanium nitride layer entirely remained on the glass substrate, the portion where the tape was adhered and transferred was clearly transferred, the lamination ($SiO_2$ film by a sputtering method, the insulating films (1) and (2) by PCVD method, and polysilicon film)

was removed. From these, it is understood that the peeling occurred on the interface between the titanium nitride layer and SiO$_2$ film by a sputtering method.

(Experiment 3)

Here, in the case where the material of a nitride layer or a metal layer was made TiN, W and WN, in order to verify whether or not the peeled layer provided on the oxide layer can be peeled off, the following experiment was carried out by providing an oxide layer (silicon oxide: film thickness, 200 nm) being in contact with the nitride layer or the metal layer.

As the Sample 1, after TiN was formed in film thickness of 100 nm on the glass substrate by utilizing a sputtering method, a silicon oxide film with a thickness of 200 nm was formed by sputtering. After performing the step of the formation of the silicon oxide, the lamination and crystallization were performed similarly to Experiment 1.

As a Sample 2, after W was formed in film thickness of 50 nm on the glass substrate by a sputtering method, a silicon oxide film of 200 nm in thickness was formed by utilizing a sputtering method. After performing the step of the formation of the silicon oxide film, the lamination and crystallization were performed similarly to Experiment 1.

As a Sample 3, after WN was formed in film thickness of 50 nm on the glass substrate by a sputtering method, a silicon oxide film of 200 nm in thickness was formed by utilizing a sputtering method. After performing the step of the formation of the silicon oxide film, the lamination and crystallization were performed similarly to Experiment 1.

In this way, Samples 1-3 were formed, and in order to confirm whether or not the peeled layer is peeled off by adhering an adhesive tape to the peeled layer, an experiment was carried out. The results are shown in Table 1.

TABLE 1

|  | First material layer (Lower layer) | Second material layer (Upper layer) | Tape test |
| --- | --- | --- | --- |
| Sample 1 | TiN (100 nm) | Silicon oxide (200 nm) | Peeled off |
| Sample 2 | W (50 nm) | Silicon oxide (200 nm) | Peeled off |
| Sample 3 | WN (50 nm) | Silicon oxide (200 nm) | Peeled off |

Moreover, the internal stress on the respective silicon oxide film, TiN film, W film before and after the heat processing (550° C., 4 hours) was measured. The results are indicated in Table 2.

TABLE 2

|  | Internal stress value of film (dyne/cm$^2$) | |
| --- | --- | --- |
|  | After film formation | After heat processing |
| Silicon oxide film | −9.40E+08 | −1.34E+09 |
|  | −9.47E+08 | −1.26E+09 |
| TiN film | 3.90E+09 | 4.36E+09 |
|  | 3.95E+09 | 4.50E+09 |
| W film | −7.53E+09 | 8.96E+09 |
|  | −7.40E+09 | 7.95E+09 |

It should be noted that as for the silicon oxide film, the film formed in film thickness of 400 nm on the silicon substrate by a sputtering method was measured. As for TiN film and W film, after these were formed in film thickness of 400 nm on the glass substrate by a sputtering method, the internal stress was measured, then, an silicon oxide film was laminated as a cap film. After the heat processing was performed, the cap film was removed by an etching, and then the internal stress was measured again. Moreover, 2 pieces of the respective sample was prepared and the measurements were carried out.

As for W film, although it has the compressive stress (about −7×10$^9$ (Dyne/cm$^2$)) immediately after the film formation, the film has the tensile stress (about 8×10$^9$-9×10$^9$ (Dyne/cm$^2$)) by the heat processing, and the peeling off state was excellent. As for TiN film, the stress was hardly changed before and after the heating processing, it remained as it had the tensile stress (about 3.9×10$^9$-4.5×10$^9$ (Dyne/cm$^2$)). Moreover, as for the silicon oxide film, the stress was hardly changed before and after the heat processing, it remained as it had the compressive stress (about −9.4×10$^8$-−1.3×10$^9$ (Dyne/cm$^2$)).

From these results, it can be read that the peeling phenomenon relates to adhesiveness due to a variety of factors, however, particularly, is deeply concerned with the internal stress, in the case where the oxide layer was formed on the nitride layer or the metal layer, the peeled layer can be peeled off from the entire surface of the interface between the nitride layer or the metal layer and the oxide layer.

(Experiment 4)

To examine dependency on a heating temperature, the following experiment was conducted.

As a sample, after forming a W film (tungsten film) over a substrate to a thickness of 50 nm by sputtering, a silicon oxide film was formed to a thickness of 200 nm by using a sputtering (argon gas flow rate of 10 sccm, oxygen gas flow rate of 30 sccm, a film formation pressure of 0.4 Pa, sputtering electric power of 3 kW, a substrate temperature of 300° C., using a silicon target). Next, a primary coat insulating layer (silicon oxinitride film of 50 nm and silicon oxinitride film of 100 nm) and an amorphous silicon film of 54 nm in thickness are formed by plasma CVD in the same way as Experiment 1.

Next, after conducting heat treatment while varying conditions of heating temperatures, a quartz substrate is stuck on an amorphous silicon film (or a polysilicon film) by using an adhesive material, and the quartz substrate and the glass substrate are separated from each other by pulling them away by human's eye to examine whether they can be peeled off or not. The condition 1 for the heating temperature is 500° C. and 1 hour, and the condition 2 is 450° C. and 1 hour, and the condition 3 is 425° C. and 1 hour, the condition 4 is 410° C. and 1 hour, and the condition 5 is 400° C. and 1 hour, and the condition 6 is 350° C. and 1 hour.

As a result of the experiments, the sample can be peeled off under the conditions 1 to 4. The sample can not be peeled off under the conditions 5 and 6. Accordingly, in the peeling off method according to the present invention, it is preferred that the thermal treatment is conducted at least 410° C. or higher.

Further, when the W film is peeled off, the W film remains on the entire surface of the glass substrate, and a lamination layer (SiO$_2$ film by sputtering, and insulating films (1) and (2) by PCVD, and an amorphous silicon film) is transferred on the quarts substrate. FIG. 21 shows results for measuring a surface of the transferred SiO$_2$ film by TXRF. The surface roughness Rz (thirty points) are 5.44 nm by AFM measurement. Further, FIG. 22 shows results for measuring a surface of the W film with 50 nm formed on the quartz substrate as a reference. The surface roughness Rz (thirty points) is 22.8 nm by AFM measurement. Further, FIG. 23 shows results for measuring only the quartz substrate by TXRF. Because W (tungsten) peaks of FIGS. 21 and 22 are similar when they are compared, it is found that a little metallic material (tungsten here) is stuck on a surface of the transferred $SiO_2$ film.

According to constitution of the present invention disclosed in the present specification, a semiconductor device comprises a support, and a peeled off layer adhered to the support by an adhesive material, and a silicon oxide film, a little metallic material provided between the silicon oxide film and the adhesive material.

In the above constitution, the metallic material comprises an element selected from the group consisting of W, Ti, Al, Ta, Mo, Cu, Cr, Nd, Fe, Ni, Co, Zr, Zn, Ru, Rh, Pd, Os, Ir and Pt, or an alloy material or a compound material which comprises the above element as a main component.

BRIEF DESCRIPTION OF THE DRAWINGS

FIGS. 1A to 1C are diagrams for illustrating Embodiment 1 of the present invention;

FIGS. 3A to 3D are diagrams for illustrating experiments of the present invention;

FIGS. 6A to 6D are diagrams showing the preparing steps of active matrix substrate;

FIGS. 7A to 7C are diagrams showing the preparing steps of active matrix substrate;

FIG. 15 is a diagram for illustrating Example 8 of the present invention;

FIG. 17 is a diagram for illustrating Example 9 of the present invention;

FIG. 23 is a graph showing results for measuring a surface of a quartz substrate by TXRF. (Reference)

DESCRIPTION OF THE PREFERRED EMBODIMENTS

Figure 2A:
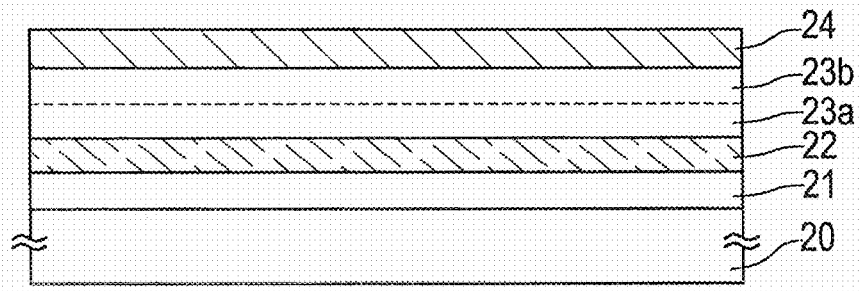
FIGS. 2A to 2c are diagrams for illustrating Embodiment 2 of the present invention.

Hereinafter, embodiments of the present invention will be described.

Embodiment 1

Hereinafter, a representative peeling off procedure utilizing the present invention will be schematically shown with reference to FIG. 1.

In FIG. 1A, the reference numeral 10 denotes a substrate, the reference numeral 11 denotes a nitride layer or a metal layer, the reference numeral 12 denotes an oxide layer, and the reference numeral 13 denotes a peeled off layer.

In FIG. 1A, as for the substrate 10, a glass substrate, a quartz substrate, a ceramic substrate or the like can be used. Moreover, a silicon substrate, a metal substrate or a stainless substrate may also be used.

First, as shown in FIG. 1A, the nitride layer or metal layer 11 is formed on the substrate 10. As the nitride layer or metal layer 11, representative examples are as follows: an element selected from Ti, Al, Ta, W, Mo, Cu, Cr, Nd, Fe, Ni, Co, Zr, Zn, Ru, Rh, Pd, Os, Ir and Pt, or a monolayer consisted of alloy materials or compound materials whose principal components are the foregoing elements or a lamination of these, or a monolayer consisted of these nitrides, for example, titanium nitride, tungsten nitride, tantalum nitride, molybdenum or a lamination of these. These may be used. Subsequently, the oxide layer 12 is formed on the nitride layer or metal layer 11. As the oxide layer 12, one representative example may use e silicon oxide, oxynitride silicon and metal oxide materials. As for the oxide layer 12, film formation methods such as sputtering method, plasma CVD method, coating method may be used. In the present invention, it is important that the film stress of this oxide layer 12 and the film stress of the nitride layer or metal layer 11 are made different from each other. The respective film thickness is appropriately set in the range from 1 nm to 1000 nm, and the respective film stress may be adjusted. Moreover, FIG. 1, in order to contemplate the simplification of the process, one example in which the nitride layer or metal layer 11 being in contact with the substrate 10 is formed has been shown, but the adhesiveness with the substrate 10 may be enhanced by providing an insulating layer or metal layer between the substrate 10 and the nitride layer or metal layer 11.

Subsequently, a peeled off layer 13 is formed on the oxide layer 12 (FIG. 1A). The peeled off layer may be a layer containing a variety of elements (thin film diode, photoelectric conversion element comprising PIN junction of silicon, and silicon resistance element) whose representative is TFT. Moreover, the heat processing in the range where the substrate 10 is endurable can be performed. It should be noted that in the present invention, even if the film stress of the oxide layer 12 and the film stress of the nitride layer or metal layer 11 are different, the film peeling or the like does not occur by the heat processing in the preparing step of the peeled off layer 13.

Subsequently, the substrate 10 on which the nitride layer or metal layer 11 is provided is pulled away by the physical means (FIG. 1B). Since the film stress of the oxide layer 12 and the film stress of the nitride layer or metal layer 11 are different, these can be pulled away by a comparatively small force. Moreover, although here, one example in which it is supposed that the peeled off layer 13 has a sufficient mechanical strength is shown, in the case where the mechanical strength of the peeled off layer 13 is not sufficient, it is preferred that after the supporting body (not shown) for fixing the peeled off layer 13 was pasted, it is peeled off. In this way, the peeled off layer 13 formed on the oxide layer 12 can be separated from the substrate 10. The state after it was peeled off is shown in FIG. 1 C.

In Experiment, in the case where tungsten film has thickness of 10 nm as the metal layer 11, and the silicon oxide film has thickness of 200 nm as an oxide layer 12 by a sputtering method, the peeling off could be confirmed according to a peeling off method of the present invention. In the case where tungsten film has thickness of 50 nm as the metal layer 11, and the silicon oxide film has thickness of 100 nm as an oxide layer 12 by a sputtering method, the peeling off could be confirmed according to a peeling off method of the present invention. In the case where tungsten film has thickness of 50 nm as the metal layer 11, and the silicon oxide film has thickness of 400 nm as an oxide layer 12 by sputtering method, the peeling off could be confirmed according to a peeling off method of the present invention. Moreover, after it was peeled off, the peeled off layer 13 pulled away may be pasted on the transferring body (not shown).

Moreover, the present invention can be applied to a method of preparing a variety of semiconductor devices. Particularly, it can be made light by using plastic substrate for a transferring body and supporting body. In the case where a liquid crystal display device is prepared, the supporting body is made as an opposing substrate, the supporting body may be adhered to the peeled layer by utilizing a seal member as an adhesive member. In this case, an element provided on the foregoing peeled layer has a pixel electrode, and it is made so that a liquid crystal material is packed between the relevant pixel electrode and the foregoing opposing substrate. Moreover, the order of the processes for the preparation of a liquid crystal display device is not particularly limited, and an opposing substrate as a supporting body was pasted. After the liquid crystal was implanted, the substrate may be peeled off and pasted on a plastic substrate as a transferring body, or after the pixel electrode was formed, the substrate may be peeled off, after the plastic substrate as the first transferring body was pasted, the opposing substrate as the second transferring body may be pasted.

Moreover, in the case where a light emitting device represented by a light emitting device having an OLED is prepared, it is preferable that the supporting body is made as a sealing medium, a light emitting element is completely interrupted from the exterior so as to prevent substances such as water content, oxygen or the like which promotes the deterioration of an organic compound layer from penetrating from the exterior. Moreover, in the case where a light emitting device represented by a light emitting device having an OLED is prepared, it is preferable that substances such as water, oxygen or the like promoting the deterioration of the organic compound layer is sufficiently prevented from penetrating from the exterior not only into the supporting body but also the transferring body. Moreover, the order of the processes for the preparation of a light emitting device is not particularly limited.

After a light emitting element was formed, a plastic substrate as a supporting body may be pasted, the substrate may be peeled off, and the plastic substrate as a transferring body may be pasted, or after a light emitting element was formed, the substrate may be peeled off, and after the plastic substrate as the first transferring body was pasted, the plastic substrate as the second transferring body may be pasted.

Embodiment 2

Figure 2B:
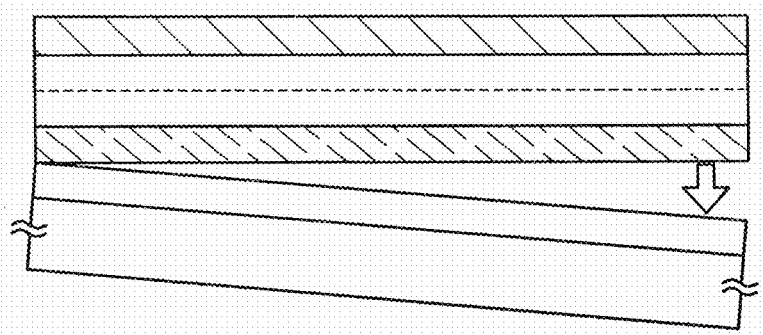
Figure 2C:
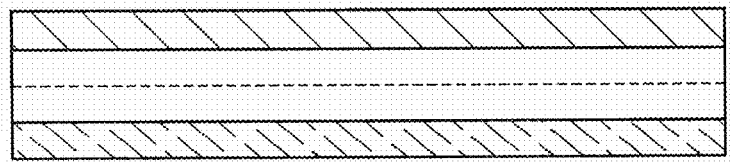

As for the present Embodiment, the peeling off procedure for peeling off the substrate while the impurities diffusion from the nitride layer or metal layer and the substrate is prevented by providing a primary coat insulating layer being in contact with the peeled off layer is schematically shown in FIG. 2.

In FIG. 2A, the reference numeral 20 denotes a substrate, the reference numeral 21 denotes a nitride layer or a metal layer, the reference numeral 22 denotes an oxide layer, the reference numerals and characters 23a and 23b denote primary coat insulating layers, and the reference numeral 24 denotes a peeled off layer.

In FIG. 2A, as for the substrate 20, a glass substrate, a quartz substrate, a ceramic substrate or the like can be used. Moreover, a silicon substrate, a metal substrate or a stainless substrate may also be used.

First, as shown in FIG. 2A, the nitride layer or metal layer 21 is formed on the substrate 20. As the nitride layer or metal layer 21, representative examples are as follows: an element selected from Ti, Al, Ta, W, Mo, Cu, Cr, Nd, Fe, Ni, Co, Zr, Zn, Ru, Rh, Pd, Os, Ir and Pt, or a monolayer consisted of alloy materials or compound materials whose principal components are the foregoing elements or a lamination of these, a monolayer consisted of these nitrides, for example, titanium nitride, tungsten nitride, tantalum nitride, molybdenum nitride or a lamination of these. These may be used. Subsequently, the oxide layer 22 is formed on the nitride layer or metal layer 21. As the oxide layer 22, one representative example may use silicon oxide, oxynitride silicon, and metal oxide materials. It should be noted that any film formation method such as a sputtering method, a plasma CVD method, coating method or the like might be applied to the oxide layer 22.

In the present invention, it is important that the film stress of this oxide layer 22 and the film stress of the nitride layer or metal layer 21 are made different. The respective film thickness is appropriately set in the range from 1 nm to 1000 nm, and the respective film stress may be adjusted. Moreover, FIG. 2, in order to contemplate the simplification of the process, one example in which the nitride layer or metal layer 21 being in contact with the substrate 20 is formed has been shown, but the adhesiveness with the substrate 20 may be enhanced by providing an insulating layer or metal layer between the substrate 20 and the nitride layer or metal layer 21.

Subsequently, a primary coat insulating layers 23a and 23b were formed on the oxide layer 22 by plasma CVD method. Here, the silicon oxynitride film 23a (composition ratio Si=32%, O=27%, N=24% and H=17%) prepared from the raw material gases $SiH_4$, $NH_3$, and $N_2O$ was formed (preferably, 10-200 nm) in thickness of 50 nm at 400° C. of the film formation temperature by a plasma CVD method, and further the silicon oxynitride film 23b (composition ratio Si=32%, O=59%, N=7% and H=2%) prepared from the raw material gases $SiH_4$ and $N_2O$ was lamination-formed (preferably, 50-200 nm) in thickness of 100 nm at 400° C. of the film formation temperature by a plasma CVD method. But it is not particularly limited, and a monolayer or a lamination having three layers or more may be used. Subsequently, a peeled off layer 24 is formed on the primary coat insulating layer 23b (FIG. 2A).

In this way, in the case where two-layer primary coat insulating layers 23a and 23b were made, in the process in which the peeled off layer 24 is formed, diffusion of the impurities from the nitride layer or the metal layer 21 and the substrate 20 can be prevented. Moreover, the adhesiveness between the oxide layer 22 and the peeled off 24 can be enhanced by utilizing the primary coat insulating layers 23a and 23b.

Moreover, in the case where the concave and convex are formed on the surface due to the nitride layer or metal layer 21 and the oxide layer 22, the surface may be flattened before and after the primary coat insulating layer is formed. The coverage on the peeled off layer 24 becomes more excellent when it is flattened, in the case where the peeled off layer 24 containing an element 24 is formed, it is preferable since the element characteristics become easily stable. It should be noted that as a flattening processing, an etch back method in which an etching or the like is performed after the formation of the coated film (resist film or the like), a chemical mechanical polishing method (CMP method) or the like may be used.

Subsequently, the substrate 20 on which the nitride layer or metal layer 21 is provided is pulled away by the physical means (FIG. 2 B). Since the film stress of the oxide layer 22 and the film stress of the nitride layer or metal layer 21 are different, these can be pulled away by a comparatively small force. Moreover, although here, one example in which it has been supposed that the peeled off layer 24 has a sufficient mechanical strength is shown, in the case where the mechanical strength of the peeled off layer 24 is not sufficient, it is preferred that after the supporting body (not shown) for fixing the peeled off layer 24 was pasted, it is peeled off.

In this way, the peeled off layer 24 formed on the primary coat insulating layer 22 can be separated from the substrate 20. The state after it was peeled off is shown in FIG. 2 C.

Moreover, after it was peeled off, the peeled off layer 24 pulled away may be pasted on the transferring body (not shown).

Moreover, the present invention can be applied to a method of preparing a variety of semiconductor devices. Particularly, it can be made light by using plastic substrate for a transferring body and supporting body. In the case where a liquid crystal display device is prepared, the supporting body is made as an opposing substrate, the supporting body may be adhered to the peeled layer by utilizing an sealing medium as an adhesive member. In this case, an element provided on the peeled layer has a pixel electrode, and it is made so that a liquid crystal material is packed between the relevant pixel electrode and the foregoing opposing substrate. Moreover, the order of the processes for the production of a liquid crystal display device is not particularly limited, an opposing substrate as a supporting body was pasted, after the liquid crystal was implanted, and the substrate may be peeled off and pasted on a plastic substrate as a transferring body, or after the pixel electrode was formed, the substrate may be peeled off. After the plastic substrate as the first transferring body was pasted, the opposing substrate as the second transferring body may be pasted.

Moreover, in the case where a light-emitting device represented by a light emitting device having an OLED is prepared, it is preferable that the supporting body is made as a sealing medium, a light emitting element is completely interrupted from the exterior so as to prevent substances such as water content, oxygen or the like which promotes the deterioration of an organic compound layer from penetrating from the exterior. Moreover, in the case where a light-emitting device represented by a light emitting device having an OLED is prepared, it is preferable that substances such as water content, oxygen or the like promoting the deterioration of the organic compound layer is sufficiently prevented from penetrating from the exterior not only into the supporting body but also the transferring body. Moreover, the order of the processes for the preparation of a light emitting device is not particularly limited, after a light emitting element was formed, a plastic substrate as a supporting body may be pasted, the substrate may be peeled off, and the plastic substrate as a transferring body may be pasted, or after a light emitting element was formed, the substrate may be peeled off, and after the plastic substrate as the first transferring body was pasted, the plastic substrate as the second transferring body may be pasted.

Embodiment 3

Figure 4A:
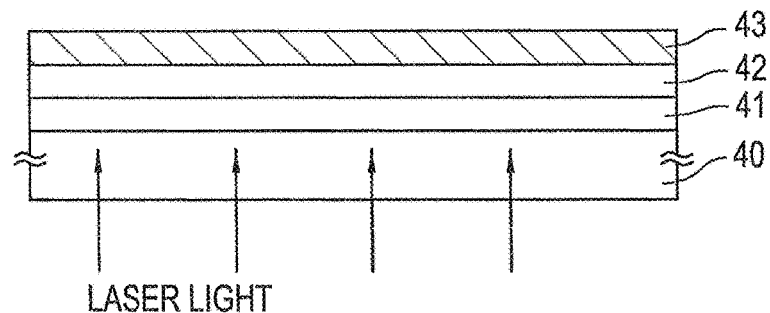
FIGS. 4A to 4C are diagrams for illustrating Embodiment 3 of the present invention.
Figure 4B:
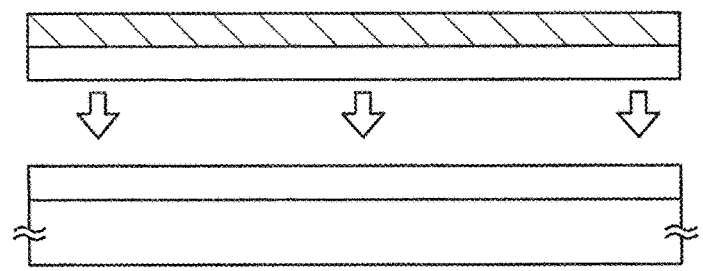
Figure 4C:
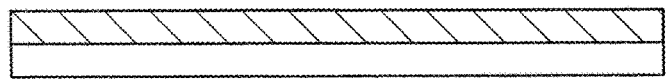

In the present embodiment, in addition to Embodiment 1, an example in which the irradiation of laser beam or the heat processing is performed in order to promote the peeling off is shown in FIG. 4.

In FIG. 4A, the reference numeral 40 denotes a substrate, the reference numeral 41 denotes a nitride layer or a metal layer, the reference numeral 42 denotes an oxide layer and the reference numeral 43 denotes a peeled off layer.

Since the step of forming it until the peeled off layer 43 is made is the same with Embodiment 1, the description is omitted.

After the peeled off layer 43 was formed, the irradiation of laser beam is performed (FIG. 3 A). As a laser beam, a gas laser such as an excimer laser or the like, a solid state laser such as $YVO_4$ laser, YAG laser or the like, and a semiconductor laser may be used. Moreover, the form of laser may be either of continuous oscillation or pulse oscillation, and the shape of the laser beam may be any of linear, rectangular, circular, or elliptical shape. Moreover, the wavelength to be used may be any of fundamental wave, the second higher harmonic wave, or the third higher harmonic wave.

Moreover, it is desirable that a material used for the nitride layer or metal layer 41 is a material easily absorbing the laser beam, and titanium nitride is preferred. It should be noted that in order to make the laser beam pass, a substrate having a transparency is used for the substrate 40.

Subsequently, the substrate 40 on which the nitride layer or metal layer 41 is provided is pulled away by the physical means (FIG. 4 B). Since the film stress of the oxide layer 42 and the film stress of the nitride layer or metal layer 41 are different, these can be pulled away by a comparatively small force.

The film stresses can be changed each other and the peeling can be promoted by irradiating the laser beam and heating the interface between the nitride layer or metal layer 41 and the oxide layer 42, and the peeling off can be performed by smaller force. Moreover, although here, one example in which it is supposed that the peeled off layer 43 has a sufficient mechanical strength is shown, in the case where the mechanical strength of the peeled off layer 43 is not sufficient, it is preferred that after the supporting body (not shown) for fixing the peeled off layer 43 was pasted, it is peeled off.

In this way, the peeled off layer 43 formed on the oxide layer 42 can be separated from the substrate 40. The state after it was peeled off is shown in FIG. 4 C. Moreover, it is not limited to the laser beam, a visible light from the light source such as a halogen lump or the like, an infrared ray, an ultraviolet ray, a microwave or the like may be used.

Moreover, instead of laser beam, the heat processing in an electric furnace may be available.

Moreover, before the supporting body is adhered, or before it is peeled off by the foregoing physical means, the heating processing or the irradiation of laser beam may be performed.

Furthermore, the present Embodiment can be combined with Embodiment 2.

Embodiment 4

Figure 5A:
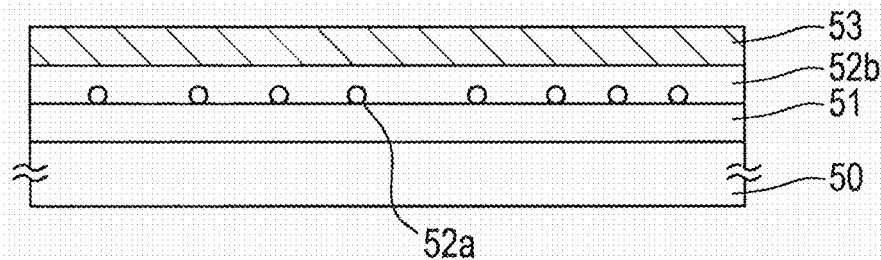
FIGS. 5A to 5C are diagrams for illustrating Embodiment 4 of the present invention.
Figure 5B:
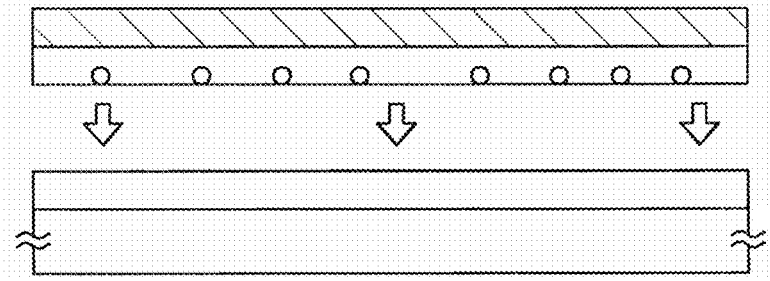
Figure 5C:
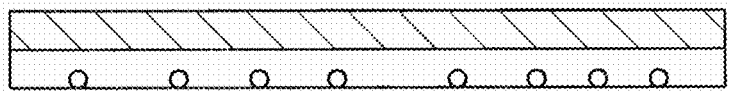

In the present embodiment, in addition to Embodiment 1, an example in which an oxide in a granular shape is provided on the interface between the nitride layer or metal layer and the oxide layer in order to promote the peeling off is shown in FIG. 5.

In FIG. 5A, the reference numeral 50 denotes a substrate, the reference numeral 51 denotes a nitride layer or a metal layer, the reference numeral 52a denotes an oxide layer in a granular shape, the reference numeral 52b denotes an oxide layer, and the reference numeral 53 denotes a peeled off layer.

Since the step of forming it until the nitride layer or metal layer 51 is formed is the same with Embodiment 1, the description is omitted.

After the nitride layer or metal layer 51 was formed, the oxide in a granular shape 52a is formed. As the oxide in a granular shape 52a, a metal oxide material, form example, ITO (indium oxide-tin oxide alloy), indium oxide-zinc oxide alloy ($In_2O_3$—ZnO), zinc oxide (ZnO) or the like may be used.

Subsequently, the oxide layer 52b for covering the oxide layer 52a in a granular shape is formed. As the oxide layer 52b, one representative example may use silicon oxide, oxynitride silicon, and metal oxide materials. It should be noted that any film formation method such as a sputtering method, a plasma CVD method, coating method or the like might be applied to the oxide layer 23b.

Subsequently, a peeled off layer 53 is formed on the oxide layer 52b (FIG. 5 A).

Subsequently, the substrate 50 on which the nitride layer or metal layer 51 is provided is pulled away by the physical means (FIG. 5 B). Since the film stress of the oxide layer 52 and the film stress of the nitride layer or metal layer 51 are different, these can be pulled away by a comparatively small force.

The bonding force between the nitride layer or metal layer 51 and the oxide layer 52 is weakened, the adhesiveness from each other is changed, the peeling off can be promoted by providing the oxide in a granular shape 52b and these can be peeled off by smaller force. Moreover, although here, an example in which it is supposed that the peeled off layer 53 has a sufficient mechanical strength is shown, in the case where the mechanical strength of the peeled off layer 53 is not sufficient, it is preferred that after the supporting body (not shown) for fixing the peeled off layer 53 was pasted, it is peeled off.

In this way, the peeled off layer 53 formed on the oxide layer 52b can be separated from the substrate 50. The state after it was peeled off is shown in FIG. 5 C. Furthermore, the present Embodiment can be combined with Embodiment 2 or Embodiment 3.

The present invention comprising the above-described constitutions will be described in detail with reference to Examples shown below.

EXAMPLES

Example 1

Examples of the present invent ion will be described with reference to FIG. 6 through FIG. 8. Here, a method in which a pixel section and TFT of a drive circuit provided on the periphery of the pixel section (n-channel type TFT and p-channel type TFT) are prepared at the same time on the same substrate will be described in detail.

First, the nitride layer or metal layer 101, the oxide layer 102 and the primary coat insulating film 103 are formed on the substrate 100, after a semiconductor film having a crystal structure was obtained, a semiconductor layers 104-108 isolated in a island shape are formed by etching processing in the desired shape.

As the substrate 100, the glass substrate (#1737) is used.

Moreover, as the metal layer 101, an element selected from Ti, Al, Ta, W, Mo, Cu, Cr, Nd, Fe, Ni, Co, Zr, Zn, Ru, Rh, Pd, Os, Ir and Pt, or a monolayer consisted of alloy materials or compound materials whose principal components are the foregoing elements or a lamination of these may be used. More preferably, a monolayer consisted of these nitrides, for example, titanium nitride, tungsten nitride, tantalum nitride, molybdenum nitride or a lamination of these may be used. Here, titanium nitride film having film thickness of 100 nm is utilized by a sputtering method.

Moreover, as the oxide layer 102, a monolayer consisted of a silicon oxide material or a metal oxide material, or a lamination of these may be used. Here, a silicon oxide film having film thickness of 200 nm is used by a sputtering method. The bonding force between the metal layer 101 and the oxide layer 102 is strong in heat processing, the film peeling (also referred to as solely "peeling") or the like does not occur. However, it can be easily peeled off on the inside of the oxide layer or on the interface by the physical means.

Subsequently, as a primary coat insulating layer, a silicon oxynitride film 103a (composition ratio Si=32%, O=27%, N=24% and H=17%) prepared from the raw material gases $SiH_4$, $NH_3$, and $N_2O$ was formed (preferably, 10-200 nm) in thickness of 50 nm at 400° C. of the film formation temperature by a plasma CVD method. Subsequently, after the surface was washed by ozone water, the oxide film of the surface was removed by dilute hydrofluoric acid (1:100 dilution). Subsequently, a silicon oxynitride film 103b (composition ratio Si=32%, O=59%, N=7% and H=2%) prepared from the raw material gases. $SiH_4$ and $N_2O$ was lamination-formed (preferably, 50-200 nm) in thickness of 100 nm at 400° C. of the film formation temperature by a plasma CVD method, and further, a semiconductor layer (here, an amorphous silicon layer) having an amorphous structure is formed (preferably, 25-80 nm) in thickness of 54 nm at 300° C. of the film formation temperature without the air release by a plasma CVD method.

In the present Example, although the primary coat film 103 is shown as a two-layer structure, a monolayer film of the foregoing insulating film or a layer as a structure in which two layers or more are laminated may be formed. Moreover, there are no limitations to materials for a semiconductor film, but preferably, it may be formed using a silicon or a silicon germanium ($Si_xGe_{1-x}$ (X=0.0001-0.02)) alloy or the like by the known means (sputtering method, LPCVD method, plasma CVD method or the like). Moreover, a plasma CVD apparatus may be sheet type apparatus, or batch type apparatus. Moreover, the primary insulating film and the semiconductor film may be continuously formed in the same film formation chamber without contacting with the air.

Subsequently, after the surface of the semiconductor film having an amorphous structure was washed, an oxide film having an extremely thin thickness of about 2 nm is formed on the surface with ozone water. Subsequently, in order to control the threshold value of TFT, a doping of a trace of impurity element (boron or phosphorus) is performed. Here, boron was added to the amorphous silicon film under the doping conditions of 15 kV of acceleration voltage, 30 sccm of flow rate of the gas in which diborane was diluted into 1% with hydrogen, $2\times10^{12}/cm^2$ of dosage without mass segregating diborane ($B_2H_6$) by utilizing an ion doping method in which plasma excitation was performed.

Subsequently, nickel acetate solution containing 10 ppm of nickel when it is converted to weight was coated by a spinner. A method of spreading over the entire surface with nickel element by a sputtering method instead of coating may be employed.

Subsequently, a semiconductor film having a crystal structure was formed by performing the heat processing and crystallizing it. For this heat processing, the heat processing of an electric furnace or the irradiation of strong light may be used. In the case where it is performed by utilizing the heat processing of the electric furnace, it may be performed at 500° C.-650° C. for 4-24 hours. Here, after the heat processing (500° C., one hour) for dehydrogenation was carried out, a silicon film having a crystal structure was obtained by performing the heat processing for crystallization (550° C., 4 hours). It should be noted that although here, crystallization was performed using the heat processing by the furnace, however, the crystallization may be performed by a lamp anneal apparatus.

It should be noted that here, a crystallization technology using nickel as a metal element for promoting the crystallization of silicon is used. However, the other known crystallization technology, for example, solid phase crystallization method or laser crystallization method may be used.

Subsequently, after the oxide film of the surface of the silicon film having a crystal structure was removed by dilute hydrofluoric acid or the like, the irradiation of the first laser beam (XeCl: wavelength 308 nm) for enhancing the crystallization ratio and repairing the defaults remained within the crystal grain is performed in the air, or in the oxygen atmosphere. For a laser beam, an excimer laser beam of 400 nm or less of wavelength, the second higher harmonic wave, the third higher harmonic wave of YAG laser are used. Anyhow, using pulse laser beam having about 10-1000 Hz of repeated frequency, the relevant laser beam is condensed at 100-500 $mJ/cm^2$ by an optical system, irradiated with overlap ratio of 90-95% and it may be made it scan the surface of the silicon film. Here, the irradiation of the first laser beam is performed at repeated frequency of 30 Hz, 393 $mJ/cm^2$ of energy density in the air. It should be noted that since it is performed in the air, or in the oxygen atmosphere, an oxide film is formed on the surface by the irradiation of the first laser beam.

Subsequently, after the oxide film formed by irradiation of the first laser beam was removed by dilute hydrofluoric acid, the irradiation of the second laser beam is performed in the nitrogen atmosphere or in the vacuum, thereby flattening the surface of the semiconductor film. For this laser beam (second laser beam), an excimer laser beam having a wavelength of 400 nm or less, the second higher harmonic wave, the third higher harmonic wave of YAG laser are used. The energy density of the second laser beam is made larger than the energy density of the first laser beam, preferably, made larger by 30-60 $mJ/cm^2$. Here, the irradiation of the second laser beam is performed at 30 Hz of the repeated frequency and 453 $mJ/cm^2$ of energy density, P-V value (Peak to Valley, difference between the maximum value and minimum value) of the concave and convex in the surface of the semiconductor film is to be 50 nm or less. This P-V value is obtained by an AFM (atomic force microscope).

Moreover, in the present Example, the irradiation of the second laser beam was performed on the entire surface. However, since the reduction of the OFF-state current is particularly effective to the TFT of the pixel section, it may be made a step of selectively irradiating only on at least pixel section.

Subsequently, a barrier layer consisted of an oxide film of total 1-5 nm in thickness is formed by processing the surface with ozone water for 120 seconds.

Subsequently, an amorphous silicon film containing argon element which is to be gettering site is formed in film thickness of 150 nm on the barrier layer by a sputtering method. The film formation conditions by a sputtering method of the present Example are made as 0.3 Pa of film formation pressure, 50 (sccm) of gas (Ar) volumetric flow rate, 3 kW of film formation power, and 150° C. of the substrate temperature. It should be noted that the atomic percentage of argon element contained in the amorphous silicon film under the above-described conditions is in the range from $3\times10^{20}/cm^3$ to $6\times10^{20}/cm^3$, the atomic percentage of oxygen is in the range from $1\times10^{19}/cm^3$ to $3\times10^{19}/cm^3$. Then, the gettering is performed by carrying out the heat processing at 650° C. for 3 minutes using a lamp anneal apparatus.

Subsequently, after the barrier layer is made an etching stopper, the amorphous silicon film containing argon element which is the gettering site was selectively removed, the barrier layer is selectively removed with dilute hydrofluoric acid. It should be noted that since when gettering, nickel tends to easily move into the higher oxygen density region, it is desirable that the barrier layer consisted of an oxide film is removed after the gettering.

Subsequently, after a thin oxide film is formed with the ozone water on the surface of the silicon film (also referred to as "polysilicon film") having the obtained crystal structure, a mask consisted of a resist is formed, and the semiconductor layers 104-108 isolated in an island shape is formed in the desired shape by etching processing. After the semiconductor layer was formed, the mask consisted of the resist is removed.

Subsequently, the oxide film was removed by an etchant containing hydrofluoric acid, and at the same time, the surface of the silicon film was washed, an insulating film whose principal component is silicon and which is to be a gate insulating film 109 is formed. In the present Example, a silicon oxynitride film (composition ratio Si=32%, O=59%, N=7% and H=2%) is formed in thickness of 115 nm by plasma CVD method.

Subsequently, as shown in FIG. 6A, the first electrically conductive film 110a having film thickness of 20-100 nm and the second electrically conductive film 110b having film thickness of 100-400 nm are lamination-formed on the gate insulating film 109. In the present Example, a tantalum nitride film having film thickness of 50 nm and a tungsten film having film thickness of 370 nm are in turn laminated on the gate insulating film 109.

As an electrically conductive material for forming the first electrically conductive film and the second electrically conductive film, it is formed using an element selected from Ta, W, Ti, Mo, Al and Cu, or alloy material or compound material whose principal component is the foregoing element. Moreover, as the first electrically conductive film and the second electrically conductive film, a semiconductor film represented by a polycrystal silicon film in which impurity element such as phosphorus or the like is doped, and Ag, Pd, Cu alloys may be used. Moreover, it is not limited to a two-layer structure. For example, it may be made a three-layer structure in which a tungsten film having film thickness of 50 nm, aluminum-silicon (Al—Si) alloy having film thickness of 500 nm, and a titanium nitride film having film thickness of 30 nm are in turn laminated. Moreover, in the case of a three-layer structure, instead of tungsten of the first electrically conductive film, tungsten nitride may be used, instead of aluminum-silicon (Al—Si) alloy of the second electrically conductive film, aluminum-titanium (Al—Ti) alloy film may be used, or instead of a titanium nitride film of the third electrically conductive film, a titanium film may be used. Moreover, it may be a monolayer structure.

Next, as shown in FIG. 6B, masks 112-117 consisted of resists are formed by light exposure step, the first etching processing for forming a gate electrode and wirings is performed. The first etching processing is performed under the first and second etching conditions. As for an etching, ICP (Inductively Coupled Plasma) etching method may be used. The film can be etched in the desired tapered shape by appropriately adjusting the etching conditions (electric energy applied to the coil type electrode, electric energy applied to the electrode on the substrate side, temperature of electrode on the substrate side and the like). It should be noted that as gas for an etching, chlorine based gas which is represented by $Cl_2$, $BCl_3$, $SiCl_4$, $CCl_4$ or the like, fluorine based gas which is represented by $CF_4$, $SF_6$, $NF_3$ or the like or $O_2$ can be appropriately used.

In the present Example, also to the substrate side (sample stage), 150 W of RF (13.56 MHz) electric power is turned on, substantially negative self-bias voltage is applied. It should be noted that the size of the electrode area on the side of the substrate is 12.5 cm×12.5 cm, and the size of the coil type electrode area (here, quartz disk on which the coil is provided) is an area of a disk having a diameter of 25 cm. The end section of the first electrically conductive layer is made in a tapered shape by etching W film under the first etching conditions. The etching rate to W under the first etching conditions is 200.39 nm/min, the etching rate to TaN is 80.32 nm/min, and the selection ratio of W to TaN is about 2.5. Moreover, the tapered angle of W is about 26°. Then, the second etching conditions were changed without removing the masks 112-117 consisted of resists, $CF_4$ and $Cl_2$ were used for etching gas, the respective ratio of gas volumetric flow rate was made 30/30 (sccm), 500 W of RF (13.56 MHz) electric power was turned on to the coil type electrode at 1 Pa of the pressure, the plasma was generated and the etching was performed for about 30 seconds. 20 W of RF (13.56 MHz) electric power was also turned on to the side of the electrode (sample stage), and substantially a negative self bias voltage was applied. The etching rate to W under the second etching conditions was 58.97 nm/min, and the etching rate to TaN was 66.43 nm/min. It should be noted that in order to etch without remaining residue on the gate insulating film, it might increase the etching time at the ratio of about 10-20%. In the above-described first etching processing, the end section of the first electrically conductive layer and the second electrically conductive layer becomes in a tapered shape due to the effect of the bias voltage to be applied to the substrate side by making the mask consisted of a resist adjust to be suitable. The angle of this tapered section may be made in the range from 15 to 45°.

In this way, electrically conductive layers 119-123 in the first shape consisted of the first electrically conductive layer and the second electrically conductive layer (first electrically conductive layers 119a-124a and the second electrically conductive layers 119b-124b) are formed by the first etching processing. The insulating film 109 which is to be a gate insulating film is etched about 10-20 nm, becomes a gate insulating film 118 whose region not covered with the electrically conductive layers in the first shape 119-123 is made thinner.

Subsequently, the second etching processing is performed without removing the mask consisted of the resist. Here, using $SF_6$, $Cl_2$ and $O_2$ for etching gas, the etching was performed for 25 seconds by making the ratio of gas volumetric flow rate 24/12/24 (sccm), turning on 700 W of RF (13.56 MHz) electric power to the coil type electrode and generating the plasma at 1.3 Pa of the pressure. 10 W of RF (13.56 MHz) electric power was also turned on to the side of the electrode (sample stage), and substantially a negative self bias voltage was applied. The etching rate to W under the second etching conditions was 227.3 nm/min, and the etching rate to TaN was 32.1 nm/min, the selection ratio of W to TaN is 7.1, the etching rate to SiON which is an insulating film 118 is 33.7 nm/min, and the selection ratio of W to SiON is 6.83. In this way, in the case where $SF_6$ is used for etching gas, since the selection ratio to the insulating film 118 is high, the film reduction can be suppressed. In the present Example, in the insulating film 118, only about 8 nm of the film reduction occurred.

The tapered angle became 70° by the second etching processing. The second electrically conductive layers 126b-131b are formed by the second etching processing. On the other hand, the first electrically conductive layer is scarcely etched, and becomes the first electrically conductive layers 126a-131a. It should be noted that the sizes of the first electrically conductive layers 126a-131a are almost the same with the first electrically conductive layers 119a-124a. Actually, although there are some cases where the width of the first electrically conductive layer is backward by about 0.3 µm comparing to that before the second etching, that is, about 0.6 µm in whole line width backward, there is scarcely no change in size.

Moreover, in the case where instead of two-layer structure, three-structure in which a tungsten film having film thickness of 50 nm, an aluminum-silicon (Al—Si) alloy film having film thickness of 500 nm, and a titanium nitride film are in turn laminated is employed, as for the first etching conditions of the first etching processing, the etching may be performed for 117 seconds by utilizing $BCl_3$, $Cl_2$ and $O_2$ as raw material gases, making the respective ratio of gas volumetric flow rates 65/10/5 (sccm), turning on 300 W of RF (13.56 MHz) electric power to the substrate side (sample stage), turning on 450 W of RF (13.56 MHz) electric power to the coil type electrode at 1.2 Pa of the pressure and generating plasma, as f or the second etching conditions of the first etching processing, the etching may be performed for about 30 seconds by utilizing $CF_4$, $Cl_2$ and $O_2$ as raw material gases, making the respective ratio of gas volumetric flow rates 25/25/10 (sccm), turning on 20 W of RF (13.56 MHz) electric power to the substrate side (sample stage), turning on 500 W of RF (13.56 MHz) electric power to the coil type electrode at 1 Pa of the pressure and generating a plasma, as for the second etching processing, the etching may be performed by utilizing $BCl_3$ and $Cl_2$ as raw material gases, making the respective ratio of gas volumetric flow rates 20/60 (sccm), turning on 100 W of RF (13.56 MHz) electric power to the substrate side (sample stage), turning on 600 W of RF (13.56 MHz) electric power to the coil type electrode at 1.2 Pa of the pressure and generating a plasma.

Subsequently, after the mask consisted of the resist was removed, the state of FIG. 6D is obtained by performing the first doping processing. The doping processing may be carried out by an ion doping method, or ion implantation method. The conditions of an ion doping method are $1.5 \times 10^{14}$ atoms/cm$^2$, and 60-100 keV of the acceleration voltage, it is performed under these conditions. As an impurity element conferring n-type, typically, phosphorus (P) or arsenic (As) are used. In this case, the first electrically conductive layers and the second electrically conductive layers 126-130 are masks with respect to the impurity element conferring n-type, the first impurity regions 132-136 are formed in a self-aligned manner. The impurity elements conferring n-type are added in the density range from $1 \times 10^{16}$ to $1 \times 10^{17}$/cm$^3$ to the first impurity regions 132-136. Here, the region having the same density range with the first impurity region is also referred to as n--region.

It should be noted that in the present Example, after the mask consisted of resist was removed, the first doping processing was performed. However, the first doping processing may be performed without removing the mask consisted of the resist.

Subsequently, as shown in FIG. 7 A, the masks 137-139 consisted of resists are formed and the second doping processing is performed. The mask 137 is a mask for protecting the channel formation region of the semiconductor layer forming p-channel type TFT of the drive circuit and its peripheral region, the mask 138 is a mask for protecting the channel formation region of the semiconductor layer forming one of n-channel type TFT of the drive circuit, and the mask 139 is a mask for protecting the channel formation region of the semiconductor layer forming TFT of the pixel section and its peripheral region, and further a region which is to be retention volume.

The conditions for ion doping in the second doping processing are $1.5 \times 10^{15}$ atoms/cm$^2$ of dosage, and 60-100 keV of the acceleration voltage, and under these conditions, phosphorus (P) is doped. Here, by utilizing the second electrically conductive layers 126b-128b as masks, the impurity region is formed in a self-aligned manner on the respective semiconductor layers. Needless to say, to the region covered with the masks 137-139, the impurities are not added. Thus, the second impurity regions 140-142 and the third impurity region 144 are formed. The impurity element conferring n-type is added in the density range from $1 \times 10^{20}$ to $1 \times 10^{21}$/cm$^3$ on the second impurity regions 140-142. Here, the region having the same density range with the second impurity region is also referred to as n+ region.

Moreover, the third impurity region is formed in a lower density than that of the second impurity region by the first electrically conductive layer, the impurity element conferring n-type is added in the density range from $1 \times 10^{18}$ to $1 \times 10^{19}$/cm$^3$. It should be noted that as for the third impurity region, since the doping is performed by making it pass the portion of the first electrically conductive layer and performing the doping, it has a density gradient in which the impurity density increases toward the end section of the tapered section. Here, the region having the same density range with the third impurity region is also referred to as n-region. Moreover, the impurity element is not added to the region covered by the masks 138 and 139 by the second doping processing, therefore, these become the first impurity regions 145 and 146.

Subsequently, after the masks 137-139 consisted of the resists were removed, the masks 148-150 consisted of resists are newly formed, and as shown in FIG. 7 B, the third doping processing is performed.

In the drive circuit, the fourth impurity regions 151, 152 and the fifth impurity regions 153, 154 in which the impurity element conferring p-type electrically conductive type to the semiconductor layer for forming p-channel type TFT and the semiconductor layer for forming retention volume has been added are formed by the above-described third doping processing.

Moreover, it is made so that the impurity element conferring p-type is added to the fourth impurity regions 151, 152 in the range from $1 \times 10^{20}$ to $1 \times 10^{21}$/cm$^3$. It should be noted that the fourth impurity regions 151, 152 are the regions (n--region) to which phosphorus (P) has been added in the prior step, but its 1.5- to 3-fold density of impurity element conferring p-type is added, and the electrically conductive type is p-type. Here, the region having the same density region with the fourth impurity region is also referred to as p+ region.

Moreover, the fifth impurity regions 153, 154 are formed on the region overlapped with the tapered section of the second electrically conductive layer 127a, it is made so that the impurity element conferring p-type is added in the density range from $1 \times 10^{18}$ to $1 \times 10^{20}$/cm$^3$. Here, the region having the same density range with the fifth impurity region is also referred to as p-region.

Up to the above-described steps, the impurity regions having n-type or p-type electrically conductive type are formed on the respective semiconductor layers. The electrically conductive layers 126-129 become gate electrodes of TFT. Moreover, the electrically conductive layer 130 becomes one of the electrodes for forming the retention volume in the pixel section. Furthermore, the electrically conductive layer 131 forms source wirings in the pixel section.

Subsequently, an insulating film (not shown) for covering the nearly whole surface is formed. In the present Example, a silicon oxide film having film thickness of 50 nm has been formed by plasma CVD method. Needless to say, this insulating film is not limited to the silicon oxide film, another insulating film containing silicon may be used as a monolayer or a lamination structure.

Subsequently, the step for processing the activation of the impurity elements added to the respective semiconductor layers is carried out. This activation step is performed by rapid thermal annealing method (RTA method) using a lamp light source, or a method of irradiating YAG laser or excimer laser from the back side, or heat processing using a furnace, or a method combined with any method of these methods.

Moreover, in the present Example, although an example in which an insulating film was formed before the above-described activation has been shown, the step may be made a step in which after the above-described activation was performed, the insulating film is formed. Subsequently, the first interlayer insulating film 155 consisted of a silicon nitride film is formed, the heat processing (heat processing at 300-550° C. for 1-12 hours) is performed, and the step in which a semiconductor layer is hydrogenated (FIG. 7 C). This step is a step in which the dangling bond of the semiconductor layer is terminated by hydrogen contained in first interlayer insulating film 155. The semiconductor layer can be hydrogenated regardless of the existence of the insulating film (not shown) consisted of a silicon oxide film. However, since in the present Example, the materials whose principal component is aluminum are used for the second electrically conductive layer, it is important that the heat processing conditions are made so that the second electrically conductive layer is endurable in the step of hydrogenation. As the other means for hydrogenation, plasma hydrogenation (hydrogen excited by plasma is used) may be performed.

Subsequently, the second interlayer insulating film 156 consisted of organic insulating material is formed on the first interlayer insulating film 155. In the present Example, an acryl resin film having film thickness of 1.6 μm is formed. Subsequently, a contact hole reaching the source wiring 131, a contact hole reaching the electrically conductive layers 129, 130 and a contact hole reaching the respective impurity regions are formed. In the present Example, several etching processes are in turn performed. In the present Example, after the second interlayer insulating film was etched by utilizing the first interlayer insulating film as an etching stopper, the insulating film (not shown) was etched following the first interlayer insulating film was etched by utilizing the insulating film (not shown). Then, the wirings and pixel electrodes are formed using Al, Ti, Mo, W and the like. It is preferable that as for these materials for electrode and pixel electrode, a film whose principal component is Al or Ag, or a material excellent in reflecting properties such as a lamination of these or the like is used. Thus, source electrodes or drain electrodes 157-162, a gate wiring 164, a connecting wiring 163, and a pixel electrode 165 are formed.

Figure 8:
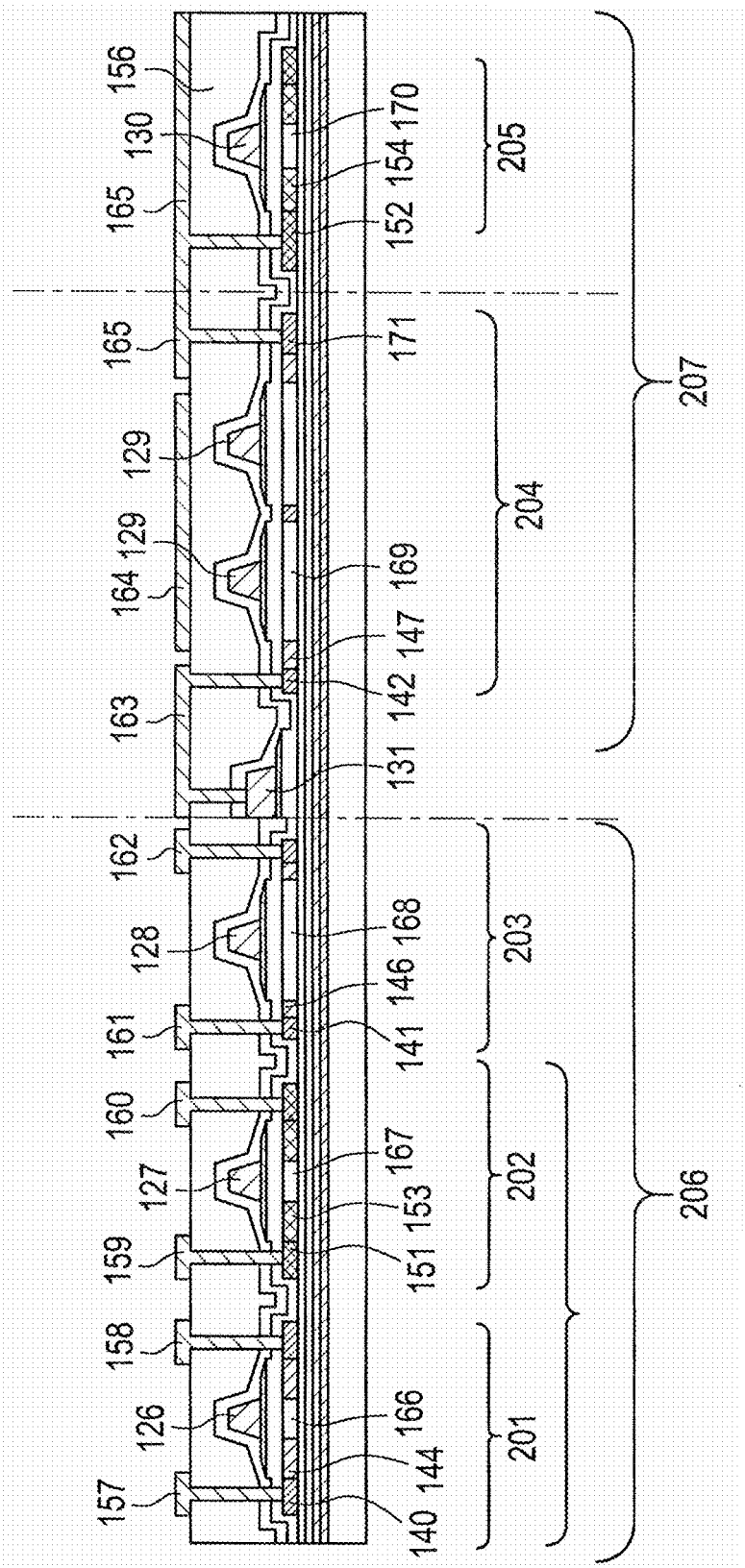
FIG. 8 is a diagram showing an active matrix substrate.
Figure 9A:
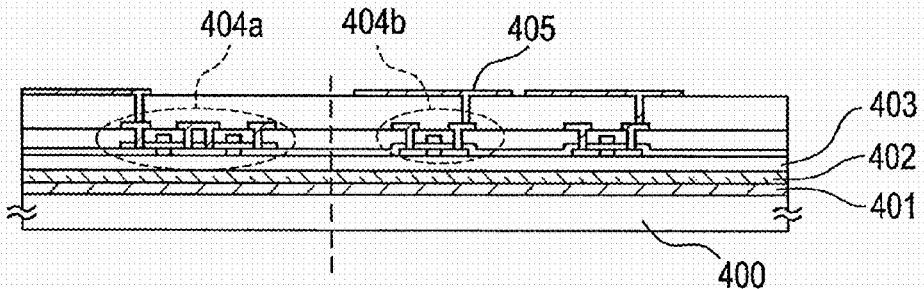
FIGS. 9A to 9D are diagrams for illustrating Example 2 of the present invention.
Figure 9B:
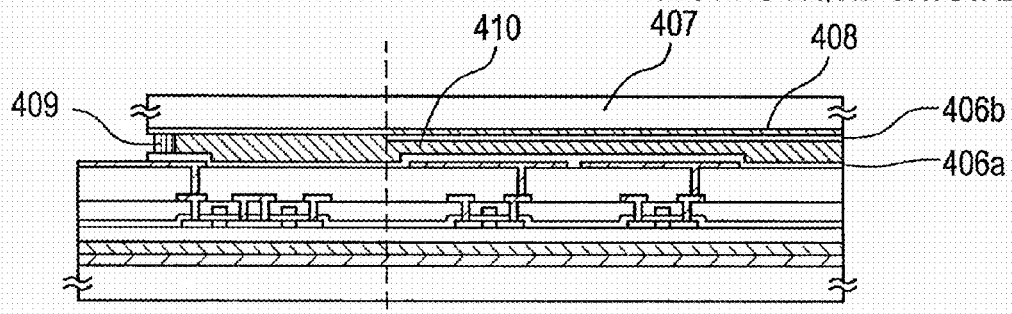
Figure 9C:
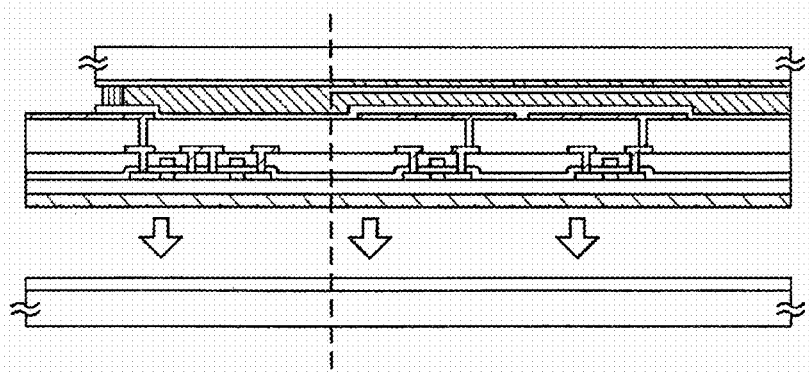
Figure 9D:
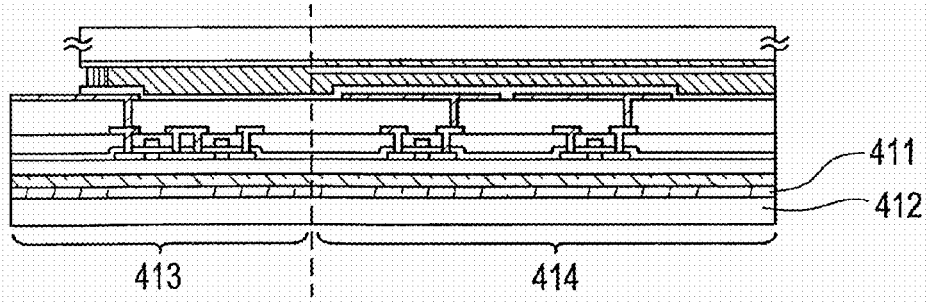

As described above, a drive circuit 206 having a n-channel type TFT 201, a p-type channel type TFT 202 and a n-type channel type TFT 203, and a pixel section 207 having a pixel TFT 204 consisted of a n-channel type TFT and a retention volume 205 can be formed on the same substrate (FIG. 8). In the present specification, such a substrate is referred to as active matrix substrate for the sake of convenience.

On the pixel section 207, the pixel TFT 204 (n-channel type TFT) has a channel formation region 169, the first impurity region (n--region) 147 formed outside of the electrically conductive layer 129 forming a gate electrode, and the second impurity regions (n+ region) 142, 171 functioning as a source region or drain region. Moreover, the fourth impurity region 152, the fifth impurity region 154 are formed on the semiconductor layer functioning as one of the electrode of the retention volume 205. The retention volume 205 is formed with the second electrode 130 and the semiconductor layers 152, 154 and 170 by utilizing the insulating film (same film with gate insulating film) as a dielectric.

Moreover, in the drive circuit 206, the n-channel type TFT 201 (first n-channel type TFT) has a channel formation region 166, the third impurity region (n-region) 144 overlapped with one portion of the electrically conductive layer 126 which forms a gate electrode via an insulating film, and the second impurity region (n+ region) 140 functioning as a source region or drain region.

Moreover, in the drive circuit 206, the p-channel type TFT 202 has a channel formation region 167, the fifth impurity region (p-region) 153 overlapped with one portion of the electrically conductive layer 127 which forms a gate electrode via an insulating film, and the fourth impurity region (p+ region) 151 functioning as a source region or drain region.

Moreover, in the drive circuit 206, the n-channel type TFT 203 (second n-channel type TFT) has a channel formation region 168, the first impurity region (n--region) 146 outside of the electrically conductive layer 128 which forms a gate electrode, and the second impurity region (n+ region) 141 functioning as a source region or drain region.

A shift register circuit, a buffer circuit, a level shifter circuit, a latch circuit and the like are formed by appropriately combining these TFTs 201-203, and the drive circuit 206 may be formed. For example, a CMOS circuit may be formed by complementarily connecting the n-channel type TFT 201 and a p-channel type TFT 202. Particularly, for a buffer circuit whose drive voltage is high, for the purpose of preventing the deterioration due to the hot carrier effect, the structure of a n-channel type TFT 203 is suitable.

Moreover, for a circuit that the reliability is considered as the top priority, the structure of a n-channel type TFT 201 which is a GOLD structure is suitable.

Moreover, since the reliability can be enhanced by enhancing the flattening of the surface of a semiconductor film, in a TFT having a GOLD structure, a sufficient reliability can be obtained also by diminishing the area of the impurity region overlapping with a gate electrode via a gate insulating film. Concretely, in a TFT having a GOLD structure, a sufficient reliability can be obtained by diminishing the size of the portion which is a tapered section of a gate electrode. Moreover, in a TFT having a GOLD structure, when the gate insulating film is thinner, the parasitic capacitance increases. However, the size of the portion which is a tapered section of the gate electrode (first electrically conductive layer) is made smaller, and the parasitic capacitance is reduced, f characteristic (frequency characteristic) is also enhanced and further a high operation is possible and the TFT obtained a sufficient reliability.

It should be noted that also in the pixel TFT of the pixel section 207, the reduction of OFF-state current and the reduction of the variation are realized by irradiation of the second laser beam.

Moreover, in the present Example, an example in which an active matrix substrate for forming a reflective type display device is prepared is shown, but when the pixel electrode is formed by a transparent electrically conductive film, although the number of photo-masks increases by one sheet, a transparent type display device can be formed.

Moreover, in the present Example, a glass substrate was used, but it is not particularly limited. A quartz substrate, a semiconductor substrate, a ceramic substrate, and a metal substrate can be used.

Moreover, after the state of FIG. 8 was obtained, if the layer (peeled off layer) containing a TFT provided on the oxide layer 102 has a sufficient mechanical strength, the substrate 100 may be pulled away. In the present Example, since the mechanical strength of the peeled-off layer is not sufficient, it is preferred that after the supporting body (not shown) for fixing the peeled-off layer was pasted, it is peeled off.

Example 2

In the present Example, the step in which an active matrix type liquid crystal display device is prepared by peeling off the substrate 100 from the active matrix substrate prepared in Example 1 and pasting it with a plastic substrate will be described below. FIG. 9 is used for the purpose of describing it.

In FIG. 9 A, the reference numeral 400 denotes a substrate, the reference numeral 401 denotes a nitride layer or metal layer, the reference numeral 402 denotes an oxide layer, the reference numeral 403 denotes a primary coat insulating layer, the reference numeral 404*a* denotes an element of a drive circuit 413, the reference numeral 404*b* denotes an element 404*b* of the pixel section 414 and the reference numeral 405 denotes a pixel electrode. Here, the term "element" is referred to a semiconductor element (typically, TFT) or MIM element or the like used for a switching element of pixels in an active matrix type liquid crystal display device. An active matrix substrate shown in FIG. 9 A is shown as simplifying the active matrix substrate shown in FIG. 8, the substrate 100 in FIG. 8 corresponds to the substrate 400 in FIG. 9 A. Similarly, the reference numeral 401 in FIG. 9 A corresponds to the reference numeral 101 in FIG. 8, the reference numeral 402 in FIG. 9 A corresponds to the reference numeral 102 in FIG. 8, the reference numeral 403 in FIG. 9 A corresponds to the reference numeral 103 in FIG. 8, the reference numeral 404*a* in FIG. 9 A corresponds to the reference numerals 201 and 202 in FIG. 8, the reference numeral 404*b* in FIG. 9 A corresponds to the reference numeral 204 in FIG. 8, and the reference numeral 405 in FIG. 9 A corresponds to the reference numeral 165 in FIG. 8, respectively.

First, according to Example 1, after the active matrix substrate of the state in FIG. 8 was obtained, an orientation film 406*a* is formed on the active matrix substrate of FIG. 8, and a rubbing processing is performed. It should be noted that in the present Example, before the orientation film is formed, a spacer in a column shape (not shown) for retaining a substrate interval was formed at the desired position by patterning an organic resin film such as an acryl resin or the like. Moreover; instead of a spacer in a column shape, a spacer in a sphere shape may be scattered over the whole surface of the substrate.

Subsequently, an opposing substrate which is to be a supporting body 407 is prepared for. A color filter (not shown) in which a colored layer and a radiation shield layer were arranged corresponding to the respective pixels has been provided on this opposing substrate. Moreover, a radiation shield was provided on the portion of the drive circuit. A flattening film (not shown) for covering this color filter and the radiation shield layer was provided. Subsequently, an opposing electrode 408 consisted of a transparent electrically conductive film was formed on the flattening film in the pixel section, an orientation film 406*b* was formed on the whole surface of the opposing substrate, and the rubbing processing was provided.

Then, an active matrix substrate 400 in which the pixel section and the drive circuit were formed and the supporting body 407 are pasted together with a sealing medium which is to be an adhesive layer 409. Into a sealing medium, filler is mixed, two sheets of substrates are pasted together with uniform interval by this filler and a spacer in a column shape. Then, between both substrates, a liquid crystal material 410 is implanted and completely sealed with a sealing compound (not shown) (FIG. 9 B). As a liquid crystal material 410, the known liquid crystal material may be used.

Subsequently, the substrate 400 on which the nitride layer or metal layer 401 has been provided is pulled away by the physical means (FIG. 9 C). Since the film stress of the oxide layer 402 and the film stress of the nitride layer or metal layer 401 are different, these can be pulled away by comparatively small force.

Subsequently, it is pasted with an adhesive layer 411 consisted of an epoxy resin or the like on a transferring body 412. In the present Example, it can be made light by using plastic film substrate for the transferring body 412.

In this way, a flexible active matrix type liquid crystal display device is completed. Then, if necessary, the flexible substrate 412 or an opposing substrate is cut down in the desired shape. Furthermore, a polarizing plate (not shown) or the like was appropriately provided using the known technology. Then, a FPC (not shown) was pasted using the known technology.

Example 3

In the Example 2, an example in which after an opposing substrate as a supporting body was pasted and a liquid crystal was implanted, the substrate was peeled off and a plastic substrate was pasted as a transferring body was shown. However, in the present Example, an example in which after an active matrix substrate shown in FIG. 8 was formed, the substrate was peeled off, and the plastic substrate as the first transferring body and the plastic substrate as the second transferring body was pasted together will be described. FIG. 10 will be used for the purpose of describing it.

In FIG. 10 A, the reference numeral 500 denotes a substrate, the reference numeral 501 denotes a nitride layer or metal layer, the reference numeral 502 denotes an oxide layer, the reference numeral 503 denotes a primary coat insulating layer, the reference numeral 504*a* denotes an element of a drive circuit 514, the reference numeral 504*b* denotes an element {504*b*?} of the pixel section 515 and the reference numeral 505 denotes a pixel electrode. An active matrix substrate shown in FIG. 10 A is shown as one simplifying the active matrix substrate shown in FIG. 8, the substrate 100 in FIG. 8 corresponds to the substrate 500 in FIG. 10 A. Similarly, the reference numeral 501 in FIG. 10 A corresponds to the reference numeral 101 in FIG. 8, the reference numeral 502 in FIG. 10 A corresponds to the reference numeral 102 in FIG. 8, the reference numeral 503 in FIG. 10 A corresponds to the reference numeral 103 in FIG. 8, the reference numeral 504*a* in FIG. 10 A corresponds to the reference numerals 201 and 202 in FIG. 8, the reference numeral 504*b* in FIG. 10 A corresponds to the reference numeral 204 in FIG. 8, and the reference numeral 505 in FIG. 10 A corresponds to the reference numeral 165 in FIG. 8, respectively.

First, according to Example 1, after an active matrix substrate in the state of FIG. 8 was obtained, the substrate 500 on which the nitride layer or metal layer 501 has been provided is pulled away by the physical means (FIG. 10 B). Since the film stress of the oxide layer 502 and the film stress of the nitride layer or metal layer 501 are different, these can be pulled away by a comparatively small force.

Figure 10A:
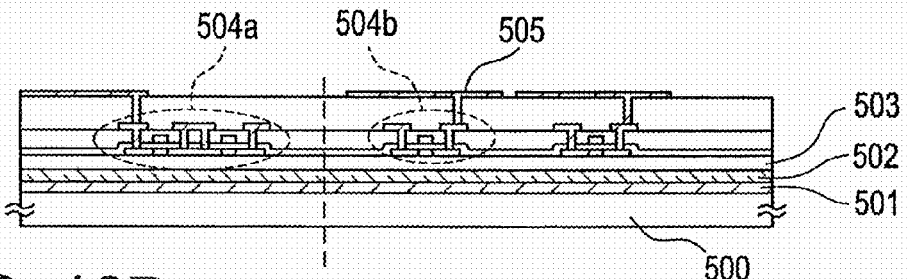
FIGS. 10A to 10E are diagrams for illustrating Example 3 of the present invention.
Figure 10B:
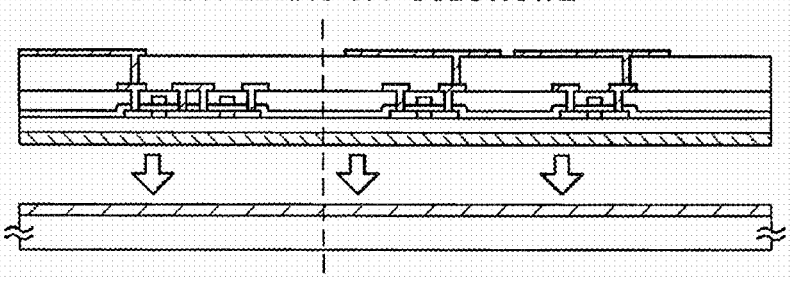
Figure 10C:
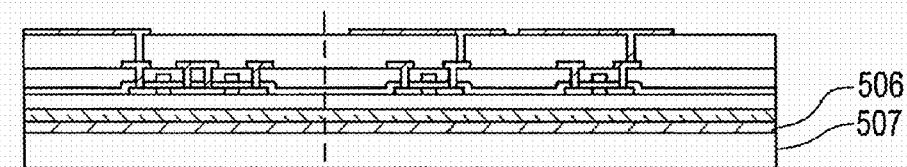
Figure 10D:
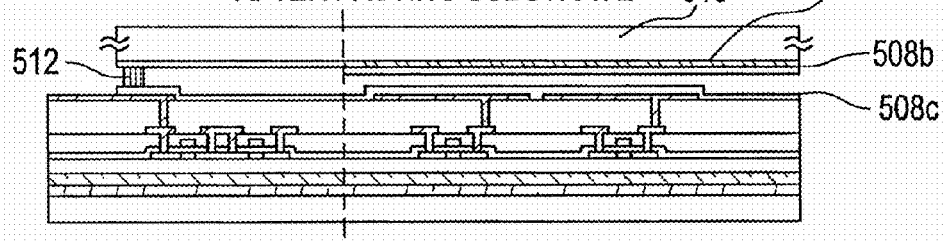
Figure 10E:
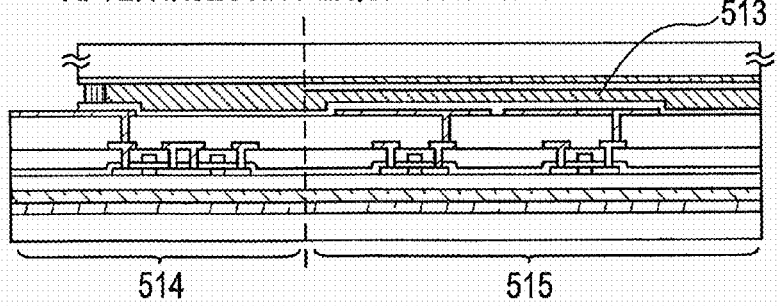

Subsequently, it is pasted with an adhesive layer 506 consisted of an epoxy resin or the like on a transferring body 507 (first transferring body). In the present Example, it can be made light by using plastic film substrate for the transferring body 507 (FIG. 10C). Subsequently, an orientation film 508*a* is formed and a rubbing processing is performed. It should be noted that in the present Example, before the orientation film is formed, a spacer in a column shape (not shown) for retaining a substrate interval was formed at the desired position by patterning an organic resin film such as an acryl resin or the like. Moreover, instead of a spacer in a column shape, a spacer in a sphere shape may be scattered over the whole surface of the substrate. Subsequently, an opposing substrate which is to be a supporting body 510 (second transferring body) is prepared for. A color filter (not shown) in which a colored layer and a radiation shield layer were arranged corresponding to the respective pixels has been provided on this opposing substrate. Moreover, a radiation shield was provided on the portion of the drive circuit. A flattening film (not shown) for covering this color filter and the radiation shield layer was provided. Subsequently, an opposing electrode 509 consisted of a transparent electrically conductive film was formed on the flattening film in the pixel section, an orientation film 508 *b* was formed on the whole surface of the opposing substrate, and the rubbing processing was provided.

Then, a plastic film substrate 507 in which the pixel section and the drive circuit were adhered and the supporting body 510 are pasted together with a sealing medium which is to be an adhesive layer 512 (FIG. 10 D). Filler is mixed into sealing medium, and two sheets of substrates are pasted together with uniform interval by this filler and a spacer in a column shape. Then, between both substrates, a liquid crystal material 513 is implanted and completely sealed with a sealing compound (not shown) (FIG. 10 D). As a liquid crystal material 513, the known liquid crystal material may be used.

In this way, a flexible active matrix type liquid crystal display device is completed. Then, if necessary, the flexible substrate 507 or an opposing substrate is cut in the desired shape. Furthermore, a polarizing plate (not shown) or the like was appropriately provided using the known technology. Then, a FPC (not shown) was pasted using the known technology.

Example 4

Figure 11:
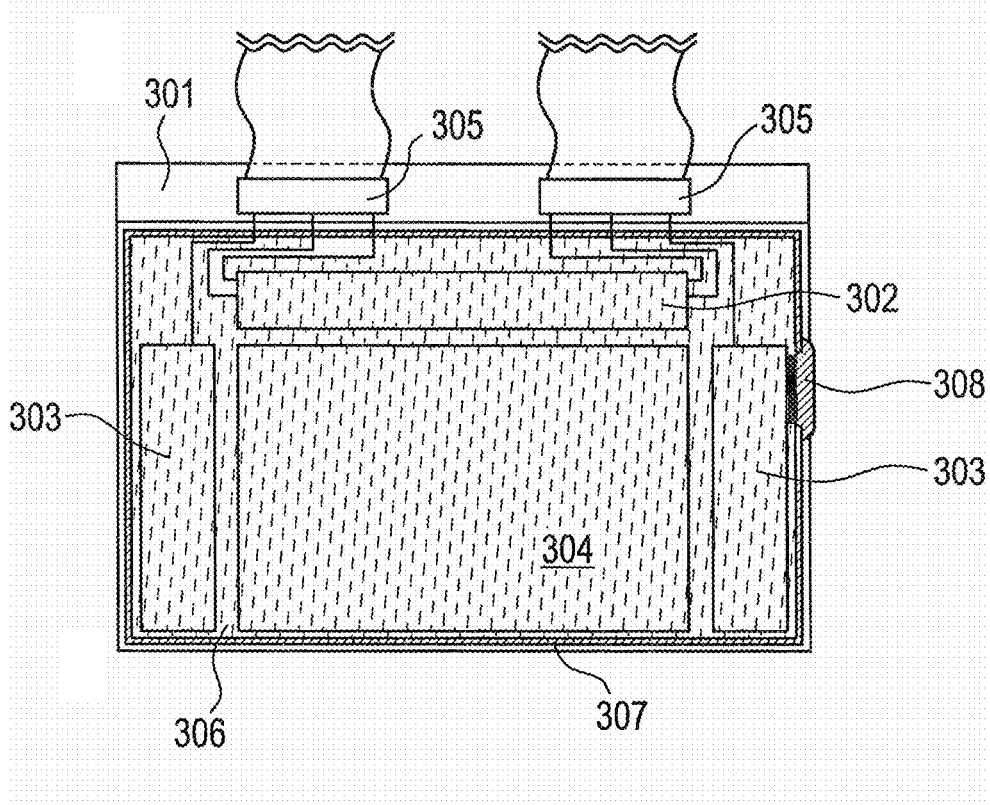
FIG. 11 is a diagram for illustrating Example 4 of the present invention.

The structure of the liquid crystal module obtained by Example 2 or Example 3 is described with reference 2 to the top view in FIG. 11. A substrate 412 in Example or a substrate 507 in Example 3 corresponds to a substrate 301.

A pixel portion 304 is placed in the center of a substrate 301. A source signal line driving circuit 302 for driving source signal lines is positioned above the pixel portion 304. Gate signal line driving circuits 303 for driving gate signal lines are placed to the left and right of the pixel portion 304. Although the gate signal line driving circuits 303 are symmetrical with respect to the pixel portion in this Example, the liquid crystal module may have only one gate signal line driving circuit on one side of the pixel portion. Of the above two options, a designer can choose the arrangement that suits better considering the substrate size or the like of the liquid crystal module. However, the symmetrical arrangement of the gate signal line driving circuits shown in FIG. 11 is preferred in terms of circuit operation reliability, driving efficiency, and the like.

Signals are inputted to the driving circuits from flexible printed circuits (FPC) 305. The FPCs 305 are press-fit through an anisotropic conductive film or the like after opening contact holes in the interlayer insulating film and resin film and forming a connection electrode 309 so as to reach the wiring lines arranged in given places of the substrate 301. The connection electrode is formed from ITO in this Example.

A sealing agent 307 is applied to the substrate along its perimeter surrounding the driving circuits and the pixel portion. An opposite substrate 306 is bonded to the substrate 301 by the sealing agent 307 while a spacer formed in advance on the film substrate keeps the distance between the two substrates constant. A liquid crystal element is injected through an area of the substrate that is not coated with the sealing agent 307. The substrates are then sealed by an encapsulant 308. The liquid crystal module is completed through the above steps.

Although all of the driving circuits are formed on the film substrate in the example shown here, several ICs may be used for some of the driving circuits.

This Example may be combined with Example 1.

Example 5

Example 1 shows an example of reflective display device in which a pixel electrode is formed from a reflective metal material. Shown in this Example is an example of transmissive display device in which a pixel electrode is formed from alight-transmitting conductive film.

The manufacture process up through the step of forming an interlayer insulating film is identical with the process of Example 1, and the description thereof is omitted here. After the interlayer insulating film is formed in accordance with Example 1, a pixel electrode 601 is formed from a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time the connection electrode is formed, source electrodes or drain electrodes of other TFTs are formed.

Although all of the driving circuits are formed on the substrate in the example shown here, several ICs may be used for some of the driving circuits.

Figure 12:
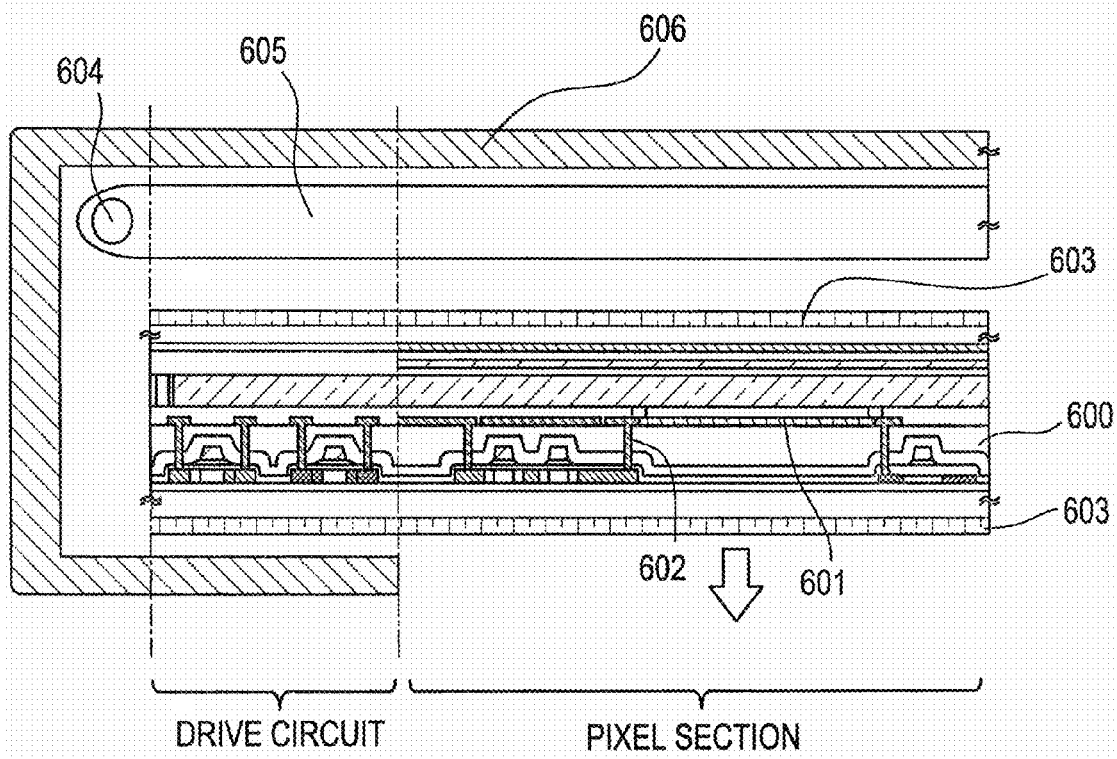
FIG. 12 is a diagram for illustrating Example 5 of the present invention.
Figure 13A:
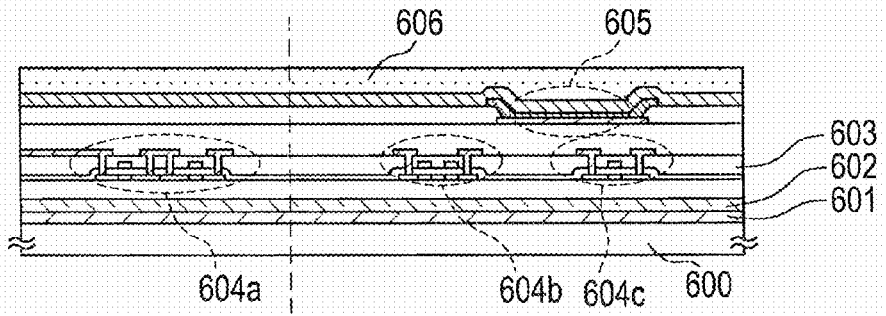
FIGS. 13A to 13D are diagrams for illustrating Example 6 of the present invention.
Figure 13B:
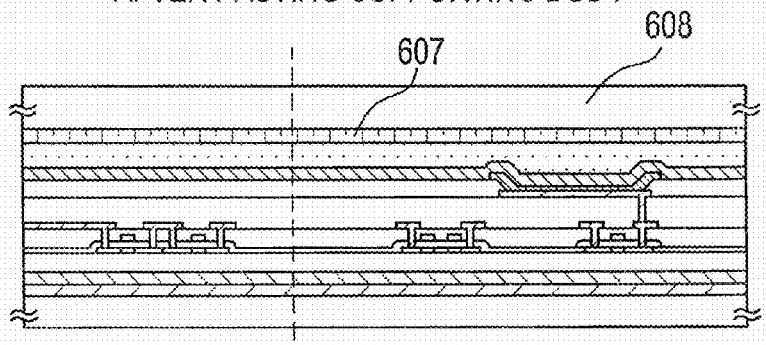
Figure 13C:
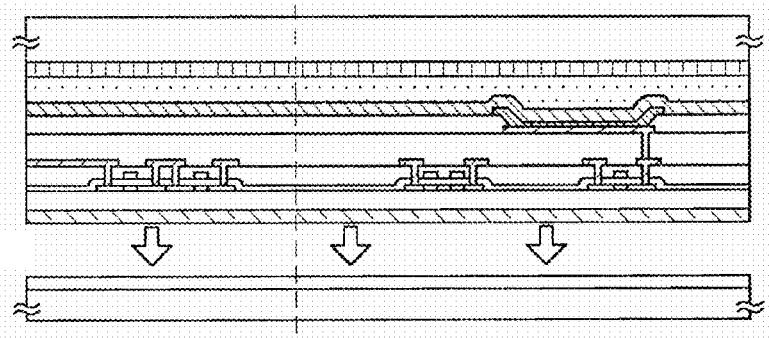
Figure 13D:
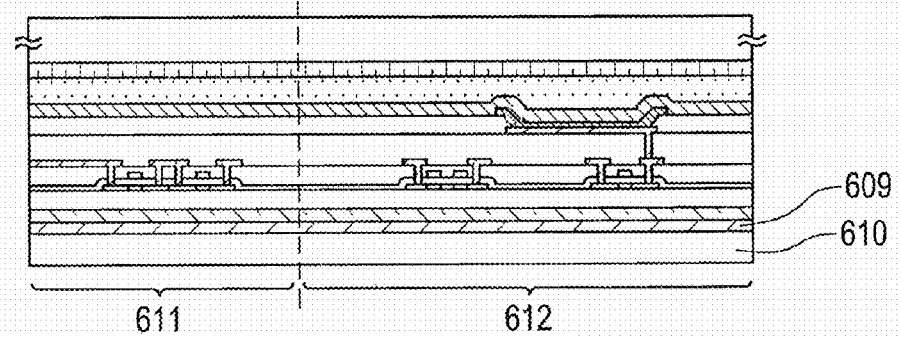

An active matrix substrate is completed as above. After peeling the substrate by using this active matrix substrate to bond plastic substrates, a liquid crystal module is manufactured in accordance with Examples 2 to 4. The liquid crystal module is provided with a backlight 604 and a light guiding plate 605, and is covered with a cover 606 to complete the active matrix liquid crystal display device of which a partial sectional view is shown in FIG. 12. The cover is bonded to the liquid crystal module using an adhesive or an organic resin. When bonding the plastic substrate to the opposite substrate, the substrates may be framed so that the space between the frame and the substrates is filled with an organic resin for bonding. Since the display device is of transmissive type, the plastic substrate and the opposite substrate each needs a polarizing plate 603 to be bonded.

This Example may be combined with Examples 1 to 4.

Example 6

In the present Example, an example in which a light emitting device having an organic light emitting device (OLED) formed on a plastic substrate is prepared is shown in FIG. 13.

In FIG. 13 A, the reference numeral 600 denotes a substrate, the reference numeral 601 denotes a nitride layer or metal layer, the reference numeral 602 denotes an oxide layer, the reference numeral 603 denotes a primary coat insulating layer, the reference numeral 604a denotes an element of a drive circuit 611, the reference numeral 604b and 604c denote an element {504b?} of the pixel section 612 and the reference numeral 605 denotes an OLED (Organic Light Emitting Device). Here, the term "element" is referred to a semiconductor element (typically, TFT) or MIM element or the like used for a switching element of pixels if it is an active matrix type liquid crystal display device. Then, an interlayer insulating film 606 which covers these elements is formed. It is preferred that the interlayer insulating film 606 is flatter than the surface after the film formation. It should be noted that the interlayer insulating film 606 is not necessarily provided.

It should be noted that the reference numerals 601-603 provided on the substrate 600 may be formed according to Embodiment 2 through 4.

These elements (including 604a, 604b and 604c) may be prepared according to the n-channel type TFT 201 of the above-described Example 1 and/or the p-channel type TFT 202 of the above-described Example 1.

An OLED 605 has a layer containing an organic compound (organic light emitting material) obtaining electroluminescence generating by adding electric field (hereinafter, referred to as organic light emitting layer), an anode layer and a cathode layer. Although as for electroluminescence in organic compounds, there are a luminescence (fluorescence) generated when returning from singlet excitation state to ground state and a luminescence (phosphorescence) generated when returning from triplet state to ground state, a light emitting device of the present invention may use either of the above-described luminescences or both the above-described luminescences. It should be noted that in the present specification, all of the layers formed between the anode and cathode of OLED are defined as an organic light emitting layer. Concretely, organic light emitting layers include a light emitting layer, a hole injection layer, an electronic injection layer, a hole transport layer, an electron transport layer or the like. Fundamentally, OLED has a structure in which anode/light emitting layer/cathode are in turn laminated in addition to this structure, there may be also some structures having anode/hole injection layer/light emitting layer/cathode or anode/hole injection layer/light emitting layer/electron transport layer/cathode or the like are in turn laminated. According to the above-described method, the state of FIG. 13 A was obtained, the supporting body 608 is pasted using the adhesive layer 607 (FIG. 13 B). In the present Embodiment, a plastic substrate is used as the supporting body 608. Concretely, as a supporting body, a resin substrate having thickness of 10 μm or more, for example, poly(ether sulfone) (PES), polycarbonate (PC), polyethylene terephthalate (PET), or polyethylene naphthalate (PEN) can be used. It should be noted that it is required when the supporting body 608 and the adhesive layer 607 are located at the observer's side (on the side of the user of the light emitting device) seen from the OLED, the supporting body 608 and the adhesive layer 607 are materials which transmits the light.

Subsequently, the substrate 600 on which the nitride layer or metal layer 601 has been provided is pulled away by the physical means (FIG. 13 C). Since the film stress of the oxide layer 602 and the film stress of the nitride layer or metal layer 601 are different, these can be pulled away by a comparatively small force. Subsequently, it is pasted with an adhesive layer 609 consisted of an epoxy resin or the like on a transferring body 610 (FIG. 13 D). In the present Example, it can be made light by using plastic film substrate for the transferring body 610.

In this way, a flexible light emitting device sandwiched between the supporting body 608 having the flexibility and the transferring body 610 having the flexibility can be obtained. It should be noted that if the supporting body 608 and the transferring body 610 are made of the same material, the coefficients of thermal expansion become equal, therefore, the influence from the stress distortion due to the change of temperature can be made not easily exerted.

Then, if necessary, the supporting body 608 having the flexibility and the transferring body 610 are cut in the desired shape. Then, a FPC (not shown) was pasted using the known technology.

Example 7

In Example 6, an example in which after the supporting body was pasted, the substrate was peeled off and a plastic substrate as a transferring body was pasted has been shown. However, in the present Example, an example in which after the substrate was peeled off, a plastic substrate as the first transferring body and a plastic substrate as the second transferring body are pasted and a light emitting device equipped with an OLED is prepared will be shown. FIG. 14 will be made reference for the purpose of describing it.

Figure 14A:
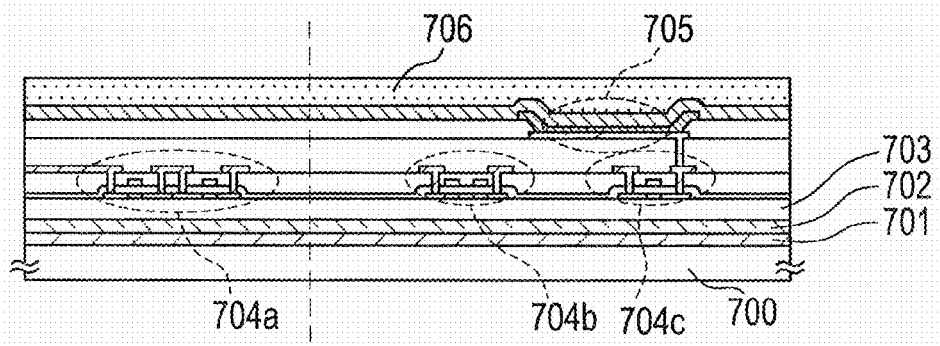
FIGS. 14A to 14C are diagrams for illustrating Example 7 of the present invention.
Figure 14B:
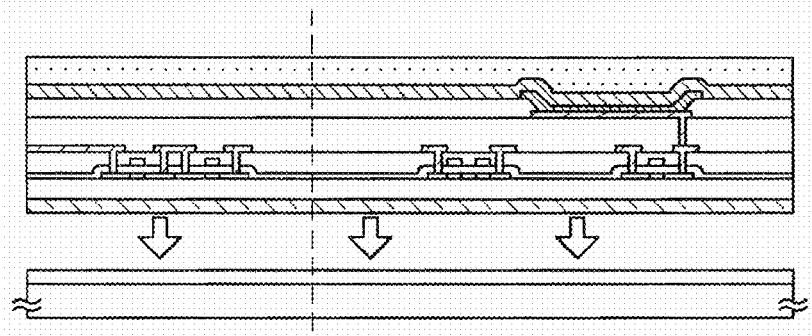
Figure 14C:
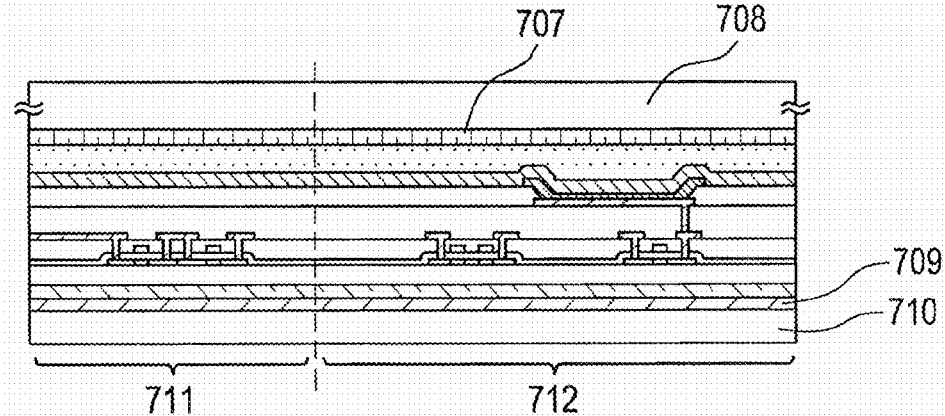

In FIG. 14A, the reference numeral 700 denotes a substrate, the reference numeral 701 denotes a nitride layer or metal layer, the reference numeral 702 denotes an oxide layer, the reference numeral 703 denotes a primary coat insulating layer, the reference numeral 704a denotes an element of a drive circuit 711, the reference numerals 704b, 704c denote an element of the pixel section 712 and the reference numeral 705 denotes an OLED (Organic Light Emitting Device). Here, the term "element" is referred to a semiconductor element (typically, TFT) or MIM element or the like used for a switching element of pixels if it is an active matrix type liquid crystal display device. Then, an interlayer insulating film 706 which covers these elements is formed. It is preferred that the interlayer insulating film 706 is flatter than the surface after the film formation. It should be noted that the interlayer insulating film 706 is not necessarily provided.

It should be noted that the reference numerals 701-703 provided on the substrate 700 might be formed according to any of Embodiment 2 through 4.

These elements (including 704a, 704b and 704c) may be prepared according to the n-channel type TFT 201 of the above-described Example 1, the p-channel type TFT 202 of the above-described Example 1.

According to the above-described method, the state of FIG. 14 A was obtained, the substrate 700 on which the nitride layer or metal layer 701 has been provided is pulled away by the physical means (FIG. 14 B). Since the film stress of the oxide layer 702 and the film stress of the nitride layer or metal layer 701 are different, these can be pulled away by comparatively small force. Subsequently, it is pasted with an adhesive layer 709 consisted of an epoxy resin or the like on a transferring body (first transferring body) 710. In the present Example, it can be made light by using plastic film substrate for the transferring body 710.

Subsequently, the base member (second transferring body) 708 is pasted together by the adhesive layer 707 (FIG. 14 C) In the present Embodiment, a plastic substrate is used as the supporting body 708. Concretely, as the transferring body 710 and the base member 708, a resin substrate having thickness of 10 μm or more, for example, poly(ether sulfone) (PES), polycarbonate (PC), polyethylene terephthalate (PET), or polyethylene naphthalate (PEN) can be used. It should be noted that it is required in the case where the base member 708 and the adhesive layer 707 are located at the observer's side (on the side of the user of the light emitting device) seen from the OLED, the base member 708 and the adhesive layer 707 are materials which transmit the light.

In this way, a flexible light emitting device sandwiched between the base member 708 having the flexibility and the transferring body 710 having the flexibility can be obtained. It should be noted that if the base member 708 and the transferring body 710 are made of the same material, the coefficients of thermal expansion become equal, therefore, the influence from the stress distortion due to the change of temperature can be made not easily exerted.

Then, if necessary, the base member 708 having the flexibility and the transferring body 710 are cut in the desired shape. Then, a FPC (not shown) was pasted using the known technology.

Example 8

In Example 6 or Example 7, an example in which a flexible light emitting device sandwiched between substrates having the flexibility is obtained has been shown. However, since a substrate consisted of a plastic in general easily transmits water content and oxygen, and the deterioration of an organic light emitting layer is promoted by these, the life-span of the light emitting device easily tends to be shorter.

Hence, in the present Example, on a plastic substrate, a plurality of films for preventing oxygen and water content from penetrating into the organic light emitting layer of OLED (hereinafter, referred to as barrier film) and a layer (stress relaxation film) having a smaller stress than the foregoing barrier film between the foregoing barrier films each other are provided. In the present specification, a film in which a barrier film and a stress relaxation film are laminated is referred to as "sealing film".

Concretely, two or more layers of barrier films consisted of inorganic matters (hereinafter, referred to as barrier film) are provided, and further, a stress relaxation film having a resin between the relevant two-layer barrier films (hereinafter, referred to as stress relaxation film) is provided. Then, a light emitting device is formed by forming an OLED on the relevant three or more-layer insulating film and tightly sealing. It should be noted that since Example 6 and Example 7 are the same except for the substrate, here, the description on them is omitted.

As shown in FIG. 15, two or more layers of barrier films are provided on the film substrate 810, and further, a stress relaxation film is provided between the relevant two-layer barrier films. As a result, between the film substrate 810 and the second adhesive layer 809, a sealing film in which the relevant barrier film and the stress relaxation film are laminated is formed.

Here, a layer consisted of a silicon nitride is film-formed as a barrier film 811a on the film substrate 810 by a sputtering method, a stress relaxation film 811b having polyimide is film-formed on the barrier film 811a, a layer consisted of a silicon nitride is film-formed as the barrier film 811c on the stress relaxation film 811b by a sputtering method. A layer in which the barrier film 811a, the stress relaxation film 811b, and the barrier film 811c are laminated is generally referred to as the sealing film 811. Then the film substrate 810 on which the relevant sealing film 811 is formed may be pasted together using the second adhesive layer 809 on the peeled layer containing an element.

Similarly, a layer consisted of a silicon nitride is formed as a barrier film 814a on the film substrate 812 by a sputtering method, and a stress relaxation film 814b having polyimide is formed on the barrier film 814a. A layer consisted of a silicon nitride is formed as the barrier film 814c on the stress relaxation film 814b by a sputtering method. A layer in which the barrier film 814a, the stress relaxation film 814b, and the barrier film 814c are laminated is generally referred to as the sealing film 814. Then the film substrate 812 on which the relevant sealing film 814 is formed may be pasted together using the second adhesive layer 809 on the peeled layer containing an element.

It should be noted that as for a barrier film, if two layers or more are provided, it might be available. Then, as a barrier film, a silicon nitride, a silicon oxynitride, an aluminum oxide, an aluminum nitride, an aluminum oxynitride or an aluminum silicide oxynitride (AlSiON) can be used.

Since an aluminum silicide oxynitride is comparatively high in thermal conductivity, the heat generated in an element can be efficiently discharged by utilizing it as a barrier film.

Moreover, for a stress relaxation film, a resin having a transparency can be used. Representatively, polyimide, acryl, polyamide, polyimideamide, benzocyclobutene, epoxy resin or the like is capable of being used. It should be noted that resins except for resins described above could be also used. Here, after polyimide which is a type thermally polymerized was coated, it is burned and formed.

The film formation of a silicon nitride is performed at 0.4 Pa of sputtering pressure by introducing argon, maintaining the substrate temperature as 150° C. Then, using a silicon as a target, the film formation was performed by introducing nitrogen and hydrogen except for argon. In the case of a silicon oxynitride, the film formation is performed at about 0.4 Pa of sputtering pressure by introducing argon and maintaining the substrate temperature as 150° C. Then, using a silicon as a target, the film formation was performed by introducing nitrogen, nitrogen dioxide and hydrogen except for argon. It should be noted that as a target, a silicon oxide might be used.

It is desirable that the film thickness of the barrier film is in the range from 50 nm to 3 μm. Here, a silicon nitride was formed in film thickness of It should be noted that the film formation method of a barrier film is not limited only to sputtering method, the person who carries out it can appropriately set its method. For example, the film formation may be performed using a LPCVD method, a plasma CVD method or the like. Moreover, it is desirable that the film thickness of the stress relaxation film is in the range from 200 nm to 2 μm. Here, polyimide was formed in film thickness of 1 μm.

An OLED can be completely interrupted from the air by applying a plastic substrate on which a sealing film of the present Example is provided as the supporting body 608 or the transferring body 610 in Example 6 or the base member 708 or the transferring body 710 in Example 7, thereby capable of nearly completely suppressing the deterioration of an organic light emitting material due to oxidation, and capable of largely enhancing the reliability of an OLED.

Example 9

The constitution of a module having an OLED obtained according to Example 6 or Example 7, what is called the constitution of an EL module will be described below with reference to a top view of FIG. 16. The transferring body 610 in Example 7 or the transferring body 710 in Example 8 corresponds to the film substrate 900.

Figure 16A:
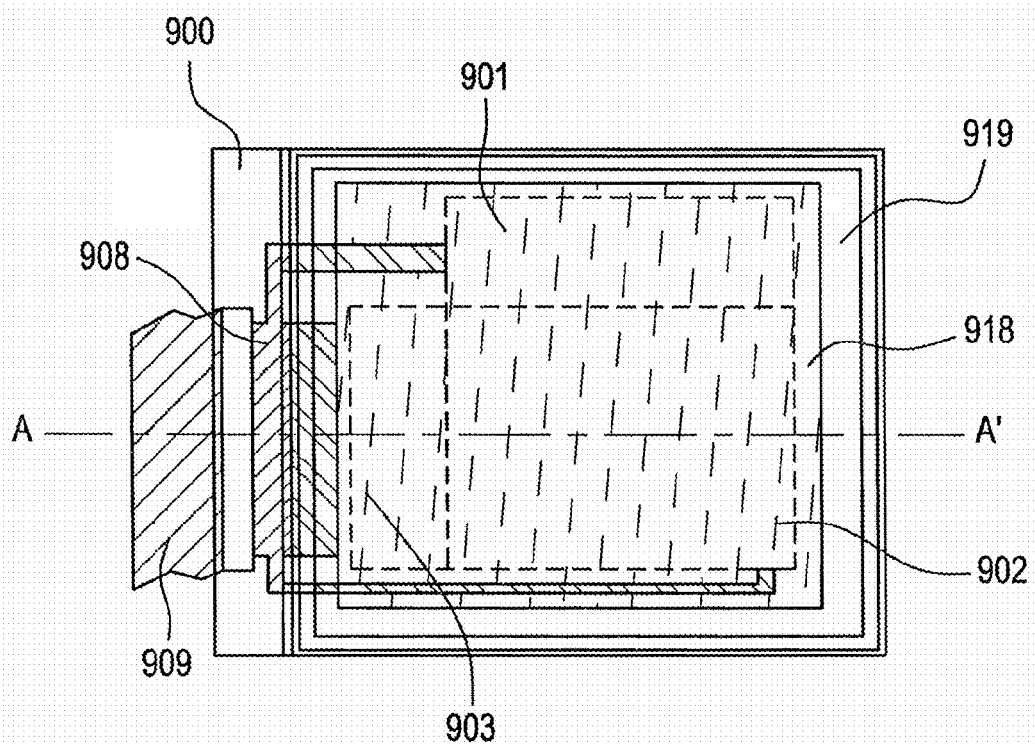
FIGS. 16A and 16B are diagrams for illustrating Example 9 of the present invention.
Figure 16B:
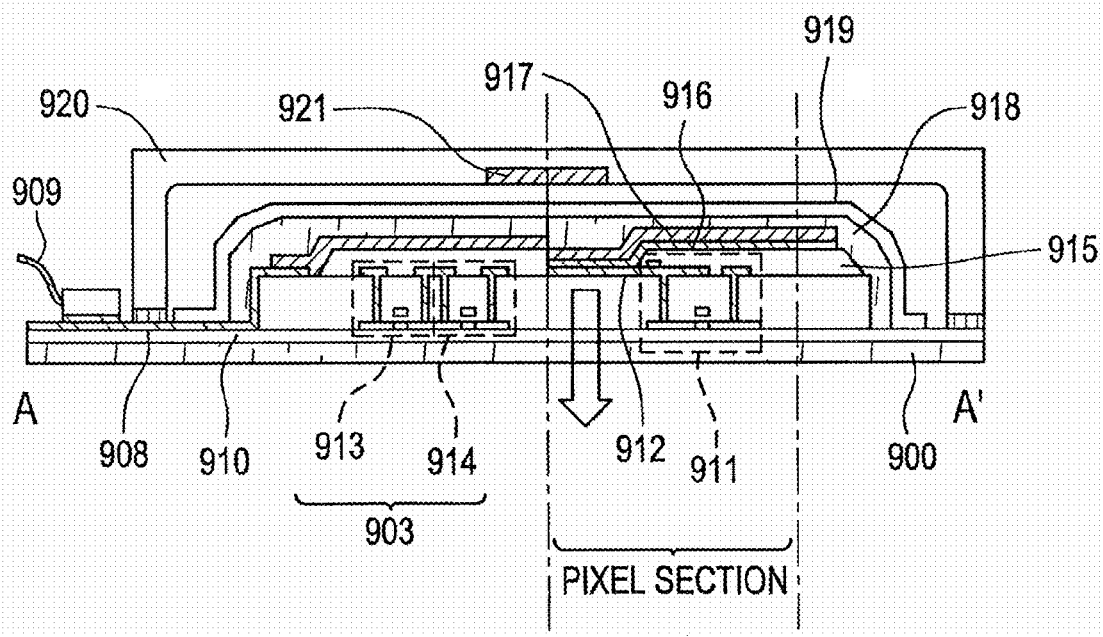

FIG. 16 A is atop view showing a module having an OLED, what is called an EL module, and FIG. 16 B is a sectional view taken on line A-A' of FIG. 16 A. A pixel section 902, the source side drive circuit 901 and the gate side drive circuit 903 are formed on a film substrate 900 (for example, plastic substrate or the like) having the flexibility. These pixel section and drive circuit can be obtained according to the above-described Example. Moreover, the reference numeral 918 denotes a sealing member, the reference numeral 919 denotes a DLC film, the pixel section and the drive circuit section are covered by the sealing member 918, and its sealing member is covered with the protective film 919. Furthermore, it is sealed with a cover member 920 using an adhesive member. The shape of the covering member 920 and the shape of the supporting body are not particularly limited, one having a plane, one having a curved surface, and one having a property capable of being curved, or one in a film shape may be used. It is desirable that the covering member 920 for enduring the distortion due to the heat and external force is the same material with the film substrate 900, for example, a plastic substrate is used, the substrate processed in a concave section shape (depth, 3-10

μm) as shown in FIG. 16 is used. It is desirable that it is further processed, and a concave section (depth, 50-200 μm) on which desiccant 921 can be set is formed. Moreover, in the case where an EL module is fabricated in multiple pattern, after the substrate and the covering member were pasted together, it may be cut so that the end faces are matched with each other using $Co_2$ laser or the like.

Moreover, here not shown in Figs., in order to prevent the background from being reflected due to the reflection of the applied metal layer (here, cathode or the like), a circular polarizing means referred to as a circular polarizing plate consisted of a phase difference plate (λ/4 plate) and polarizing plate may be provided on the substrate 900.

It should be noted that the reference numeral 908 denotes a wiring for transmitting a signal inputted into the source side drive circuit 901 and the gate side drive circuit 903, it receives a video signal and a clock signal from FPC (Flexible Print Circuit) which is an external input terminal. Moreover, a light emitting device of the present Example may be of a digital drive, or an analog drive, or a video signal may be a digital signal, or an analog signal. It should be noted that here, only FPC is shown in Figs., but a print wiring base (PWB) may be mounted on this FPC. It is defined that a light emitting device in the present specification includes not only the main body of the light emitting device but also the state where FPC or PWB is mounted on the main body. Moreover, although a complex integrated circuit (memory, CPU, controller, D/A converter or the like) are capable of being formed on the same substrate with these pixel section and drive circuit, the fabrication with a small number of masks is difficult. Therefore, it is preferred that an IC chip equipped with a memory, a CPU, a controller, a D/A convert er or the like is mounted by COG (Chip On Glass) method, or TAB (Tape Automated Bonding) method or a wire bonding method.

Next, the sectional structure will be described below with reference to FIG. 16 B. An insulating film 910 is provided on the film substrate 900, the pixel section 902 and the gate side drive circuit 903 have been formed above the insulating film 910, and the pixel section 902 is formed by a plurality of pixels containing the pixel electrode 912 electrically connected to the TFT 911 for controlling the current and its drain. It should be noted that after the peeled off layer formed on the substrate was peeled off according to any one of Embodiment 1 through 4, the film substrate 900 is pasted.

Moreover, the gate side drive circuit 903 is formed using a CMOS circuit that a n-channel type TFT 913 and a p-channel type TFT 914 are combined.

These TFTs (including 911, 913 and 914) may be fabricated according to the n-channel type TFT 201 of the above-described Example 1, the p-channel type TFT 202 of the above-described Example 1.

It should be noted that as an insulating film provided between the TFT and OLED, it is preferable that a material for not only blocking the diffusion of the impurity ion such as alkali metal ion, alkaline earth metal ion or the like, but also aggressively absorbing the impurity ion such as alkali metal ion, alkaline earth metal ion or the like, and further, a material endurable for the temperature of later processes is suitable. As a material suitable for these conditions, as one example, a silicon nitride film containing a large amount of fluorine is listed. The fluorine density containing in the film of the silicon nitride film is $1 \times 10^{19}/cm^3$ or more, preferably, the composition ratio of fluorine is made in the range from 1 to 5%. The fluorine in the silicon nitride film is bonded to alkali metal ion, alkaline earth ion or the like, and absorbed in the film. Moreover, as the other example, an organic resin film containing a fine particle consisted of antimony (Sb) compound, tin (Sn) compound or indium (In) compound, for example, an organic resin film containing antimony pentaoxide fine particle ($Sb_2O_5.nH_2O$) is also listed. It should be noted that this organic resin film contains a fine particle having 10-20 nm in average particle diameter, and light transmittance is also very high. An antimony compound represented by this antimony pentaoxide fine particle easily absorbs impurity ion such as alkali metal ion or alkaline earth metal ion.

Moreover, as the other material of an insulating film provided between the active layer of TFT and the OLED, a layer indicated by $AlN_xO_y$ may be used. An oxynitride layer (layer indicated by $AlN_xO_y$) obtained by performing the film formation under the atmosphere that argon gas, nitride gas, nitrogen gas and oxygen gas are mixed using aluminum nitride (AlN) target by a sputtering method is a film containing nitrogen in the range from 2.5 atm % to 47.5 atm %, characterized by the fact that it has an effect capable of blocking water content and oxygen, in addition to this, has a high thermal conductivity and an effect of heat release, and further, has a very high translucency. In addition, it can prevent impurities such as alkali metal, alkaline earth metal or the like from penetrating into the active layer of TFT.

The pixel electrode 912 functions as an anode of the OLED. Moreover, a bank 915 is formed on both ends of the pixel electrode 912, an EL layer 916 and a cathode 917 of the light emitting element are formed on the pixel electrode 912.

As the EL layer 916, an EL layer (layer for light emitting and making carrier perform the migrate for it) may be formed by freely combining the light emitting layer, a charge injection layer or a charge implantation layer. For example, low molecular system organic EL material and high molecular system organic EL material may be employed. Moreover, as an EL layer, a thin film consisted of a light emitting material (singlet compound) which light-emits (fluorescence) due to singlet excitation, or a thin film consisted of a light emitting material (triplet compound) which emits (phosphorescence) due to triplet excitation can be used. Moreover, an inorganic material such as silicon carbide or the like is capable of being used as a charge transport layer and a charge injection layer. For these organic EL material and inorganic material, the known materials can be used. The cathode 917 also functions the wiring common to the all of the pixels, and electrically connected to the FPC 909 via the connecting wiring 908. And further, elements contained in the pixel section 902 and on the gate side drive circuit 903 are all covered by the cathode 917, the sealing member 918, and the protective film 919.

It should be noted that as, the sealing member 918, it is preferable that a material being transparent to the visible light or semitransparent is used if it is possible. Moreover, it is desirable that the sealing member 918 is a material for transmitting water content and oxygen as little as possible.

Moreover, after the light emitting element was completely covered by utilizing the sealing member 918, it is preferred that the protective film 919 consisted of at least DLC film or the like is provided on the surface (exposed surface) of the sealing member 918 as shown in FIG. 16. Moreover, the protective film may be provided on the entire surface including the back side of the substrate. Here, it is necessary to note so that the protective film is not formed on the portion on which the external input terminal (FPC) is provided. It may be made so that the protective film is not formed by utilizing a mask, or it may be made so that the protective film is not formed by covering the exterior input terminal portion with a tape such as a masking tape used in a CVD device.

The light emitting element can be completely interrupted from the external by sealing the light emitting element with the sealing member 918 and the protective film in the above-described structure, and it can prevent the substances promoting the deterioration due to the oxidation of EL layer occurred by water content, oxygen or the like from the external from penetrating. In addition to this, if a film having a thermal conductivity (AlON film, AlN film or the like) is used as a protective film, the heat generated when it is driven can be released. Therefore, a light emitting device with high reliability can be obtained.

Moreover, the pixel electrode is made a cathode, the EL layer and the anode are laminated and it may be configured so that the light is emitted in the reverse direction. Its one example is shown in FIG. 17. It should be noted that since a top view is the same, the diagram and description are omitted.

The sectional structure shown in FIG. 17 will be described below. As a film substrate 1000, a plastic substrate is used. It should be noted that after the peeled off layer formed on the substrate was peeled off according to any one of Embodiment 1 through 4, the film substrate 1000 is pasted. An insulating film 1010 is provided on the film substrate 1000, above the insulating film 1010, the pixel section 1002 and the gate side drive circuit 1003 are formed and the pixel section 1002 is formed by a plurality of pixels containing a pixel electrode 1012 electrically connected to a TFT for controlling the current 1011 and its drain. Moreover, the gate side drive circuit 1003 is formed using a CMOS circuit that a n-channel type TFT 1013 and a p-channel type TFT 1014 are combined.

The pixel electrode 1012 functions as a cathode of the light emitting element. Moreover, a bank 1015 is formed on both ends of the pixel electrode 1012, an EL layer 1016 and an anode 1017 of the light emitting element are formed on the pixel electrode 1012.

The anode 1017 also functions as the common wiring to all of the pixels, and electrically connected to the FPC 1009 via a connecting wiring 1008. Furthermore, the element contained in the pixel section 1002 and the gate side drive circuit 1003 are all covered by the protective film 1019 consisted of the anode 1017, the sealing member 1018 and DLC or the like. Moreover, the covering member 1021 and the substrate 1000 were pasted using the adhesive. Moreover, the concave portion is provided on the covering member, and the desiccant 1021 is set on the covering member.

It should be noted that as the sealing member 1018, it is preferable that a material being transparent to the visible light or semitransparent is used if it is possible. Moreover, it is desirable that the sealing member 1018 is a material for transmitting water content and oxygen as little as possible.

Moreover, in FIG. 17, since the pixel electrode was made cathode, and the EL layer and the anode were laminated, the direction of the light emission is a direction of the arrow indicted in FIG. 17.

Moreover, here not shown in Figs., in order to prevent the background from being reflected due to the reflection of the applied metal layer (here, cathode or the like), a circular polarizing means referred to as a circular polarizing plate consisted of a phase difference plate (λ/4 plate) and polarizing plate may be provided on the covering member 1020.

Since in the present Example 1, a TFT having a highly qualified electric characteristics and a high reliability obtained in Example 1 is used, a light emitting element having a higher reliability comparing to those of the conventional elements can be formed. Moreover, an electric apparatus having a high performance can be obtained by utilizing a light emitting device having such light emitting elements as a display section.

It should be noted that the present Example could be freely combined with Example 1, Example 7, Example 8 or Example 9.

The present invention can enhance the reliability of an element without damaging the semiconductor layer since peeling off from the substrate by the physical means.

Moreover, the present invention is capable of peeling off not only a peeled off layer having a small area but also a peeled off layer having a large area over the entire surface at excellent yield ratio.

In addition, since the present invention is capable of easily peeling off by the physical means, for example, is capable of pulling away by human's hands, it can be said that the process is suitable for mass production. Moreover, in the case where a manufacturing equipment is prepared in order to pull away the peeled off layer when performing the mass production, a large size fabrication equipment can also be prepared at low cost.

Example 10

Various modules (active matrix liquid crystal module, active matrix EL module and active matrix EC module) can be completed by the present invention. Namely, all of the electronic apparatuses are completed by implementing the present invention.

Following can be given as such electronic apparatuses: video cameras; digital cameras; head mounted displays (goggle type displays); car navigation systems; projectors; car stereo; personal computers; portable information terminals (mobile computers, mobile phones or electronic books etc.) etc. Examples of these are shown in FIGS. 18 and 19.

Figure 18A:
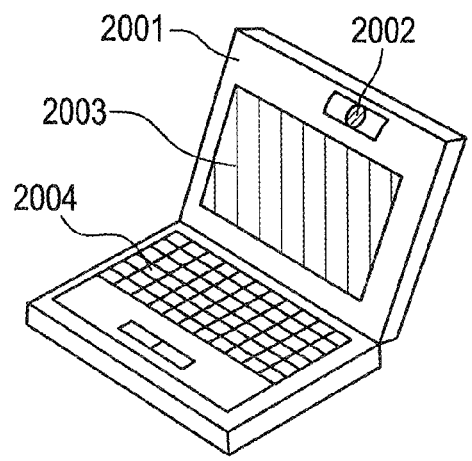
FIGS. 18A to 18F are diagrams showing one example of an electronic equipment.

FIG. 18A is a personal computer which comprises: a main body 2001; an image input section 2002; a display section 2003; and a keyboard 2004.

Figure 18B:
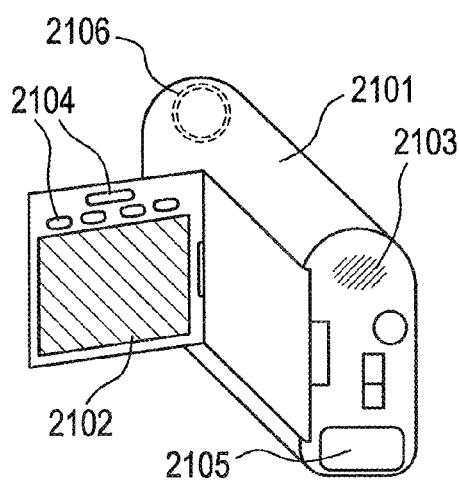

FIG. 18B is a video camera which comprises: a main body 2101; a display section 2102; a voice input section 2103; operation switches 2104; a battery 2105 and an image receiving section 2106.

Figure 18C:
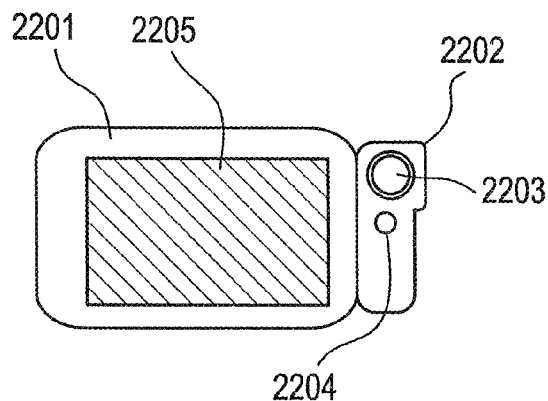

FIG. 18C is a mobile computer which comprises: a main body 2201; a camera section 2202; an image receiving section 2203; operation switches 2204 and a display section 2205.

Figure 18D:
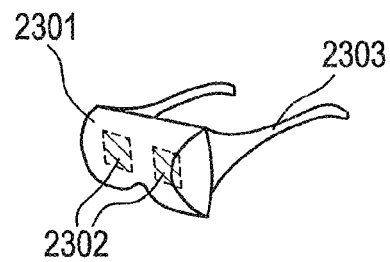

FIG. 18D is a goggle type display which comprises: a main body 2301; a display section 2302; and an arm section 2303.

Figure 18E:
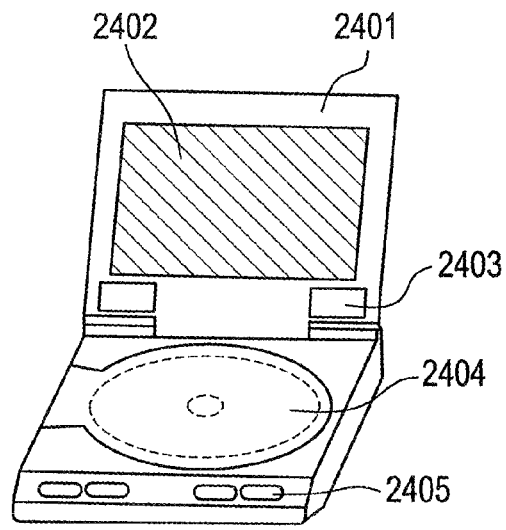

FIG. 18E is a player using a recording medium which records a program (hereinafter referred to as a recording medium) which comprises: a main body 2401; a display section 2402; a speaker section 2403; a recording medium 2404; and operation switches 2405. This apparatus uses DVD (digital versatile disc), CD, etc. for the recording medium, and can perform music appreciation, film appreciation, games and use for Internet.

Figure 18F:
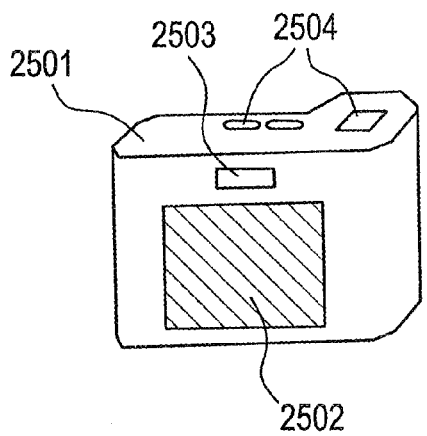

FIG. 18F is a digital camera which comprises: a main body 2501; a display section 2502; a view finder 2503; operation switches 2504; and an image receiving section (not shown in the figure).

Figure 19A:
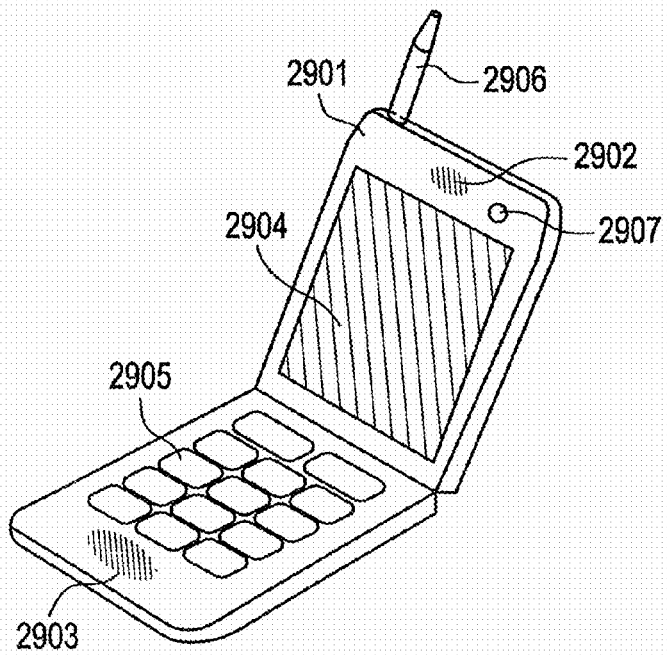
FIGS. 19A to 19C are diagrams showing one example of an electronic equipment.

FIG. 19A is a portable telephone which comprises: a main body 2901; a voice output section 2902; a voice input section 2903; a display section 2904; operation switches 2905; an antenna 2906; and an image input section (CCD, image sensor, etc.) 2907 etc.

Figure 19B:
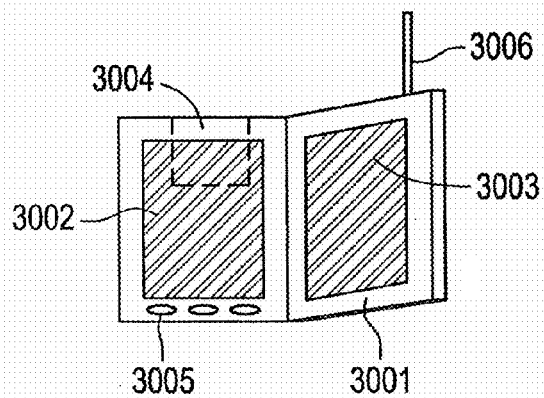

FIG. 19B is a portable book (electronic book) which comprises: a main body 3001; display sections 3002 and 3003; a recording medium 3004; operation switches 3005 and an antenna 3006 etc.

Figure 19C:
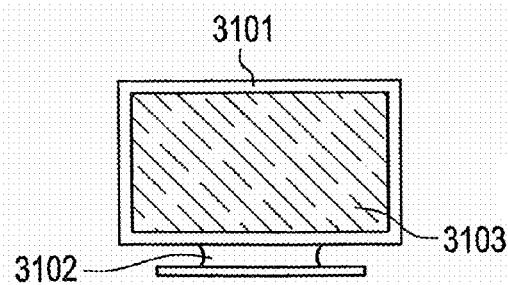
Figure 20A:
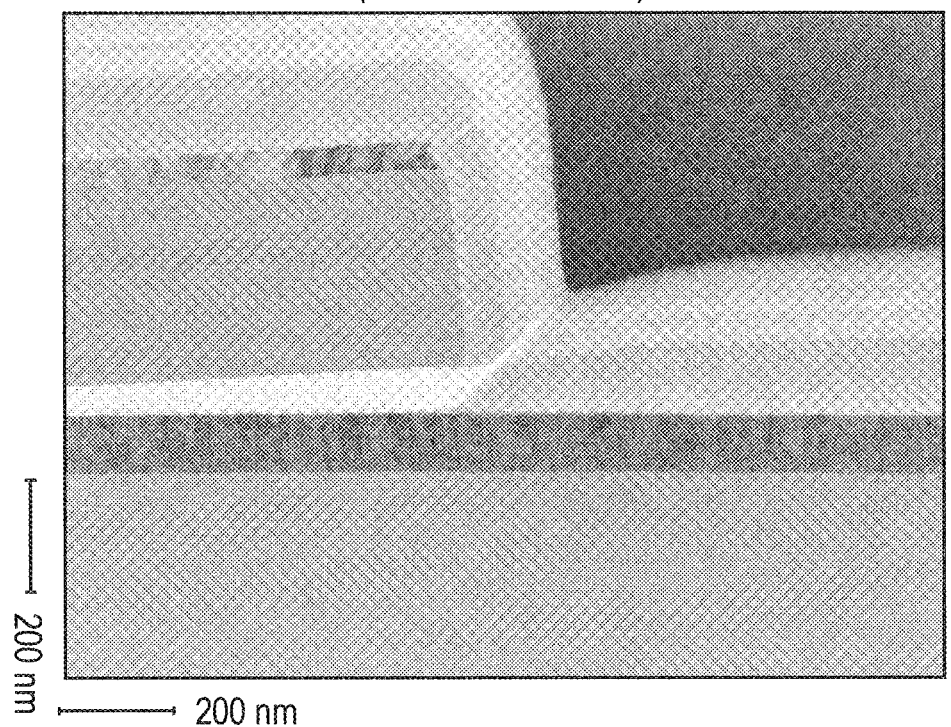
FIGS. 20A and 20B are cross sectional TEM photograph and a schematic diagram of the boundary location partially peeled off.
Figure 20B:
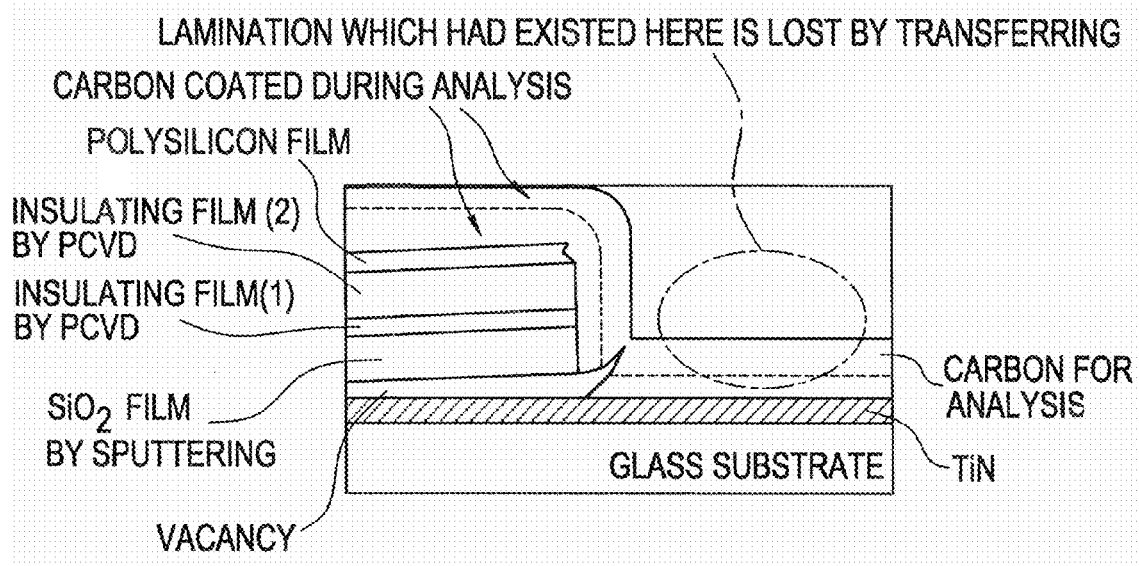
Figure 21:
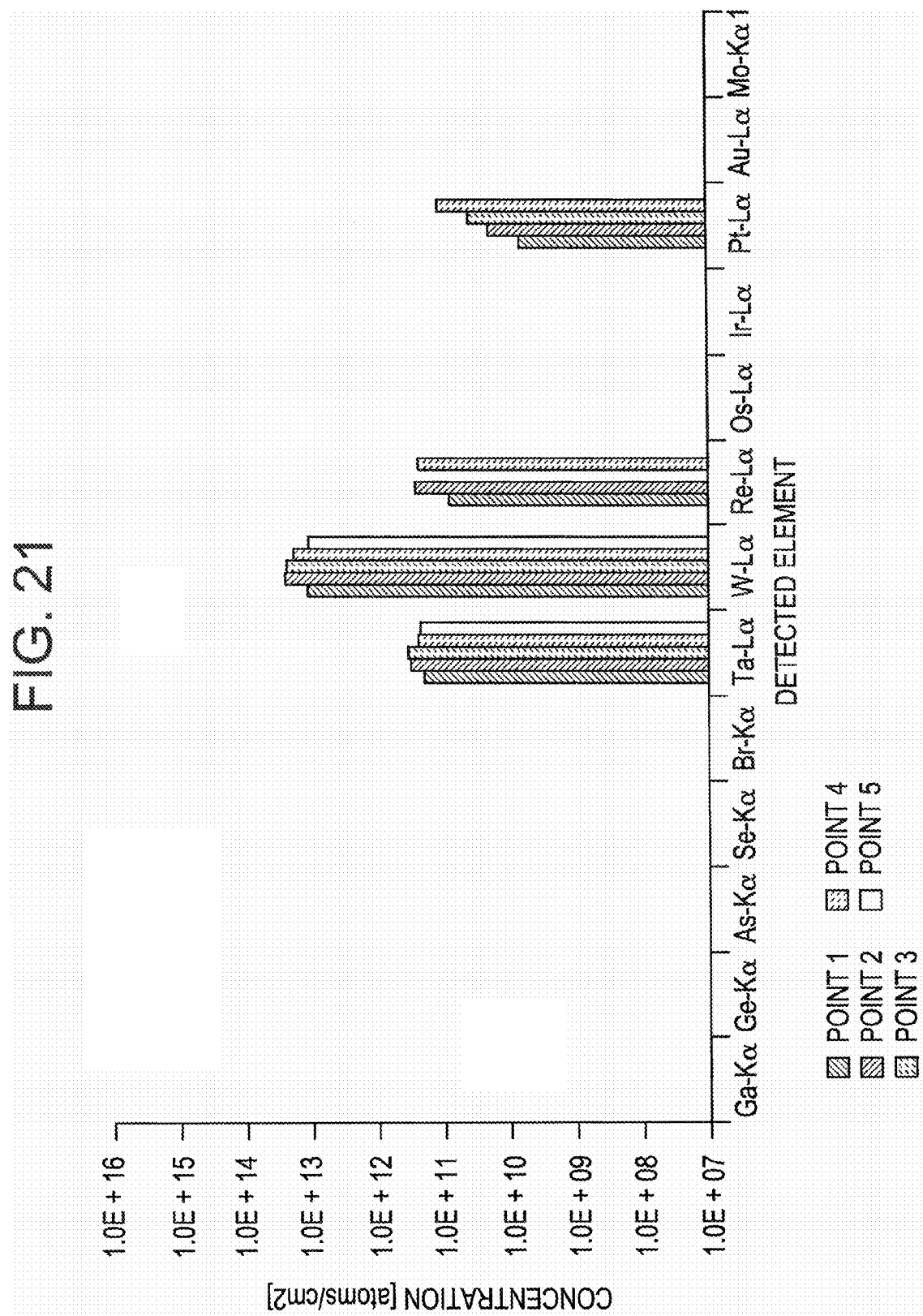
FIG. 21 is a graph showing results for measuring a surface of the peeled off silicon oxide film by TXRF.
Figure 22:
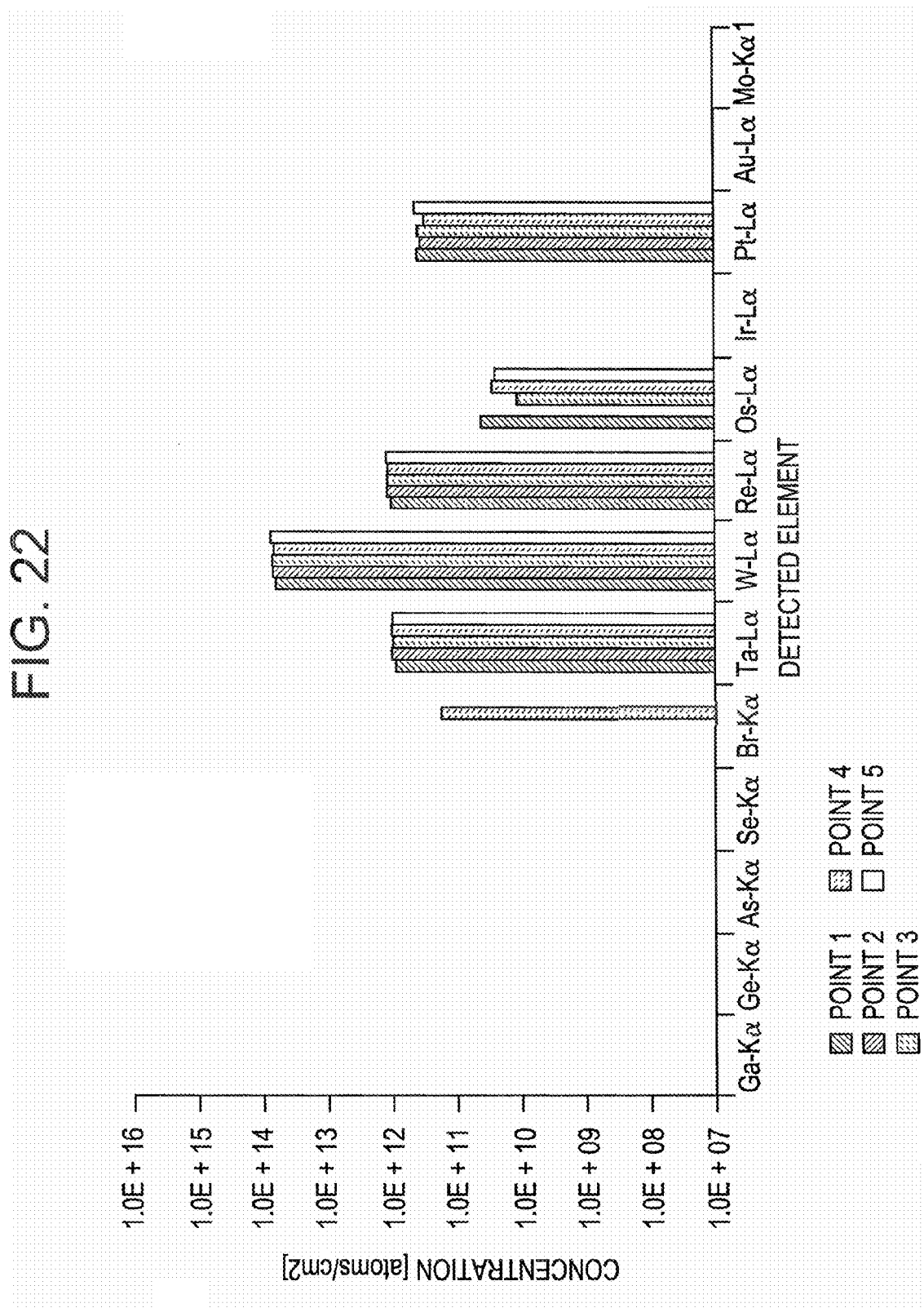
FIG. 22 is a graph showing results for measuring a surface of W film formed on a quartz substrate by TXRF. (Reference)

FIG. 19C is a display which comprises: a main body 3101; a supporting section 3102; and a display section 3103 etc.

In addition, the display shown in FIG. 19C has small and medium-sized or large-sized screen, for example a size of 5 to 20 inches. Further, to manufacture the display part with such sizes, it is preferable to mass-produce by gang printing by using a substrate with one meter on a side.

As described above, the applicable range of the present invention is very large, and the invention can be applied to electronic apparatuses of various areas. Note that the electronic devices of this Example can be achieved by utilizing any combination of constitutions in Examples 1 to 9.

What is claimed is:

1. A semiconductor device comprising:
   a first substrate having flexibility;
   an adhesive layer comprising resin over the first substrate;
   an oxide layer over and in direct contact with the adhesive layer;
   an insulating layer over the oxide layer;
   a layer containing a transistor over the insulating layer; and
   an inorganic film over the layer containing the transistor.
2. The semiconductor device according to claim 1, further comprising a second substrate having flexibility over the inorganic film.
3. The semiconductor device according to claim 2,
   wherein the first substrate is a plastic substrate, and
   wherein the second substrate is a plastic substrate.
4. The semiconductor device according to claim 1, wherein the layer further contains a light emitting element electrically connected to the transistor.
5. The semiconductor device according to claim 1,
   wherein the insulating layer comprises a first insulating layer and a second insulating layer.
6. The semiconductor device according to claim 5,
   wherein the first insulating layer comprises silicon oxynitride, and
   wherein the second insulating layer comprises silicon oxynitride.
7. A semiconductor device comprising:
   a first substrate having flexibility;
   an inorganic film over the first substrate;
   an adhesive layer comprising resin over the inorganic film;
   an oxide layer over and in direct contact with the adhesive layer;
   an insulating layer over the oxide layer; and
   a layer containing a transistor and a light emitting element electrically connected to the transistor over the insulating layer.
8. The semiconductor device according to claim 7, further comprising a second substrate having flexibility over the layer containing the transistor and the light emitting element.
9. The semiconductor device according to claim 8,
   wherein the first substrate is a plastic substrate, and
   wherein the second substrate is a plastic substrate.
10. The semiconductor device according to claim 7,
    wherein the insulating layer comprises a first insulating layer and a second insulating layer.
11. The semiconductor device according to claim 10,
    wherein the first insulating layer comprises silicon oxynitride, and
    wherein the second insulating layer comprises silicon oxynitride.
12. The semiconductor device according to claim 1, wherein the inorganic film consists of inorganic matter.
13. The semiconductor device according to claim 7, wherein the inorganic film consists of inorganic matter.
14. The semiconductor device according to claim 2, wherein a material of the second substrate having flexibility is the same as a material of the first substrate having flexibility.
15. The semiconductor device according to claim 1, wherein the adhesive layer is configured to not be removed.
16. The semiconductor device according to claim 1, wherein the oxide layer is configured to not be removed.
17. The semiconductor device according to claim 1, wherein the semiconductor device is a semiconductor device after peeling off the layer containing the transistor, the insulating layer, and the oxide layer from a glass substrate.
18. The semiconductor device according to claim 8, wherein a material of the second substrate having flexibility is the same as a material of the first substrate having flexibility.
19. The semiconductor device according to claim 7, wherein the adhesive layer is configured to not be removed.
20. The semiconductor device according to claim 7, wherein the oxide layer is configured to not be removed.
21. The semiconductor device according to claim 7, wherein the semiconductor device is a semiconductor device after peeling off the layer containing the transistor, the insulating layer, and the oxide layer from a glass substrate.

* * * * *